US011676845B2

(12) United States Patent
Graciano et al.

(10) Patent No.: US 11,676,845 B2
(45) Date of Patent: Jun. 13, 2023

(54) AUTOMATED TEACH APPARATUS FOR ROBOTIC SYSTEMS AND METHOD THEREFOR

(71) Applicant: Brooks Automation, Inc., Chelmsford, MA (US)

(72) Inventors: Justo Graciano, Hayward, CA (US); Helen Hwang, Fremont, CA (US); Erick Pastor, San Jose, CA (US)

(73) Assignee: Brooks Automation US, LLC, Chelmsford, MA (US)

( * ) Notice: Subject to any disclaimer, the term of this patent is extended or adjusted under 35 U.S.C. 154(b) by 121 days.

(21) Appl. No.: 17/362,565

(22) Filed: Jun. 29, 2021

(65) Prior Publication Data

US 2022/0059383 A1      Feb. 24, 2022

Related U.S. Application Data

(60) Provisional application No. 63/046,289, filed on Jun. 30, 2020.

(51) Int. Cl.
  *B25J 9/16*      (2006.01)
  *H01L 21/68*    (2006.01)
  *H01L 21/67*    (2006.01)

(52) U.S. Cl.
  CPC .......... *H01L 21/681* (2013.01); *B25J 9/1697* (2013.01); *H01L 21/67161* (2013.01)

(58) Field of Classification Search
  CPC ............ H01L 21/681; H01L 21/67161; H01L 21/67184; H01L 21/67742;
  (Continued)

(56) References Cited

U.S. PATENT DOCUMENTS 4,054,383 A    10/1977  Lin et al.
6,323,616 B1   11/2001  Sagues et al.
(Continued)

FOREIGN PATENT DOCUMENTS

EP       1215017        6/2001
JP       2006287181    10/2006
KR    1020090064650    6/2009

OTHER PUBLICATIONS

Osborne, Mark. "New Product: Automated mechanical monitoring system from InnerSense prevents wafer handling issues" Fabtech. Oct. 22, 2009.
(Continued)

*Primary Examiner* — Abby Y Lin
*Assistant Examiner* — Dylan M Katz
(74) *Attorney, Agent, or Firm* — Perman & Green, LLP

(57) ABSTRACT

An automatic teaching system for a substrate processing apparatus, the automatic teaching system comprising a frame having a workpiece load station with a predetermined load station reference location, a robot transport mounted to the frame and having a movable transport arm with an end effector having a predetermined end effector reference location, and a drive section driving the movable transport arm in at least one degree of freedom motion relative to the frame, a machine vision system including both at least one fixed imaging sensor and at least one movable imaging sensor removably connected to the frame and configured to image at least one target of the machine vision system, a load jig disposed for removable engagement with the workpiece load station, with both the at least one fixed imaging sensor and the at least one movable imaging sensor mounted to the load jig, the fixed imaging sensor.

46 Claims, 36 Drawing Sheets

(58) Field of Classification Search
CPC .......... H01L 21/68707; H01L 21/67173; B25J 9/1697; B25J 9/1664; G05B 2219/36401; G05B 2219/45031; G05B 19/42

See application file for complete search history.

(56) References Cited

U.S. PATENT DOCUMENTS

| | | |
|---|---|---|
| 6,452,503 B1 | 9/2002 | Weiss |
| 6,591,160 B2 | 7/2003 | Hine et al. |
| 6,763,284 B2 | 7/2004 | Watanabe et al. |
| 6,816,755 B2 | 11/2004 | Habibi et al. |
| 6,919,913 B1 | 7/2005 | Inada et al. |
| 7,029,930 B2 | 4/2006 | Tomer et al. |
| 7,085,622 B2 | 8/2006 | Sadighi et al. |
| 7,135,852 B2 | 11/2006 | Renken et al. |
| 7,149,643 B2 | 12/2006 | Renken et al. |
| 7,151,366 B2 | 12/2006 | Renken et al. |
| 7,233,841 B2 | 6/2007 | Sadighi et al. |
| 7,283,255 B2 | 10/2007 | Ramsey et al. |
| 7,289,230 B2 | 10/2007 | Ramsey et al. |
| 7,456,977 B2 | 11/2008 | Ramsey et al. |
| 7,855,549 B2 | 12/2010 | Renken et al. |
| 8,255,082 B2 | 8/2012 | Asakawa et al. |
| 8,855,812 B2 | 10/2014 | Kapoor |
| 9,207,668 B2 | 12/2015 | Zhang et al. |
| 9,352,466 B2 * | 5/2016 | Liao ...................... H01L 21/681 |
| 9,713,869 B2 | 7/2017 | Trompeter |
| 2004/0202362 A1 | 10/2004 | Ishikawa et al. |
| 2007/0117228 A1 | 5/2007 | Tooyama et al. |
| 2017/0057095 A1 | 3/2017 | Oestergaard et al. |
| 2018/0033666 A1 | 2/2018 | Watanabe et al. |
| 2019/0378740 A1 | 12/2019 | Isokawa et al. |

OTHER PUBLICATIONS

InnerSense. "Wafer Handling Monitor" https://www.innersense-semi.com/wafer-handling-monitor. Retrieved Jun. 8, 2020.

* cited by examiner

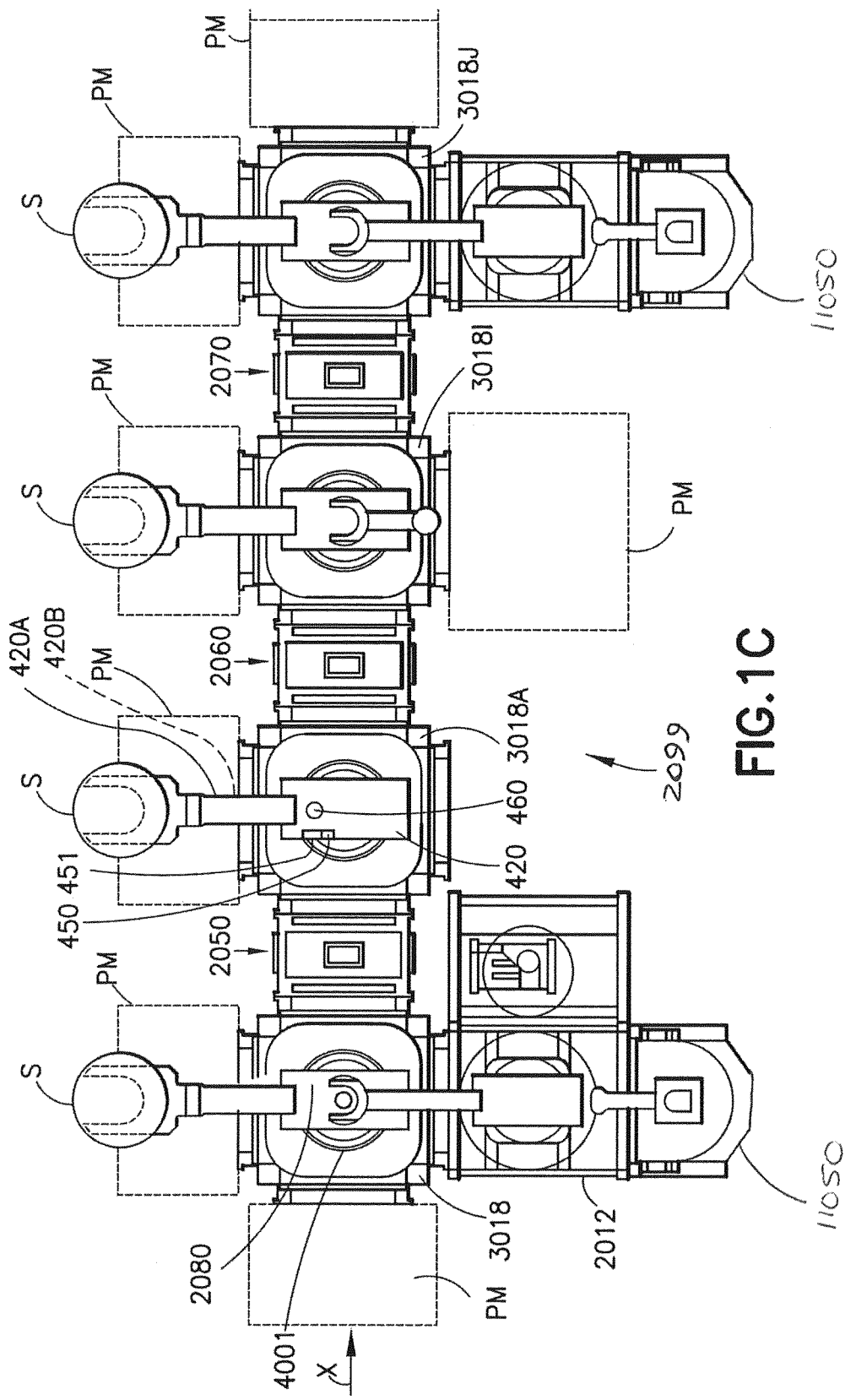

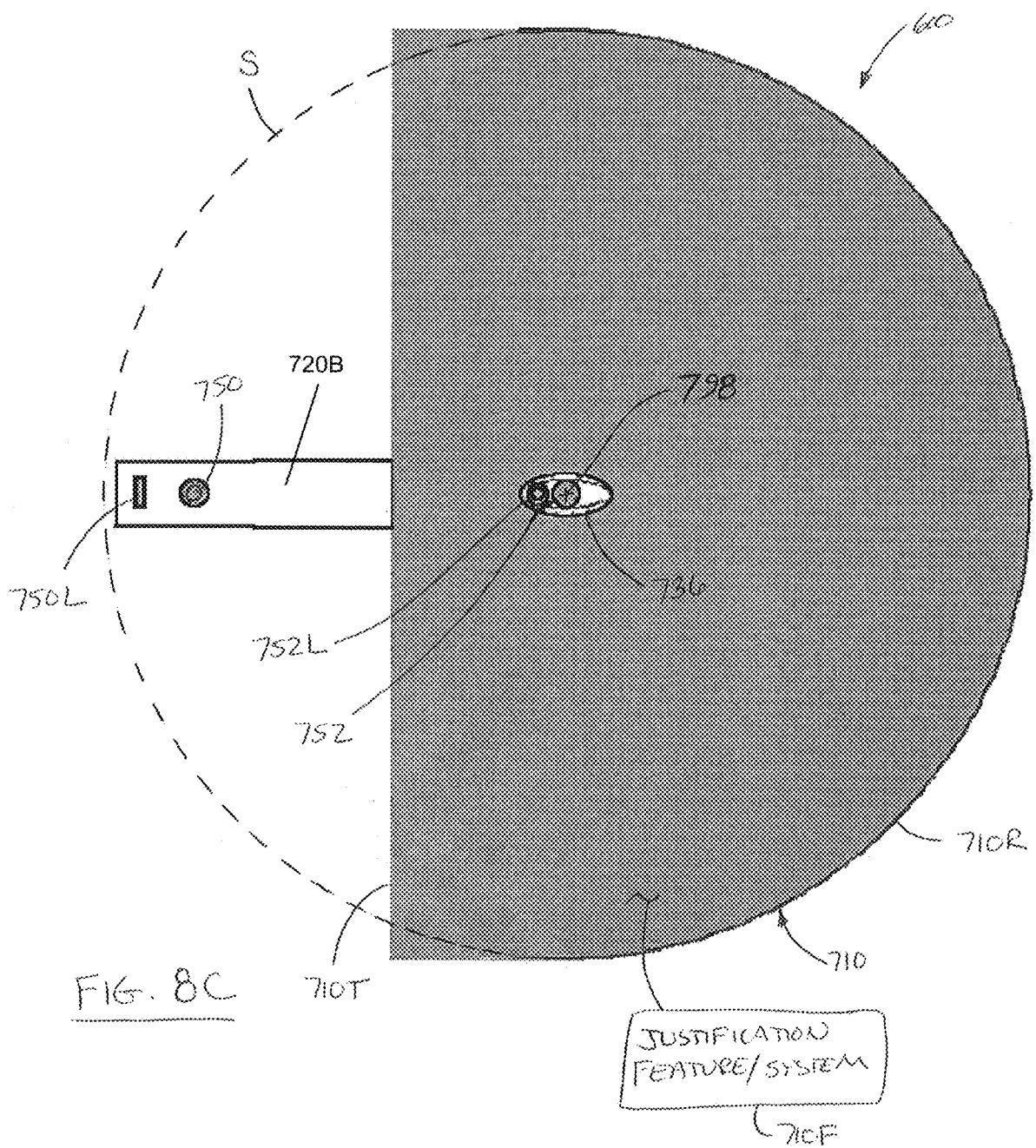

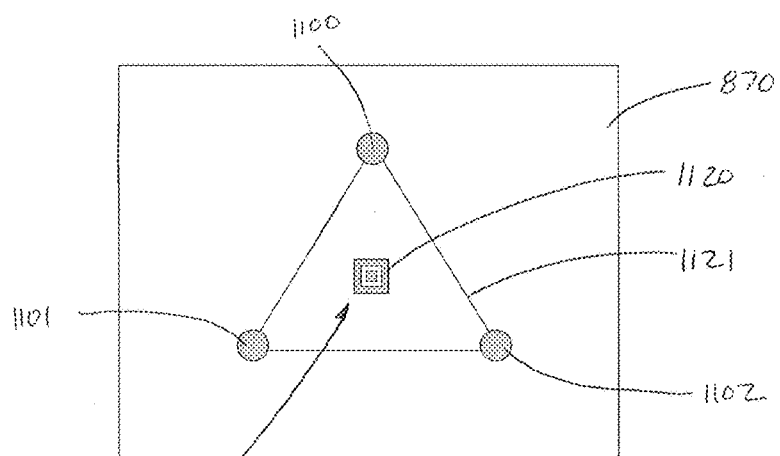
FIG. 11
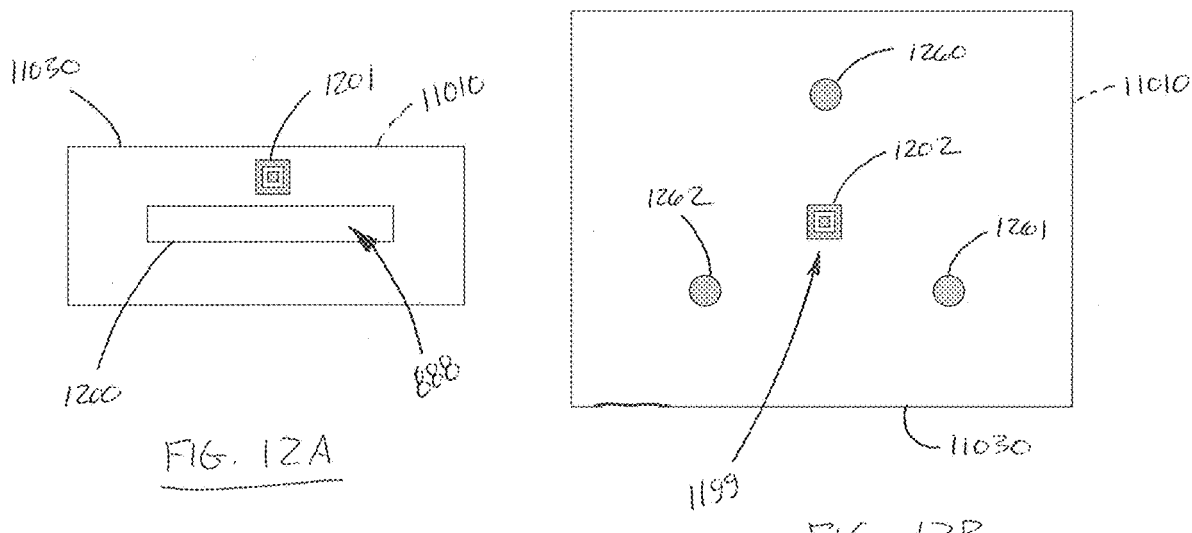
FIG. 12A
FIG. 12B

AUTOMATED TEACH APPARATUS FOR ROBOTIC SYSTEMS AND METHOD THEREFOR

CROSS-REFERENCE TO RELATED APPLICATIONS

This application is a non-provisional of and claims the benefit of U.S. provisional patent application No. 63/046,289, filed Jun. 30, 2020, the disclosure of which is incorporated herein by reference it its entirety.

BACKGROUND

1. Field

The exemplary embodiments generally relate to semiconductor processing apparatus, and more particularly, to automatic teaching of the semiconductor processing apparatus.

2. Brief Description of Related Developments

Substrate processing equipment is typically capable of performing multiple operations on a substrate. The substrate processing equipment generally includes a transfer chamber and one or more process modules coupled to the transfer chamber. A substrate transport robot within the transfer chamber moves substrates among the process modules where different operations, such as sputtering, etching, coating, soaking, etc. are performed. Production processes used by, for example, semiconductor device manufacturers and materials producers often require precise positioning of substrates in the substrate processing equipment.

The precise position of the substrates is generally provided through teaching locations of the substrate holding locations to the substrate transport robot. Generally the teaching of substrate holding locations in a transport robot coordinate system within a substrate processing apparatus is performed manually or with automation. Conventionally, in some aspects, teaching of substrate holding locations is performed through manual control of the robotic end effector while observing the end effector positon relative to the substrate holding station directly or remotely (such as through a live camera feed. In other aspects, the movement of the end effector may be automated. Conventional method for teaching substrate holding locations include physically contacting the end effector with substrate holding station features and measuring torque of the transport robot motors to detect the contact and by detecting the substrate holding station features with through-beam sensors carried by the end effector.

Generally the teaching of the substrate transport robot includes detecting a position of the robot and/or substrate carried by the robot with dedicated teaching sensors added to the substrate processing equipment, utilizing instrumented substrates (e.g. including onboard, sensors or cameras) carried by the substrate transport robot, utilizing removable fixtures that are placed within the process modules or other substrate holding station of the substrate processing equipment, utilizing wafer centering sensors that are located within or externally accessible at the process modules, utilizing sensors (e.g. cameras) disposed external to the process modules, or by contacting a target within the process module with the substrate transport robot or an object carried by the substrate transport robot. These approaches to teaching locations within substrate processing equipment may require sensors being placed in a vacuum, may require changes to customer processing equipment and/or tooling, may not be suitable for use in vacuum environments or at high temperatures, may require mirrors or fixtures being placed within the processing equipment, and/or may disrupt a vacuum environment of the substrate processing equipment.

BRIEF DESCRIPTION OF THE DRAWINGS

The foregoing aspects and other features of the present disclosure are explained in the following description, taken in connection with the accompanying drawings, wherein:

FIGS. 1A, 1B, 1C, and 1D are schematic illustrations of a substrate processing apparatus incorporating aspects of the present disclosure;

FIGS. 8A, 8B, 8C, 8D, 8E, and 8F are schematic illustrations of a portion of the automatic teach apparatus of FIGS. 5A and 5B in accordance with the aspects of the present disclosure;

FIG. 11 is a schematic illustration of a portion of a station fixture, of the substrate processing apparatus described herein, incorporating aspects of the present disclosure;

FIGS. 12A and 12B are schematic illustrations of portions of a station fixture, of the substrate processing apparatus described herein, incorporating aspects of the present disclosure;

DETAILED DESCRIPTION

Figure 1A:
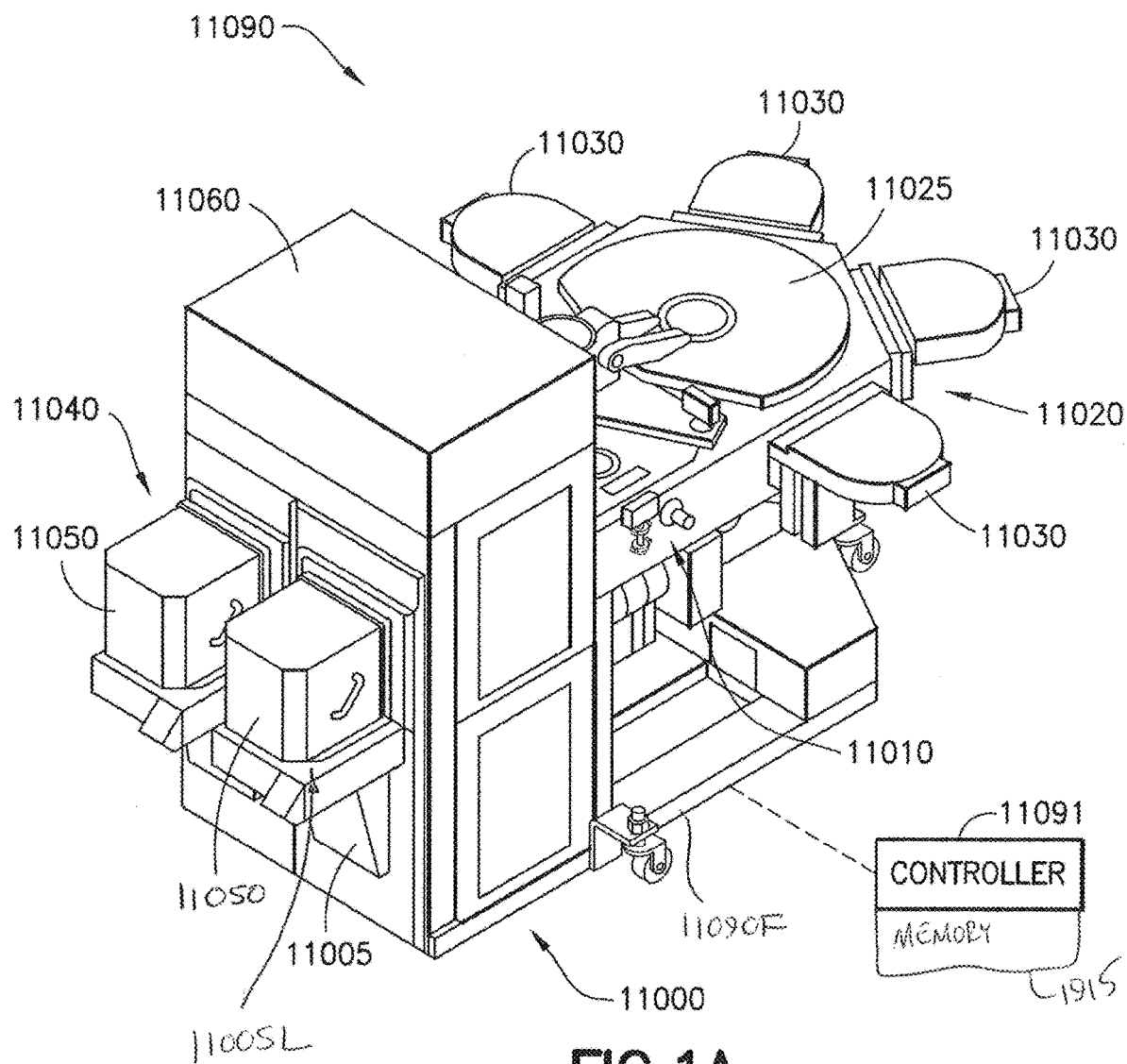

FIGS. 1A-2D illustrate an exemplary substrate processing apparatus in accordance with aspects of the present disclosure. Although the aspects of the present disclosure will be described with reference to the drawings, it should be understood that the aspects of the present disclosure can be embodied in many forms. In addition, any suitable size, shape or type of elements or materials could be used.

The aspects of the present disclosure provide for an automatic teach apparatus 500 (see FIGS. 5A and 5B) employed with the substrate processing apparatus. The aspects of the present disclosure automate a robotic teaching on the substrate processing apparatus using software and hardware. The aspects of the present disclosure decrease setup time/down time of the substrate processing apparatus while minimizing human/operator error and variability due to manual teaching. As will be described herein the aspects of the present disclosure employ software with vision system feedback and teach fixtures/jigs to automate the teaching process and to verify the results of the teaching process. The aspects of the present disclosure are also employed to set up and verify robotic end effector leveling relative to substrate holding stations (also referred to herein as station fixtures). While the aspects of the present disclosure are described herein with respect to semiconductor substrate process apparatus the aspects of the present disclosure may be employed in any suitable robotic system.

The substrate processing apparatus include robotic handling equipment for transporting substrates to and from different substrate holding stations (e.g., substrate cassettes, aligners, processing modules, etc.). The automatic teach apparatus 500 of the present disclosure is employed is a combined teach system configured to automatically teach the robotic handling equipment the position of one or more of a load port module (also referred to herein as a workpiece load station) location and substrate holding station (located separate and apart from the load port module). As will be described in greater detail herein, with brief reference to FIGS. 5A, 5B and 6A, the automatic teaching apparatus 500 includes with a mock (e.g., imitation) carrier jig 510A, 510B (also referred to herein as a load jig) and a removable module jig 600 each having a respective sensors that form a machine vision system 530A, 530B. The machine vision systems 530A, 530B include any suitable sensors (as described herein) where each sensor is paired with a respective target. The targets are sensed by the respective machine vision system 530A, 530B so that a controller coupled to the machine vision teaching system heuristically/progressively (e.g., self-teaching) learns (as described herein) the location (e.g., teach location/position) of the substrate holding station or load port module in, for example, six degrees of freedom. Here subsequent teach location determinations are informed by information obtained through determination of previously taught teach locations.

In one aspect, the mock carrier jig 510A transports or otherwise carries (e.g., ports) location features (or targets) 520-523 that are detected by a portion of a vision system 530A located on a substrate transport apparatus 501 (which for exemplary purposes is substantially similar to transport robot 11013 or any of the other substrate transport apparatus described herein), where each of the targets 520-523 has a predetermined position with respect to a load station reference location 11005L (such as of a load port module 11005) and is positioned so as to be in view of movable imaging sensor(s) 581-583 (mounted to the substrate transport apparatus 501) of the vision system 530A with a removable module jig 600 engaged with the mock carrier jig 510A. The location features or targets 520-523 are positioned relative to each other within the mock carrier jig 510A so as to identify (through the vision system 530A) the location of a substrate holding end effector 502 of the substrate transport apparatus 501 in six degrees of freedom (X, Y, Z, $\theta_X$, $\theta_Y$, $\theta_Z$). In another aspect, the mock carrier jig 510B transports or otherwise carries (e.g., ports) a portion of the vision system 530B that detects location features or targets 540-542 (also referred to herein as arm targets) located on the substrate transport apparatus 501, where each of the targets 540-542 has a predetermined position with respect to the end effector reference location 479 and is positioned so as to be in view of fixed imaging sensor(s) 581-583 with the removable module jig 600 engaged with the mock carrier jig 510B. The location features or targets 540-542 are positioned relative to each other on the substrate transport apparatus 501 so as to identify (through the vision system 530B) the location of a substrate holding end effector 502 of the substrate transport apparatus 501 relative to the load port module 11005 in six degrees of freedom (X, Y, Z, $\theta_X$, $\theta_Y$, $\theta_Z$). Here, the automatic teach apparatus 500 is configured to teach a location of a cassette holding location (such as at a load port module or other suitable location of the substrate processing apparatus).

Referring also to FIGS. 6A and 8A-8C, in accordance with aspects of the present disclosure the removable module jig 600 is transported (e.g., ported) by and with the mock carrier jig 510A, 510B. The removable module jig 600 includes imaging sensor(s) 750-752 that form part of a respective machine vision system 530A, 530B. The sensors 750-752, as described herein, are carried by and move with the removable module jig 600 as a single unit. The removable module jig 600 is carried by the end effector 502 of the substrate transport apparatus 501 to a desired one or more substrate holding stations for automatically teaching the substrate station location to the substrate transport apparatus 501 in six degrees of freedom (X, Y, Z, $\theta_X$, $\theta_Y$, $\theta_Z$ in a coordinate system of the substrate transport apparatus. Here the substrate holding stations include locations features (similar to those noted above) that are positioned relative to each other on the substrate holding station so as to identify (through the sensors 750-752 of the machine vision system 530A, 530B) the location of a substrate holding station in the six degrees of freedom.

As will be described herein, the vision system(s) 530A, 530B include any suitable optical sensors, including but not limited to cameras, through-beam sensors or a combination thereof, that face in at least each of the X, Y, and Z directions (in a Cartesian coordinate system or in a Polar coordinate system R, θ, Z directions). As will be described in greater detail herein, each of the vision systems 530A, 530B include Y or R axis sensors, Z axis sensors, and laterally X or θ axis sensors that effect the heuristic learning of the load port module (e.g., through aggregation and verification of sensor data from one axis to another) and substrate holding station locations where sensor data from one sensing operation informs positioning of subsequent sensing operations in the automatic teach procedure. For example, the forward facing sensors are paired with respective targets and are configured to provide an initial alignment of the end effector along the X (or θ) and Z axes relative to the load port module (e.g., cassette holding location) or substrate holding station. The initial alignment along the X (or θ) and Z axes may increase the positional accuracy in subsequent sensing operations along the Y (or R) and Z axes. The vertically facing sensors are paired with respective targets and are configured to verify the initially taught X (or θ) axis position of the load port module and/or substrate holding location as well as provide an initial alignment of the end effector along the Y (or R) axis relative to the load port module and/or substrate holding location. The initial alignment along the Y (or R) axis may further increase the positional accuracy in subsequent sensing operations along the Z axis. The laterally facing sensors are paired with respective targets and are configured to verify the initially taught Y (or R) axis position of the load port module and/or substrate holding location as well as provide alignment of and verify the initially taught position of the end effector along the Z axis.

Referring again to FIGS. 1A-2D, it is noted that while the aspects of the present disclosure are described herein with respect to semiconductor substrate processing apparatus, the automatic teach apparatus of the present disclosure may be applied in any suitable environment where robotic manipulators are employed to pick and place objects from and to predetermined locations. As will be described herein, the automatic teach apparatus 500 (see FIGS. 5A and 5B) of the present disclosure is, in one aspect, employed within an atmospheric environment, such as in equipment front end modules (EFEMs) (e.g., an enclosure with at least one load port module as a base configuration) and wafer sorters, while in other aspects the automatic teach apparatus 500 is employed in a vacuum environment, such as in a transfer chamber of a cluster tool or a linear transfer chamber of a linear tool, or a combination thereof. In still other aspects, the automatic teach apparatus 500 is employed in any suitable substrate processing apparatus and is compatible with any suitable end effector (e.g., active edge grip, vacuum grip, passive/friction grip supports, etc.) of any suitable substrate transport (such as those described herein).

Figure 1B:
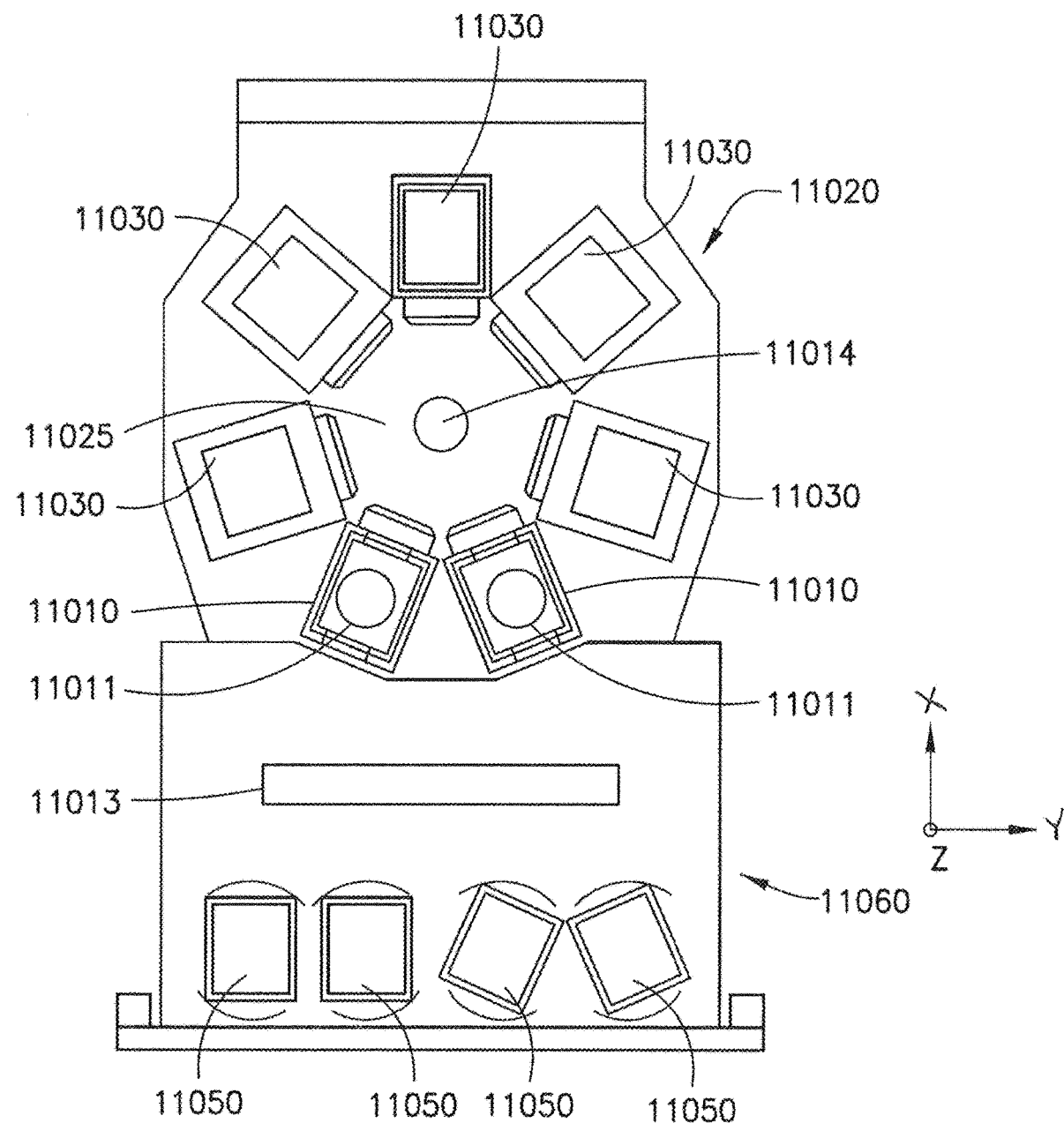

Referring to FIGS. 1A and 1B, a processing apparatus, such as for example a semiconductor tool station 11090 is shown in accordance with aspects of the present disclosure. Although a semiconductor tool station 11090 is shown in the drawings, the aspects of the present disclosure described herein can be applied to any tool station or application employing robotic manipulators. In this example the semiconductor tool station 11090 is shown as a cluster tool, however the aspects of the present disclosure may be applied to any suitable tool station such as, for example, a linear tool station such as that shown in FIGS. 1C and 1D and described in U.S. Pat. No. 8,398,355, entitled "Linearly Distributed Semiconductor Workpiece Processing Tool," issued Mar. 19, 2013, the disclosure of which is incorporated by reference herein in its entirety. The semiconductor tool station 11090 generally includes an atmospheric front end 11000, a vacuum load lock 11010 and a vacuum back end 11020. In other aspects, the tool station may have any suitable configuration. The components of each of the front end 11000, vacuum load lock 11010 and vacuum back end 11020 may be connected to a controller 11091 which may be part of any suitable control architecture such as, for example, a clustered architecture control.

The controller 11091 may be a closed loop controller having a master controller, cluster controllers and autonomous remote controllers such as those disclosed in U.S. Pat. No. 7,904,182 entitled "Scalable Motion Control System" issued on Mar. 8, 2011 the disclosure of which is incorporated herein by reference in its entirety. In other aspects, any suitable controller and/or control system may be utilized. As will be described herein, the controller 11091 is communicably connected to a drive section (e.g., such as drive section 389—see FIG. 3) of a transport robot (such as those described herein) to move the transport arm (such as transport arm 11013TA—see FIG. 3—or any of the other transport arms described herein). The controller 11091 is also communicably connected to the at least one fixed imaging sensor 581-583 (see FIG. 5B) or the movable imaging sensors 571-574 (see FIG. 5A) of the machine vision system 530A, 530B described herein. The controller 11091 is configured to move the transport arm 11013TA to a teach position relative to the mock carrier jig 510A, 510B and image, with the at least one fixed imaging sensor 581-583 (FIG. 5B) (or the at least one movable imaging sensor 571-574 (FIG. 5A)), at least one arm target 540-542 (FIG. 5B) as described herein (or at least one fixed target 520-523, as described herein with respect to FIG. 5A) with the transport arm 11013TA in a teach position (as described herein) so as to resolve, based on at least one image of the at least one arm target (or at least one image of the at least one fixed target 520-523), offset between an end effector reference location 479 and the load station reference location 11005L (as described herein) and between the end effector reference location 479 and a justification feature 710F (see FIGS. 8A and 8C) of a base or frame 710 of the at least one movable imaging sensor 750-752 that justifies the at least one movable imaging sensor 750-752 in a predetermined position relative to the end effector reference location 479 (as described herein).

In one aspect, the front end 11000 generally includes load port modules (also referred to herein as a workpiece load station) 11005 and a mini-environment 11060 such as for example an equipment front end module (EFEM) (which in some aspects includes a wafer sorting function). In other aspects the processing stations include wafer buffers, wafer inverters and wafer shuffle stations (which may be located in the vacuum back end 11020, in the front end 11000 and/or connecting the front end 11000 with vacuum the vacuum back end 11020 (e.g. such as in a load lock). The front end 11000 and vacuum back end 11020 each include a frame which when coupled to each other form a frame 11090F of the semiconductor tool station 11090. The load port modules 11005 may be box opener/loader to tool standard (BOLTS) interfaces that conform to SEMI standards E15.1, E47.1, E62, E19.5 or E1.9 for 300 mm load ports, front opening or bottom opening boxes/pods and cassettes. In other aspects, the load port modules may be configured as 200 mm wafer or 450 mm wafer interfaces or any other suitable wafer interfaces such as for example larger or smaller wafers or flat panels for flat panel displays. Although two load port modules 11005 are shown in FIG. 1A, in other aspects any suitable number of load port modules may be incorporated into the front end 11000. The load port modules 11005 may be configured to receive wafer/substrate carriers or cassettes 11050 from an overhead transport system, automatic guided vehicles, person guided vehicles, rail guided vehicles or from any other suitable transport method. The load port modules 11005 may interface with the mini-environment 11060 through load ports 11040. The substrate cassettes 11050 are received on a respective load port module 11005 at a predetermined load station reference location 11005L that kinematically locates the substrate cassettes 11050 on the load port module 11005. In one aspect the load ports 11040 allow the passage of wafers between the substrate cassettes 11050 and the mini-environment 11060.

In one aspect, the mini-environment 11060 generally includes any suitable transport robot 11013 that incorporates one or more aspects of the automatic teach apparatus 500 described herein. In one aspect the transport robot 11013 may be a track mounted robot such as that described in, for example, U.S. Pat. Nos. 6,002,840 and 7,066,707, the disclosures of which are incorporated by reference herein in their entireties or in other aspects, any other suitable transport robot having any suitable configuration. The mini-environment 11060 may provide a controlled, clean zone for wafer transfer between multiple load port modules.

The vacuum load lock 11010 may be located between and connected to the mini-environment 11060 and the vacuum back end 11020. It is noted that the term vacuum as used herein denotes a high vacuum such as $10^5$ Torr or below in which the wafers are processed. The vacuum load lock 11010 generally includes atmospheric and vacuum slot valves. The slot valves may provide the environmental isolation employed to evacuate the load lock after loading a wafer from the atmospheric front end and to maintain the vacuum in the transport chamber when venting the lock with an inert gas such as nitrogen. In one aspect, the vacuum load lock 11010 includes an aligner 11011 for aligning a fiducial of the wafer to a desired position for processing, while in other aspects alignment of the wafer is effected with the transport robot as described herein. In other aspects, the vacuum load lock may be located in any suitable location of the processing apparatus and have any suitable configuration and/or metrology equipment.

The vacuum back end 11020 generally includes a transport chamber 11025, one or more processing station(s) or module(s) 11030 and any suitable transport robot 11014. The transport robot 11014 will be described below and may be located within the transport chamber 11025 to transport wafers between the vacuum load lock 11010 and the various processing modules 11030. The processing modules 11030 may operate on the wafers through various deposition, etching, or other types of processes to form electrical circuitry or other desired structure on the wafers. Typical processes include but are not limited to thin film processes that use a vacuum such as plasma etch or other etching processes, chemical vapor deposition (CVD), plasma vapor deposition (PVD), implantation such as ion implantation, metrology, rapid thermal processing (RTP), dry strip atomic layer deposition (ALD), oxidation/diffusion, forming of nitrides, vacuum lithography, epitaxy (EPI), wire bonder and evaporation or other thin film processes that use vacuum pressures. The processing modules 11030 are connected to the transport chamber 11025 to allow wafers to be passed from the transport chamber 11025 to the processing modules 11030 and vice versa. In one aspect the load port modules 11005 and load ports 11040 are substantially directly coupled to the vacuum back end 11020 so that a substrate cassette 11050 mounted on the load port interfaces substantially directly (e.g. in one aspect at least the mini-environment 11060 is omitted while in other aspects the vacuum load lock 11010 is also omitted such that the substrate cassette 11050 is pumped down to vacuum in a manner similar to that of the vacuum load lock 11010) with a vacuum environment of the transport chamber 11025 and/or a processing vacuum of a process module 11030 (e.g. the processing vacuum and/or vacuum environment extends between and is common between the process module 11030 and the substrate cassette 11050).

Referring now to FIG. 1C, a schematic plan view of a linear processing system 2099 is shown where the tool interface section 2012 is mounted to a transfer chamber module 3018 so that the interface section 2012 is facing generally towards (e.g. inwards) but is offset from the longitudinal axis X of the transfer chamber module 3018. The transfer chamber module 3018 may be extended in any suitable direction by attaching other transport chamber modules 3018A, 3018I, 3018J to interfaces 2050, 2060, 2070 as described in U.S. Pat. No. 8,398,355, previously incorporated herein by reference. Each transfer chamber module 3018, 3018A, 3018I, 3018J includes any suitable substrate transport 2080, which may include one or more aspects of the present disclosure described herein, for transporting wafers throughout the linear processing system 2099 and into and out of, for example, processing modules PM. As may be realized, each chamber module may be capable of holding an isolated or controlled atmosphere (e.g. N2, clean air, vacuum).

Figure 1D:
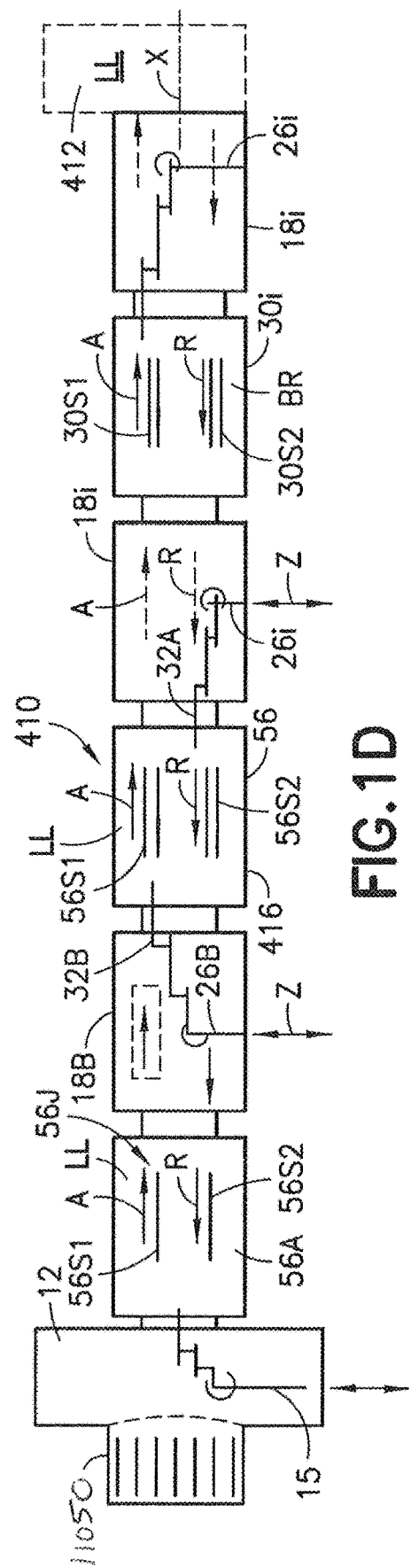

Referring to FIG. 1D, there is shown a schematic elevation view of an exemplary processing tool 410 such as may be taken along longitudinal axis X of the linear transport chamber 416. In the aspect of the present disclosure shown in FIG. 1D, tool interface section 12 may be representatively connected to the transport chamber 416. In this aspect, interface section 12 may define one end of the tool transport chamber 416. As seen in FIG. 1D, the transport chamber 416 may have another workpiece entry/exit station 412 for example at an opposite end from interface station 12. In other aspects, other entry/exit stations for inserting/removing workpieces from the transport chamber may be provided. In one aspect, interface section 12 and entry/exit station 412 may allow loading and unloading of workpieces from the tool. In other aspects, workpieces may be loaded into the tool from one end and removed from the other end. In one aspect, the transport chamber 416 may have one or more transfer chamber module(s) 18B, 18*i*. Each chamber module may be capable of holding an isolated or controlled atmosphere (e.g. N2, clean air, vacuum). As noted before, the configuration/arrangement of the transport chamber modules 18B, 18*i*, load lock modules 56A, 56 and workpiece stations forming the transport chamber 416 shown in FIG. 1D is merely exemplary, and in other aspects the transport chamber may have more or fewer modules disposed in any desired modular arrangement. In the aspect shown, station 412 may be a load lock. In other aspects, a load lock module may be located between the end entry/exit station (similar to station 412) or the adjoining transport chamber module (similar to module 18*i*) may be configured to operate as a load lock.

Figure 2A:
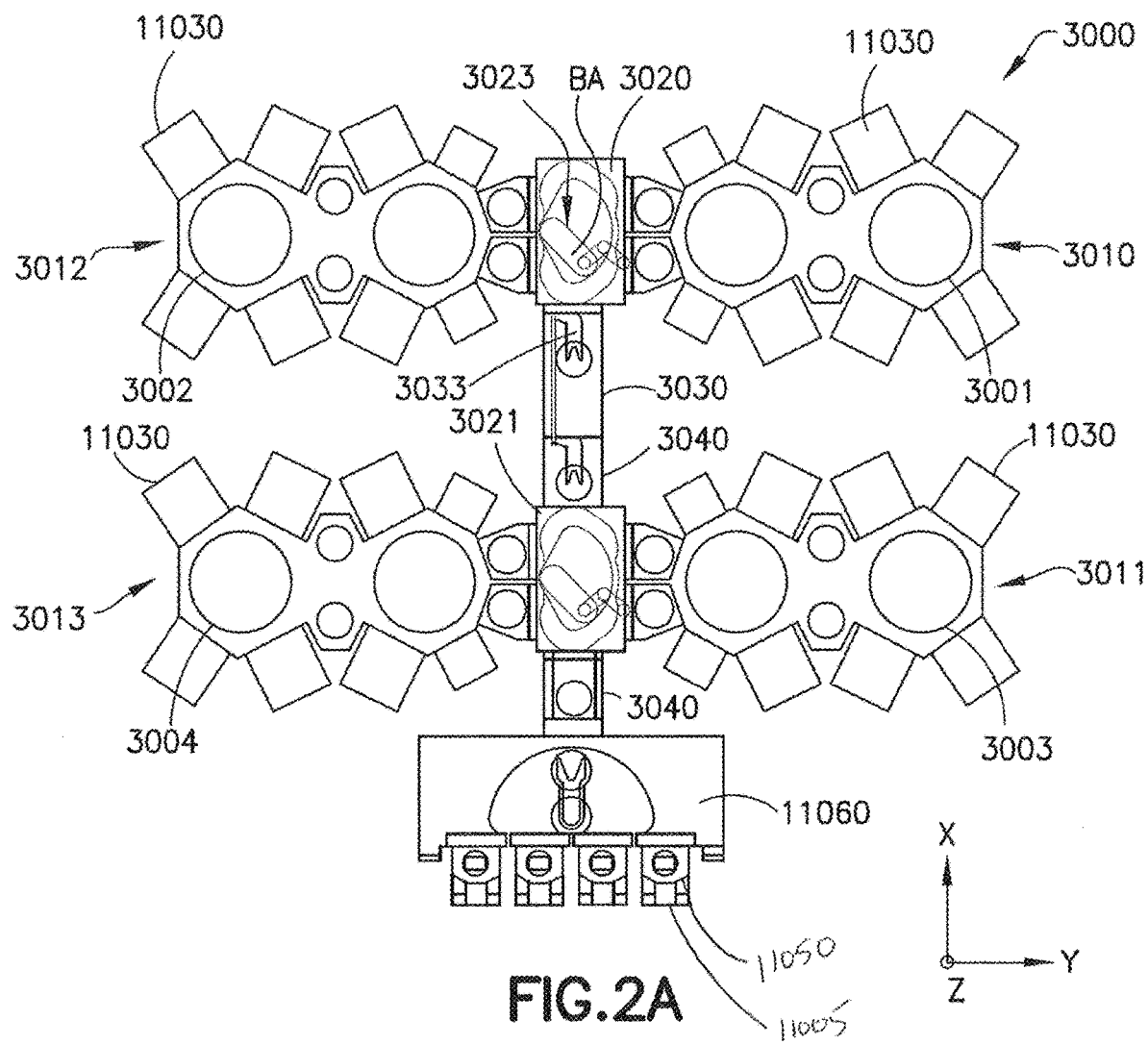
FIGS. 2A, 2B, 2C, and 2D are schematic illustration of a substrate processing apparatus incorporating aspects of the present disclosure.
Figure 2B:
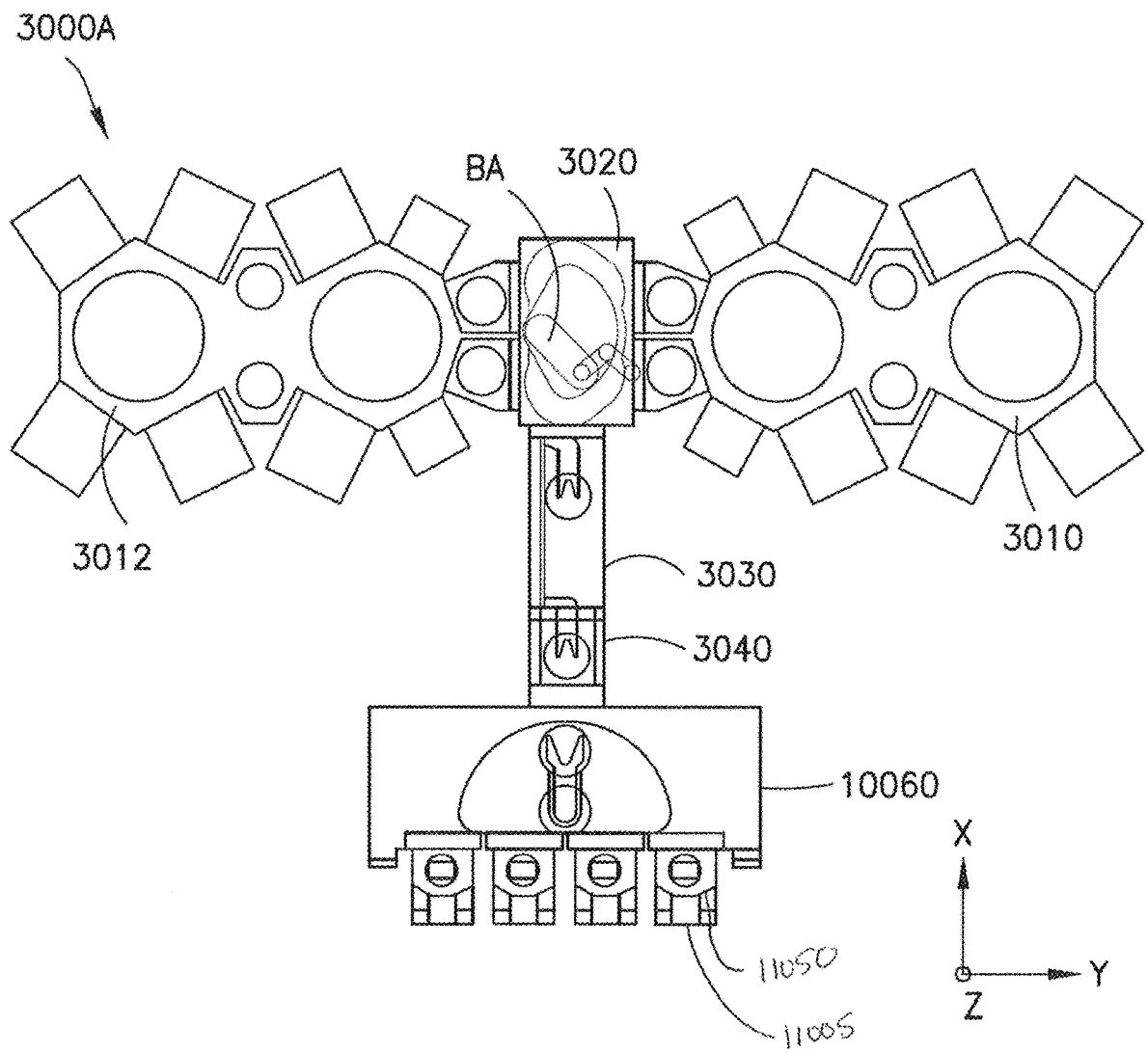
Figure 2C:
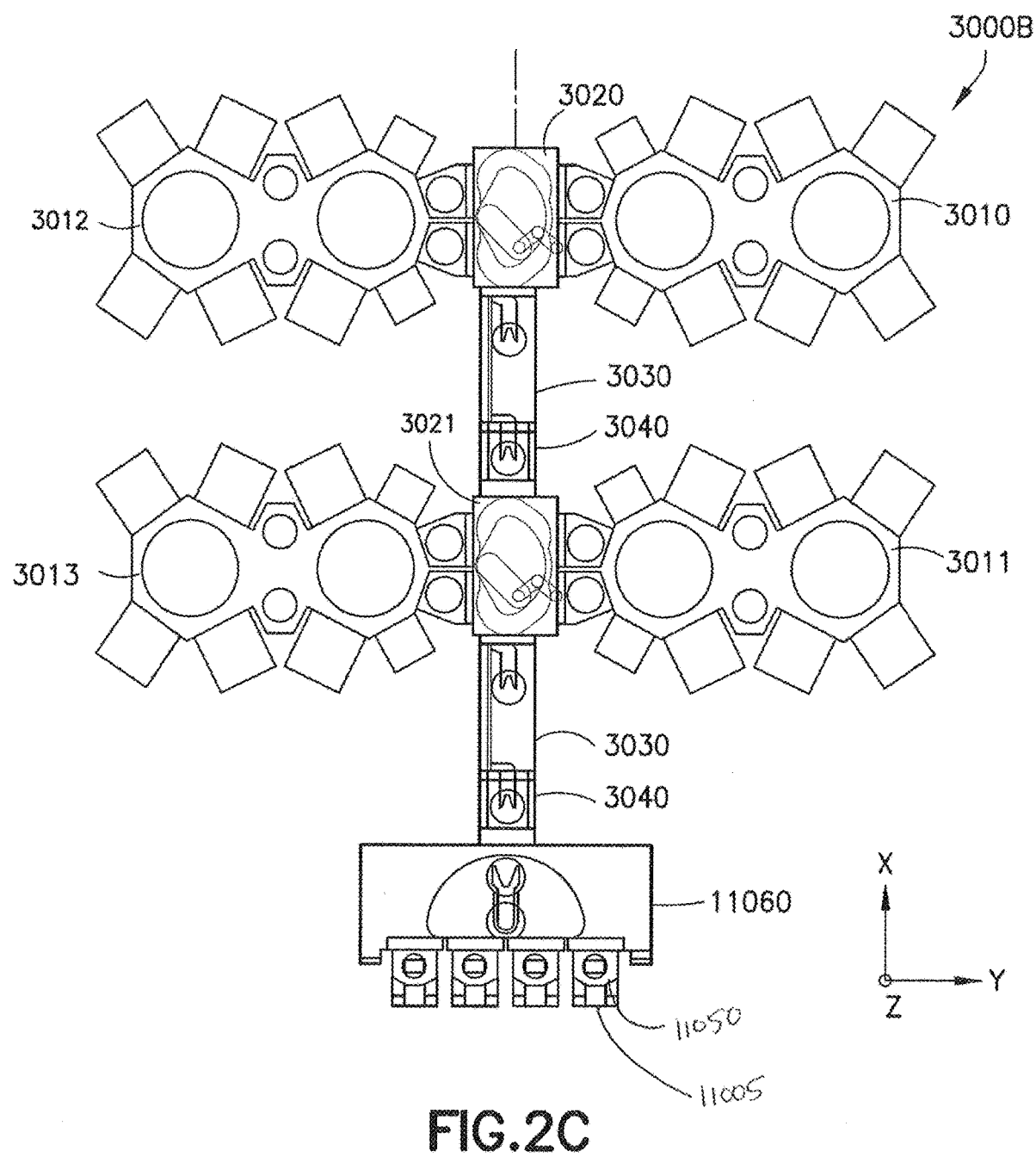
Figure 2D:
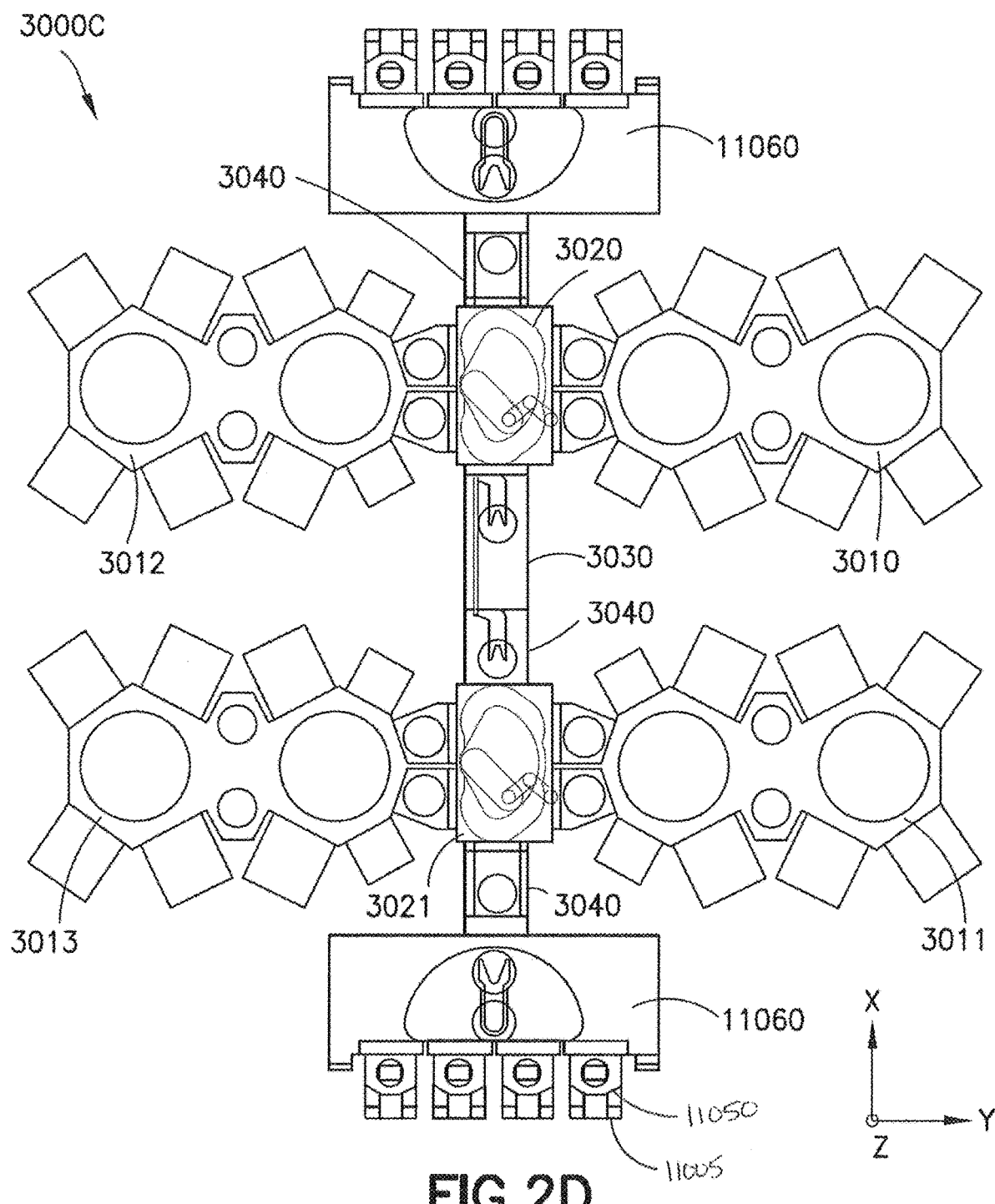
Figure 2E:
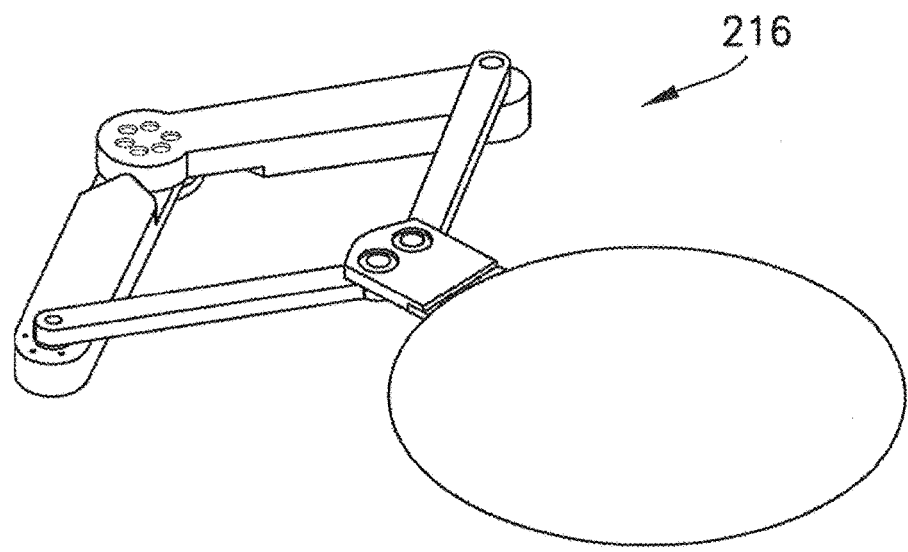
FIGS. 2E, 2F, 2G, and 2H are schematic illustrations of exemplary transport arms of substrate transport robots of the substrate processing apparatus of FIGS. 1A-2D in accordance with aspects of the present disclosure.
Figure 2F:
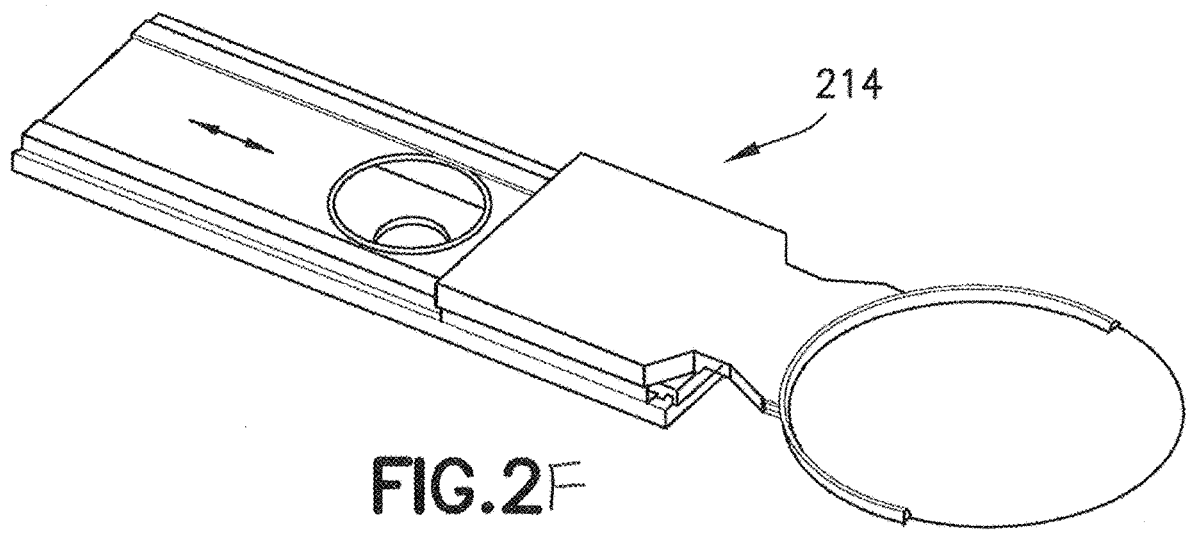
Figure 2G:
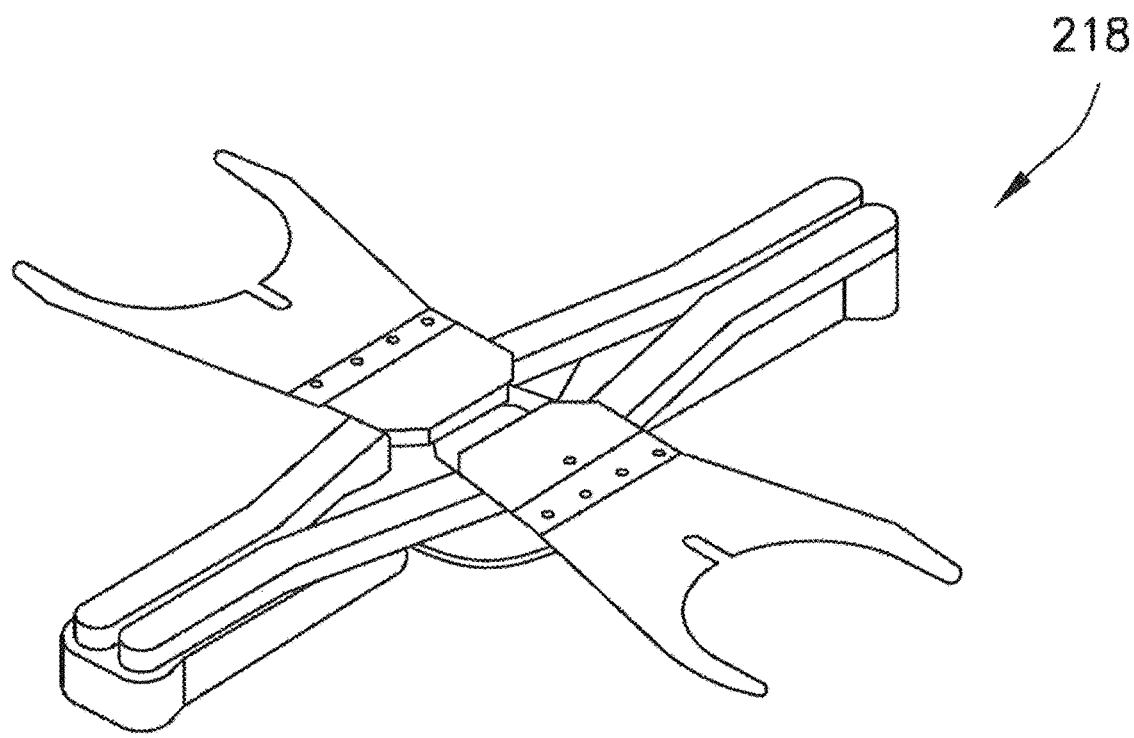
Figure 2H:
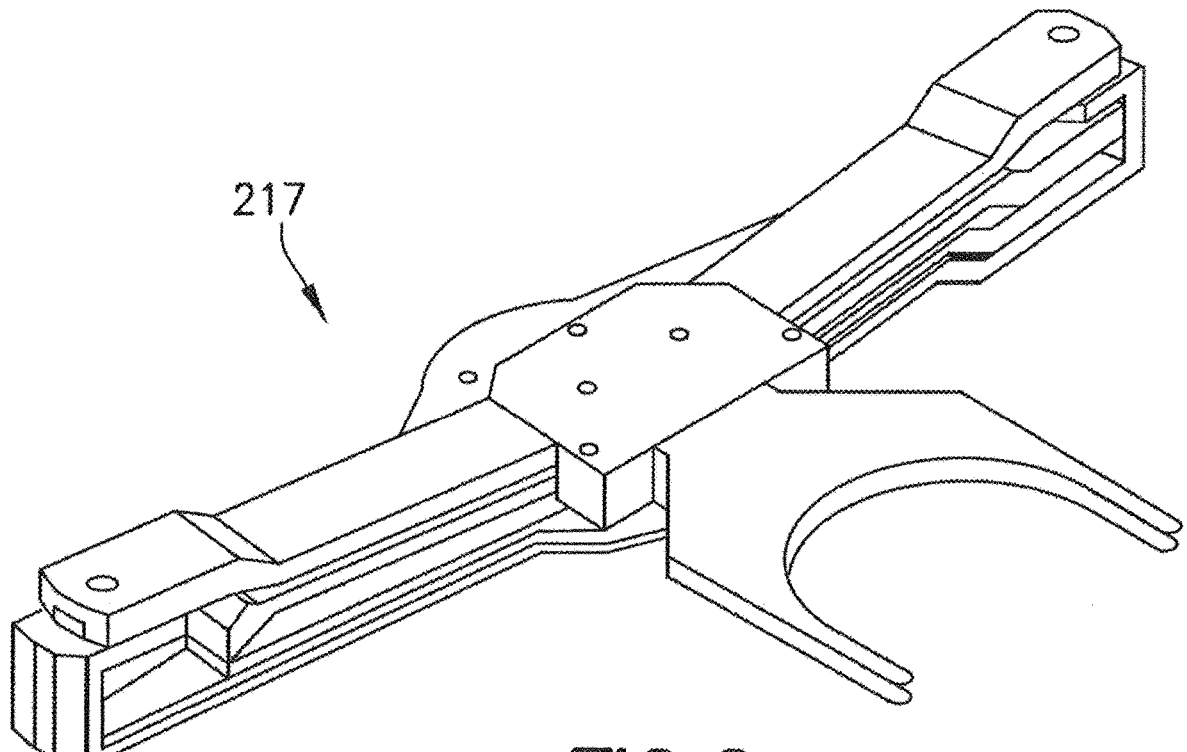

As also noted before, transport chamber modules 18B, 18*i* have one or more corresponding transport apparatus 26B, 26*i*, which may include one or more aspects of the present disclosure described herein, located therein. The transport apparatus 26B, 26*i* of the respective transport chamber modules 18B, 18*i* may cooperate to provide the linearly distributed workpiece transport system 400 in the transport chamber. In this aspect, the transport apparatus 26B may have a general SCARA arm configuration (though in other aspects the transport arms may have any other desired arrangement such as, for example, an arrangement substantially similar to the transport robots 11013, 11014 of the cluster tool illustrated in FIGS. 1A and 1B, a linearly sliding arm 214 as shown in FIG. 2F or other suitable arm having any suitable arm linkage mechanisms. Suitable examples of arm linkage mechanisms can be found in, for example, U.S. Pat. No. 7,578,649 issued Aug. 25, 2009, U.S. Pat. No. 5,794,487 issued Aug. 18, 1998, U.S. Pat. No. 7,946,800 issued May 24, 2011, U.S. Pat. No. 6,485,250 issued Nov. 26, 2002, U.S. Pat. No. 7,891,935 issued Feb. 22, 2011, U.S. Pat. No. 8,419,341 issued Apr. 16, 2013 and U.S. patent application Ser. No. 13/293,717 entitled "Dual Arm Robot" and filed on Nov. 10, 2011 and Ser. No. 13/861,693 entitled "Linear Vacuum Robot with Z Motion and Articulated Arm" and filed on Sep. 5, 2013 the disclosures of which are all incorporated by reference herein in their entireties. In aspects of the present disclosure, the at least one transfer arm may be derived from a conventional SCARA (selective compliant articulated robot arm) type design, which includes an upper arm, a band-driven forearm and a band-constrained end-effector, or from a telescoping arm or any other suitable arm design, such as a Cartesian linearly sliding arm, wherein any such design configuration also includes the slide body 420, alignment system 499 and end effector(s) 420A, 420B . . . 420n as described further herein. For example in one aspect the slide body 420 is mounted to an arm link of any suitable articulated transport arm. Suitable examples of transport arms can be found in, for example, U.S. patent application Ser. No. 12/117,415 entitled "Substrate Transport Apparatus with Multiple Movable Arms Utilizing a Mechanical Switch Mechanism" filed on May 8, 2008 and U.S. Pat. No. 7,648,327 issued on Jan. 19, 2010, the disclosures of which are incorporated by reference herein in their entireties. The operation of the transfer arms may be independent from each other (e.g. the extension/retraction of each arm is independent from other arms), may be operated through a lost motion switch or may be operably linked in any suitable way such that the arms share at least one common drive axis. In still other aspects the transport arms may have any other desired arrangement such as a frog-leg arm 216 (FIG. 2E) configuration, a leap frog arm 217 (FIG. 2H) configuration, a bi-symmetric arm 218 (FIG. 2G) configuration, etc. Suitable examples of transport arms can be found in U.S. Pat. No. 6,231,297 issued May 15, 2001, U.S. Pat. No. 5,180,276 issued Jan. 19, 1993, U.S. Pat. No. 6,464,448 issued Oct. 15, 2002, U.S. Pat. No. 6,224,319 issued May 1, 2001, U.S. Pat. No. 5,447,409 issued Sep. 5, 1995, U.S. Pat. No. 7,578,649 issued Aug. 25, 2009, U.S. Pat. No. 5,794,487 issued Aug. 18, 1998, U.S. Pat. No. 7,946,800 issued May 24, 2011, U.S. Pat. No. 6,485,250 issued Nov. 26, 2002, U.S. Pat. No. 7,891,935 issued Feb. 22, 2011 and U.S. patent application Ser. No. 13/293,717 entitled "Dual Arm Robot" and filed on Nov. 10, 2011 and Ser. No. 13/270,844 entitled "Coaxial Drive Vacuum Robot" and filed on Oct. 11, 2011 the disclosures of which are all incorporated by reference herein in their entireties.

In the aspect of the present disclosure shown in FIG. 1D, the arms and/or end effectors of the transport apparatus 26B may be arranged to provide what may be referred to as fast swap arrangement allowing the transport to quickly swap wafers from a pick/place location. The transport arm 26B may have any suitable drive section (e.g. coaxially arranged drive shafts, side by side drive shafts, horizontally adjacent motors, vertically stacked motors, etc.), for providing each arm with any suitable number of degrees of freedom (e.g. independent rotation about shoulder and elbow joints with Z axis motion). As seen in FIG. 1D, in this aspect the modules 56A, 56, 30i may be located interstitially between transfer chamber modules 18B, 18i and define suitable processing modules, load lock(s), buffer station(s), metrology station(s) or any other desired station(s). For example the interstitial modules, such as load locks 56A, 56 and workpiece station 30i, each have stationary workpiece supports/shelves 56S, 56S1, 56S2, 30S1, 30S2 that cooperate with the transport arms to effect transport or workpieces through the length of the transport chamber along linear axis X of the transport chamber. By way of example, workpiece(s) may be loaded into the transport chamber 416 by interface section 12. The workpiece(s) may be positioned on the support(s) of load lock module 56A with the transport arm 15 of the interface section. The workpiece(s), in load lock module 56A, may be moved between load lock module 56A and load lock module 56 by the transport arm 26B in module 18B, and in a similar and consecutive manner between load lock 56 and workpiece station 30i with arm 26i (in module 18i) and between station 30i and station 412 with arm 26i in module 18i. This process may be reversed in whole or in part to move the workpiece(s) in the opposite direction. Thus, in one aspect, workpieces may be moved in any direction along axis X and to any position along the transport chamber and may be loaded to and unloaded from any desired module (processing or otherwise) communicating with the transport chamber. In other aspects, interstitial transport chamber modules with static workpiece supports or shelves may not be provided between transport chamber modules 18B, 18i. In such aspects, transport arms of adjoining transport chamber modules may pass off workpieces directly from end effector or one transport arm to end effector of another transport arm to move the workpiece through the transport chamber. The processing station modules may operate on the wafers through various deposition, etching, or other types of processes to form electrical circuitry or other desired structure on the wafers. The processing station modules are connected to the transport chamber modules to allow wafers to be passed from the transport chamber to the processing stations and vice versa. A suitable example of a processing tool with similar general features to the processing apparatus depicted in FIG. 1D is described in U.S. Pat. No. 8,398,355, previously incorporated by reference in its entirety.

Referring now to FIGS. 2A-2D the processing tool is illustrated as a linear processing tool 3000, 3000A, 3000B, 3000C having more than one cluster workstations 3010-3013 each having one or more transfer chambers 3001-3003 and a plurality of processing modules 11030 (e.g. a combination linear cluster tool). In one aspect the linear processing tool 3000, 3000A, 3000B, 3000C is substantially similar to those described in U.S. patent application Ser. No. 14/377,987 filed on Aug. 11, 2014 entitled "Substrate Processing Apparatus" the disclosure of which is incorporated herein by reference in its entirety. In one aspect the cluster workstations 3010-3013 are substantially similar to the vacuum back end 11020 described above. The cluster workstations 3010-3013 are connected to each other by one or more transfer chambers 3020, 3021 and one or more linear transfer tunnels (also referred to herein as vacuum tunnels) 3030. As may be realized, each of the transfer chambers 3020, 3021 includes a transport robot 3023. As may also be realized, referring to FIGS. 2E-2G, the linear transfer tunnel 3030 is in one aspect formed of tunnel modules that are connected to each other to form a common tunnel and having one or more transport robots 3033 disposed therein and configured to traverse a length of the common tunnel. For example, the linear transfer tunnel 3030 is a vacuum tunnel that includes one or more vacuum tunnel modules 3030A-3030n that may be sealingly coupled together to form a vacuum tunnel having any suitable length. Each vacuum tunnel module 3030A-3030n includes a connection port 3090 at each end of the vacuum tunnel module 3030A-3030n to allow connection of the vacuum tunnel modules to each other and/or any other suitable module of the processing tool described herein. In this aspect, each vacuum tunnel module 3030A-3030n includes at least one transport cart guide 3080 and at least one motor component 3081 for driving at least one transport cart 2530 (which includes aspects of the present disclosure as described herein) through a respective vacuum tunnel module 3030A-3030n. It is noted that the connection ports 3090 are sized to allow passage of the transport carts through the ports. As may be realized, when two or more vacuum tunnel modules 3030A-3030n are coupled to each other the at least one transport cart guide 3080 of each vacuum tunnel module 3030A-3030n form a substantially continuous transport cart guide that extends through the vacuum tunnel 3030 for allowing passage of the transport cart 2530 between longitudinal ends 3030E1, 3030E2 of the vacuum tunnel 3030. The at least one motor component 3081 of each of the vacuum tunnel modules 3030A-3030n also form a substantially continuous motor component that allows for substantially continuous driving movement of the transport cart between the ends 3030E1, 3030E2 of the vacuum tunnel 3030.

Referring now to FIGS. 3, 4A, 4B, 5A, and 5B the aspects of the present disclosure will be described with respect to an atmospheric transport robot 11013 (such as found in any one or more of the above-described substrate processing systems or tool stations, and also referred to herein as a robot transport) but it should be understood that the aspects of the present disclosure are equally applicable to vacuum transport robots 26B, 11014, 11014A, 11014B, 2080, 3023 and 2530 such as those described herein with respect to FIGS. 1A-2D where the atmospheric and/or vacuum robots have any suitable transfer arm configuration including but not limited to SCARA arms, Cartesian arms, linearly sliding arms, frog-leg arms, leap frog arms, and bi-symmetric arms. In some aspects, the transport robot (such as those described herein) is mounted to a linear slide (see, e.g., FIG. 3, transport robot 11013 in FIG. 1B, and FIG. 2C) or a boom arm BA (see, e.g., FIGS. 2A-2D as described in U.S. patent application Ser. No. 14/377,987 previously incorporated herein by reference in its entirety) so as to be movable in at least the X and/or Y directions while in other aspects the transport robot (such as those described herein) is mounted so that a base of the transport robot is fixed from movement in the X and/or Y directions (see, e.g., FIGS. 1C, 1D, and transport robot 11014 in FIG. 1B). It should be understood that the configuration of the transport robots and the automatic teach apparatus 500 shown in the FIGS. are representative for description purposes only and the arrangement, shapes and placement of the illustrated components may be varied as desired without deviating from the scope of the invention.

Figure 3:
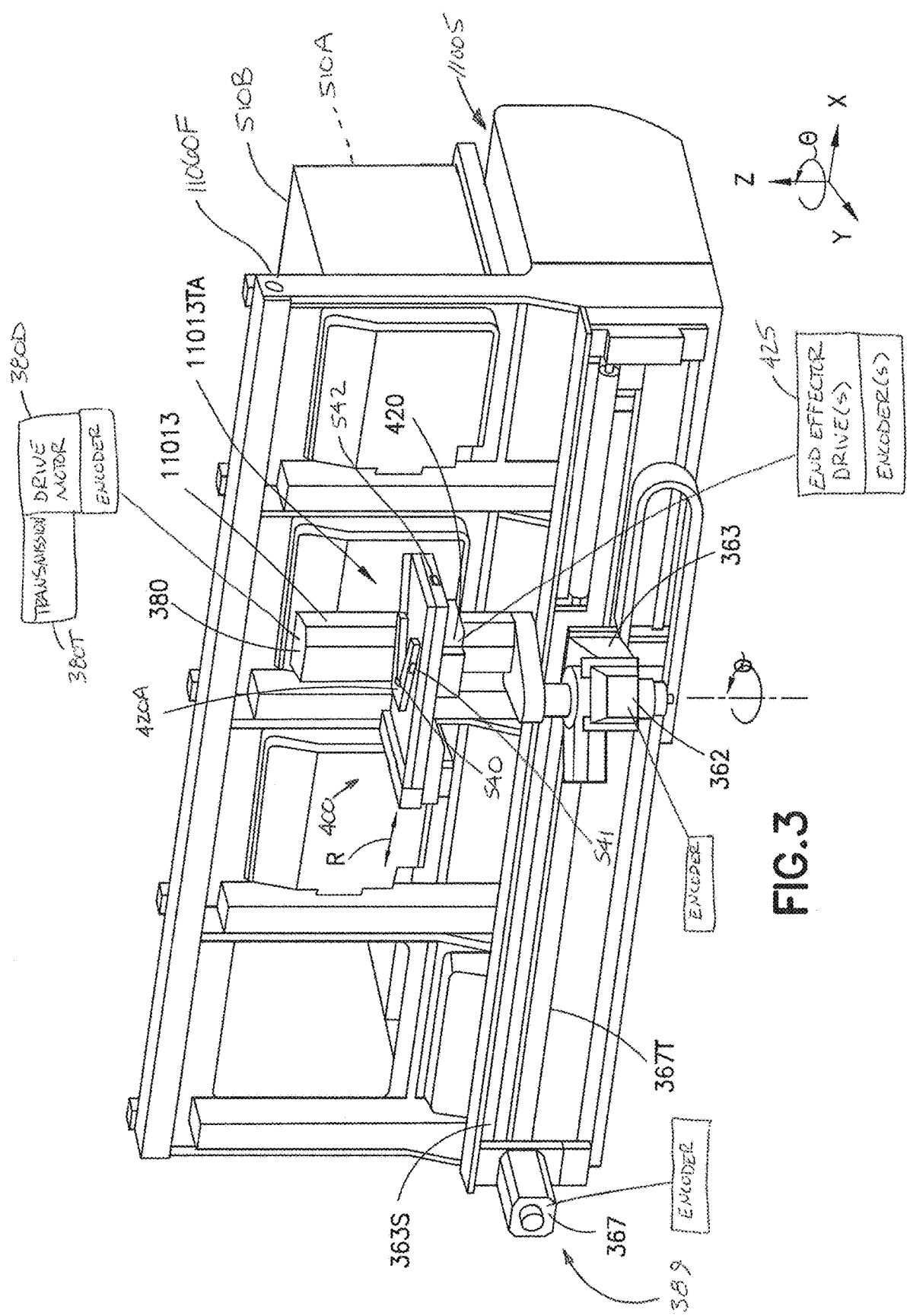
FIG. 3 is a schematic illustration of a portion of the substrate processing apparatus of FIGS. 1A-2D incorporating aspects of the present disclosure.

As can be seen in FIG. 3, in one aspect, the transport robot 11013 is movably mounted to a frame 11060F of the mini-environment 11060 or in other aspects to a frame of any suitable module of the processing tool, such as a frame of the vacuum tunnel 3030 and/or transfer chamber modules 3018, 3020, 3021. In this aspect, the transport robot 11013 includes a drive section 389 having any suitable number of drive axes to move a wafer or substrate along one or more of the X, Y, Z, θ and R (end effector extension) axes. For example, the transport robot 11013 includes a movable transport arm 11013TA that, in one aspect, is mounted to a carriage 363 so that the transport arm 11013TA is movably mounted to the frame 11060F. The carriage 363 is, in one aspect, mounted to a slide or carriage 363S so as to be movable in the X direction while in other aspects the carriage 363S is mounted to the frame 11060F so as to be fixed in the X (and/or Y direction). In one aspect any suitable drive 367 is mounted to the frame 11060F and drivingly connected to the carriage 363 by any suitable transmission 367T for moving the base in the X direction. In this aspect the transmission is a belt and pulley transmission and the drive is a rotary drive but in other aspects the drive is a linear actuator that is drivingly connected to the carriage 363 with any suitable transmission or without a transmission (e.g. such as where the carriage includes a drive portion of the linear actuator). Here the transport arm 11013TA includes a rotational drive 362, a Z-drive column 380, a slide body 420 and one or more end effectors. The rotational drive 362 is any suitable rotational drive mounted to the carriage 363 and a Z drive column 380 is mounted to an output of the rotational drive 362 so as to rotate in the direction of arrow T about the 6 axis (e.g. the θ direction). A slide body 420 is movably mounted to the Z drive column 380 where the Z-drive column 380 includes any suitable drive motor 380D and/or transmission 380T for moving the slide body 420 in the Z direction. As may be realized, the relative positon of the Z-drive column 380 with respect to the slide body 420 provides sufficient clearance for adequate traverse of the end effectors 420A, 420B and wafers to effect wafer detection by the one or more sensors 450, 451 as described further below.

Figure 4A:
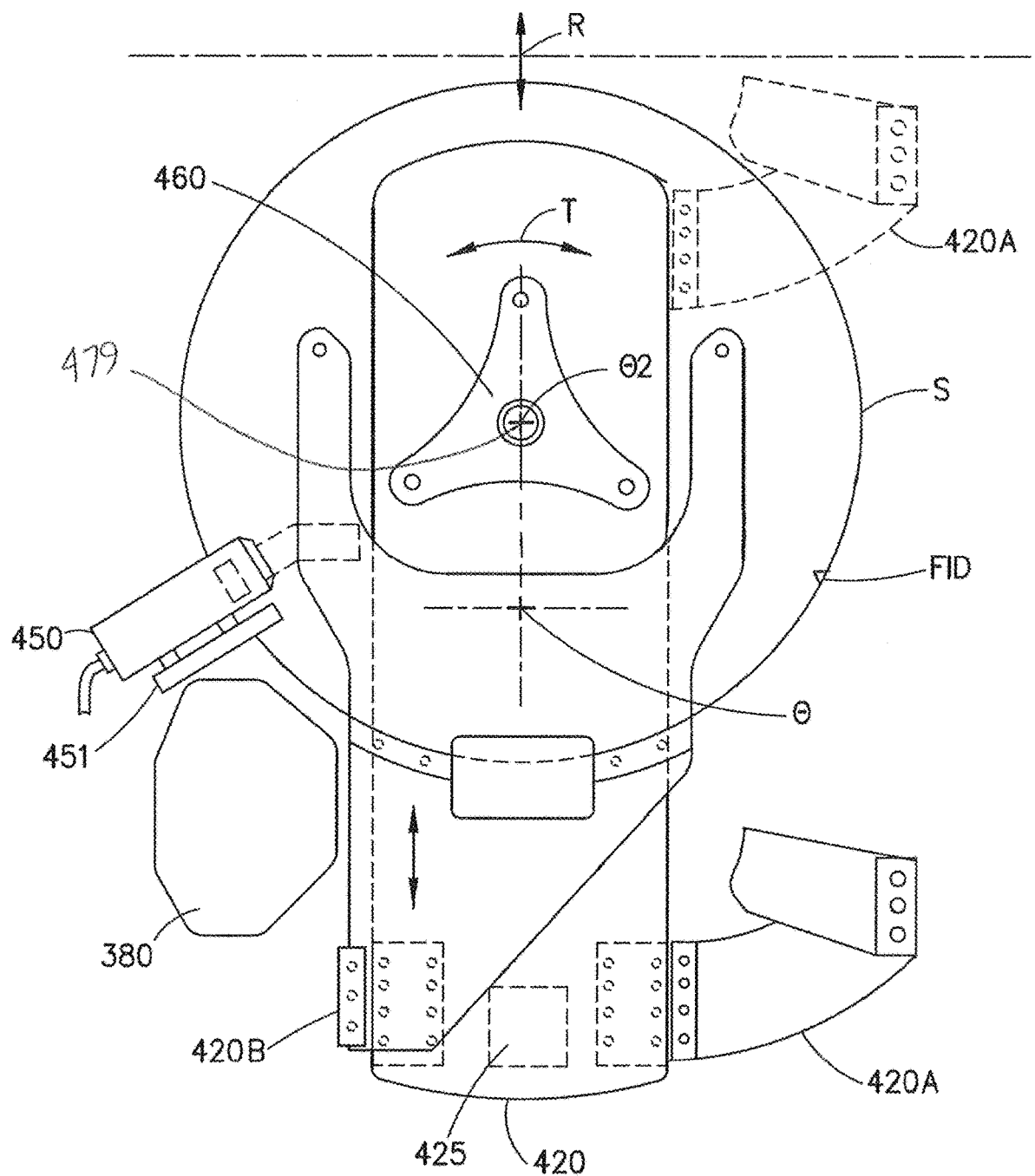
FIGS. 4A and 4B are schematic illustrations of a portion of the substrate processing apparatus illustrated in FIG. 3 incorporating aspects of the present disclosure.
Figure 4B:
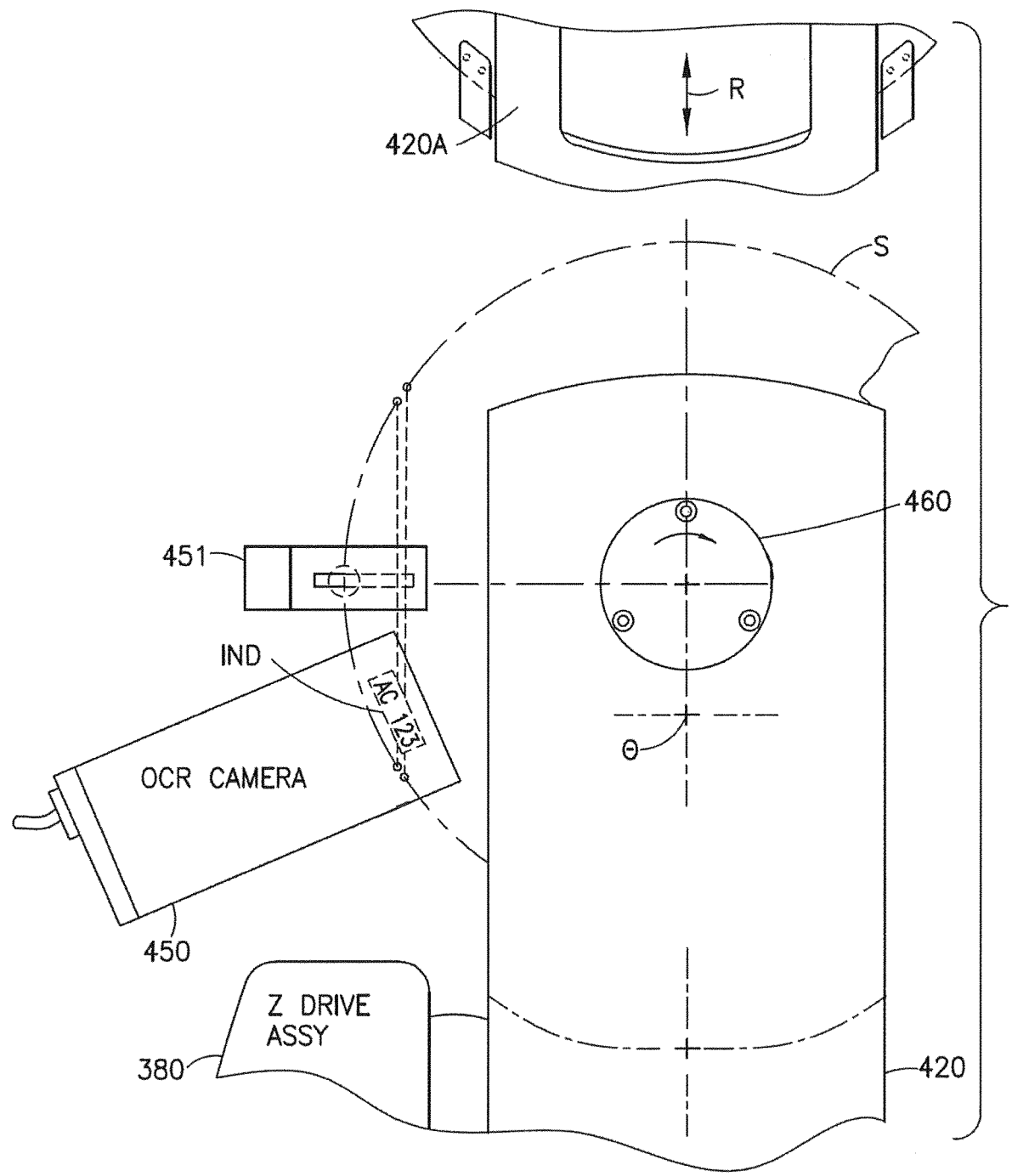

Referring also to FIGS. 4A and 4B one or more (e.g. at least one) wafer holders or end effectors 420A, 420B are movably mounted to the slide body 420 in any suitable manner so as to extend and retract in the R direction. While two end effectors 420A, 420B are illustrated for exemplary purposes only it should be understood that any suitable number of end effectors are mounted to the slide body 420. For example, in one aspect there is a single end effector mounted to the slide 420 for effecting the transport and alignment of a wafer(s) in the manner described herein. In other aspects there are more than two end effectors mounted to the slide body 420 for effecting the transport and alignment of a wafer(s) in the manner described herein. Each end effector has a predetermined end effector reference location 479 (illustrated in FIG. 4A with respect to end effector 420B). Substrates S are carried by the end effector 420A, 420B with a center of the substrates S coincident with the predetermined end effector reference location 479.

As may be realized, the one or more end effectors traverse, with the transport arm 11013TA as a unit, in a first direction (e.g. one or more of the X, Y and Z directions) relative to the frame and traverses linearly, relative to the transport arm 11013TA, in a second direction (e.g. the R direction) that is different from the first direction. The slide body includes one or more linear drives 425 configured to independently move each end effector 420A, 420B in the R direction. The one or more linear drives 425 are any suitable drive(s) having any suitable transmissions which in one aspect are substantially similar to those described in, for example, United States provisional patent application number 61/917,056 filed on December 17, 2013 entitled "Substrate Transport Apparatus", the disclosure of which is incorporated by reference herein in its entirety. The end effectors 420A, 420B are arranged on the slide body 420 so that they are stacked one over the other so as to have a common axis R of extension and retraction. The transport robot 11013 may include one or more sensors 450, 451 (as described in U.S. patent application Ser. No. 14/928,352 filed on Oct. 30, 2015 titled "Wafer Aligner", the disclosure of which is incorporated herein by reference in its entirety) mounted to the slide body 420 and arranged to measure/detect an edge of the wafer to determine one or more predetermined characteristics of the wafer such as wafer diameter, wafer radial runout, a position of an alignment fiducial FID (e.g. notch/flat, mark or other feature) location, location of the wafer centerline, location of wafer center or any other suitable information pertaining to the wafer(s) carried by the end effectors 420A, 420B such as a wafer identification. The transport robot 11013 may also include any suitable rotary chuck or spinner (e.g. such as the aligner noted above) 460 connected to the slide body 420 as described in U.S. application Ser. No. 14/928,352 filed on Oct. 30, 2015.

Referring to FIGS. 5A, 5B, 6A and 6B, as described above, the automatic teach apparatus 500 is a combined teach system configured to automatically teach locations of the load port modules 11005 (or any suitable workpiece load station) and locations of substrate holding stations (that are separate from and located apart from the workpiece load station) within a substrate processing tool in vacuum and/or atmospheric environments. As described above, the automatic teach apparatus 500 includes the mock carrier jig 510A, 510B and the removable module jig 600. The mock (i.e., imitation) carrier jig 510A, 510B imitates (i.e., in shape, size and configuration) any suitable substrate carrier (such as the substrate cassettes 11050) received at any suitable substrate carrier holding station (such as the load ports 11040). For example, the mock carrier jig 510A, 510B has a frame 550 that forms an interior chamber 551 with an opening 636 in a front wall 637 (see FIG. 6A) that is arranged for end effector entry into the interior chamber 551 of the mock carrier jig 510A, 510B through the front wall 637 in a manner substantially similar to that of the substrate cassettes 11050. In one or more aspects, the opening 636 is oriented in a vertical plane (e.g., the X(or θ)-Z plane of the transport robot 11013; however, in other aspects the opening 636 may be located in any suitable plane accessible by the transport robot. Any suitable kinematic coupling 627 is coupled to (or formed integrally with) the frame 550 for coupling the mock carrier jig 510A, 510B to the load port module 11005 in a predetermined location on the load port module 11005. The kinematic coupling 627 is substantially similar to that found on the substrate cassettes 11050. In some aspects, the frame 550 is sealable and the mock carrier jig 510A, 510B includes a removable door 552 (FIG. 6A—similar to a cassette door of the substrate cassettes 11050) configured to couple with the frame 550 and substantially seal the interior chamber 551, where the door 552 is configured to be removed from the frame by the load port module 11005 in a manner substantially similar to the way a cassette door is removed from a substrate cassette 11050 by the load port module. The frame 550 is configured for transportation by a human operator (such as with handles 666 and/or configured for automated handling with any suitable automation equipment including but not limited to overhead gantries, mobile/wheeled transports, etc. (such as with an automation interface substantially similar to that of the substrate cassettes 11050).

Figure 5A:
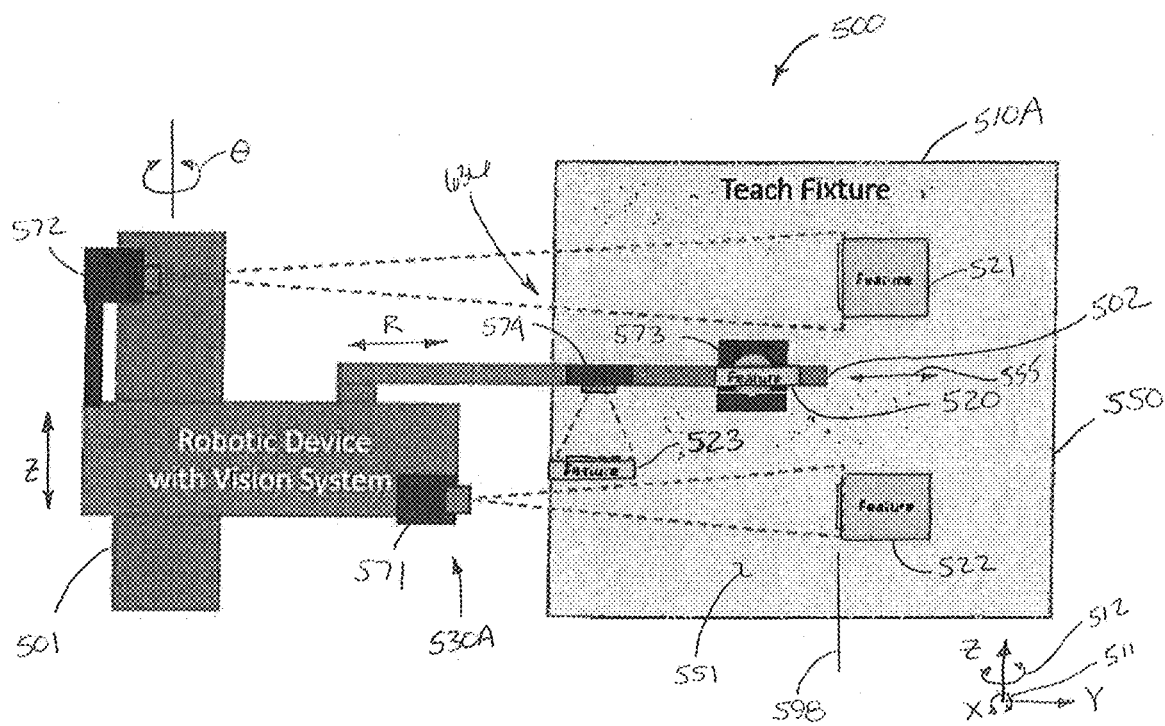
FIG. 5A is a schematic illustration of an automatic teach apparatus in accordance with the aspects of the present disclosure and employed with the substrate processing apparatus described herein.

Referring to FIG. 5A, in some aspects, the mock carrier jig 510A houses one or more detection features or targets 520-523 that is/are sensed by one or more imaging sensors 571-574 of the machine vision system 530A that is/are carried by the substrate transport apparatus 501 (which is substantially similar to those substrate transport apparatus described herein). In a manner similar to that described herein with respect to mock carrier jig 510B, the target(s) 520-523 comprise more than one fixed targets 520-523, each with a different predetermined pose so that the plane of each respective target 520-523 corresponds to a different respective load port module reference plane (e.g., Z-X(or θ) plane, R(or Y)-X(or θ) plane, and Z-Y(or R) plane) (see FIGS. 5A, 5B, and 10), and the one or more sensors 571-574 have an orientation corresponding to each respective fixed target 520-523 so that each fixed target 520-523 forms with a respective imaging sensor 571-574 different couples corresponding to and comprising the respective imaging sensor 571-574 and arm target 520-523.

In this aspect, the mock carrier jig 510A is disposed for removable engagement with the load port modules 11005, with both the targets 520-523 and the at least one movable imaging sensor 750-752 (of the removable module jig 600) mounted to the mock carrier jig 510A. Here at least one of the targets 520-523 face the opening 636 of the mock carrier jig 510A. In this aspect, the mock carrier jig 510A houses at least one rearward (e.g., in the Y or R directions) facing target 521, 522, at least one vertically (e.g., in the Z direction) facing target 523, and at least one laterally (e.g., in the X or θ directions) facing target 520. The machine vision system likewise includes, mounted to the transport arm 11013TA, at least one forward (e.g., in the Y or R directions) facing sensor 571, 572 (paired with the rearward facing target(s)), at least one vertically (e.g., in the Z direction) facing sensor 574 (paired with the vertically facing target(s)), and at least one laterally (e.g., in the Y or R directions) facing sensor 573 (paired with the laterally facing target(s)). Here at least one of the imaging sensors 571-574 face the front wall 637 of the mock carrier jig 5110A on approach of the transport arm 11013TA, along a motion path extending through the opening 636, to the load port module 11005 and entry into the mock carrier jig 510A.

As may be realized, the at least one forward facing sensor 571, 572 is/are mounted to the substrate transport apparatus 501 in any suitable manner so as to sense the rearward facing targets 521, 522 to establish a location of the mock carrier jig 510A relative to the substrate transport apparatus 501 in, for example, the X-Z plane to provide initial alignment of the end effector 502 for subsequent sensing operations as described above. In this aspect, two rearward facing targets 521, 522 are provided and are vertically spaced from one another in a predetermined special relationship. In one or more aspects, the rearward facing targets 521, 522 are sensed by one or more of the forward facing sensors 571, 572 to provide both initial alignment in the X-Z plane and inclination 511 (e.g., in the X-Y plane) and rotation 512 (e.g., in the X-Z plane) of the cassette holding location of the load port module (e.g., through a comparison of sensed locations the rearward facing targets to the expected predetermined locations of the rearward facing targets). The at least one vertically facing sensor 574 is mounted to the substrate transport apparatus 501 in any suitable manner (such as on the end effector 502) so as to sense the vertically facing target 523 to establish a location of the mock carrier jig 510A relative to the substrate transport apparatus 501 in, for example, the Y or R directions. In the aspect illustrated in FIG. 5A, the sensor 574 is facing downwards and the target 523 is facing upwards but in other aspects the sensor 574 may be facing upwards and the target 523 may be facing downwards. The at least one laterally facing sensor 573 is mounted to the substrate transport apparatus 501 in any suitable manner (such as on a respective end effector 502) so as to sense the laterally facing target 520 and establish a location of the mock carrier jig 510A relative to the respective end effector 502 in, for example, the Z direction. Where the substrate transport apparatus 501 includes more than one end effector each end effector may include a respective sensor configured to sense the laterally facing target 520. The sensors 571-573 of the machine vision system 530A are coupled to any suitable controller (such as controller 11091) so that the motor encoder positions of the substrate transport apparatus 501 are read/determined by the controller 11091 as the sensors 571-573 sense the respective targets 520-523 for teaching the location of the mock carrier jig 510A (and the location of the load port module 11005 via the mock carrier jig 510A kinematically located on the load port module 11005) to the substrate transport apparatus 501.

Figure 5B:
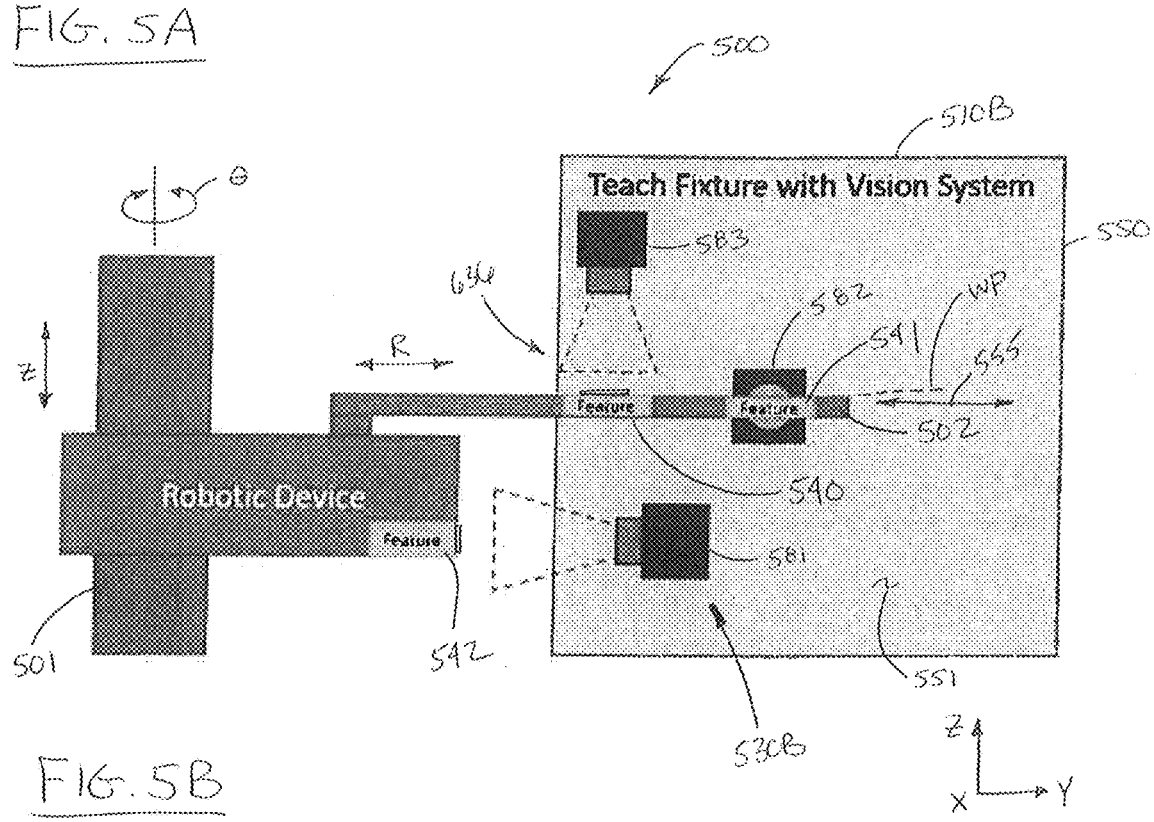
FIG. 5B is a schematic illustration of an automatic teach apparatus in accordance with the aspects of the present disclosure and employed with the substrate processing apparatus described herein.
Figure 6A:
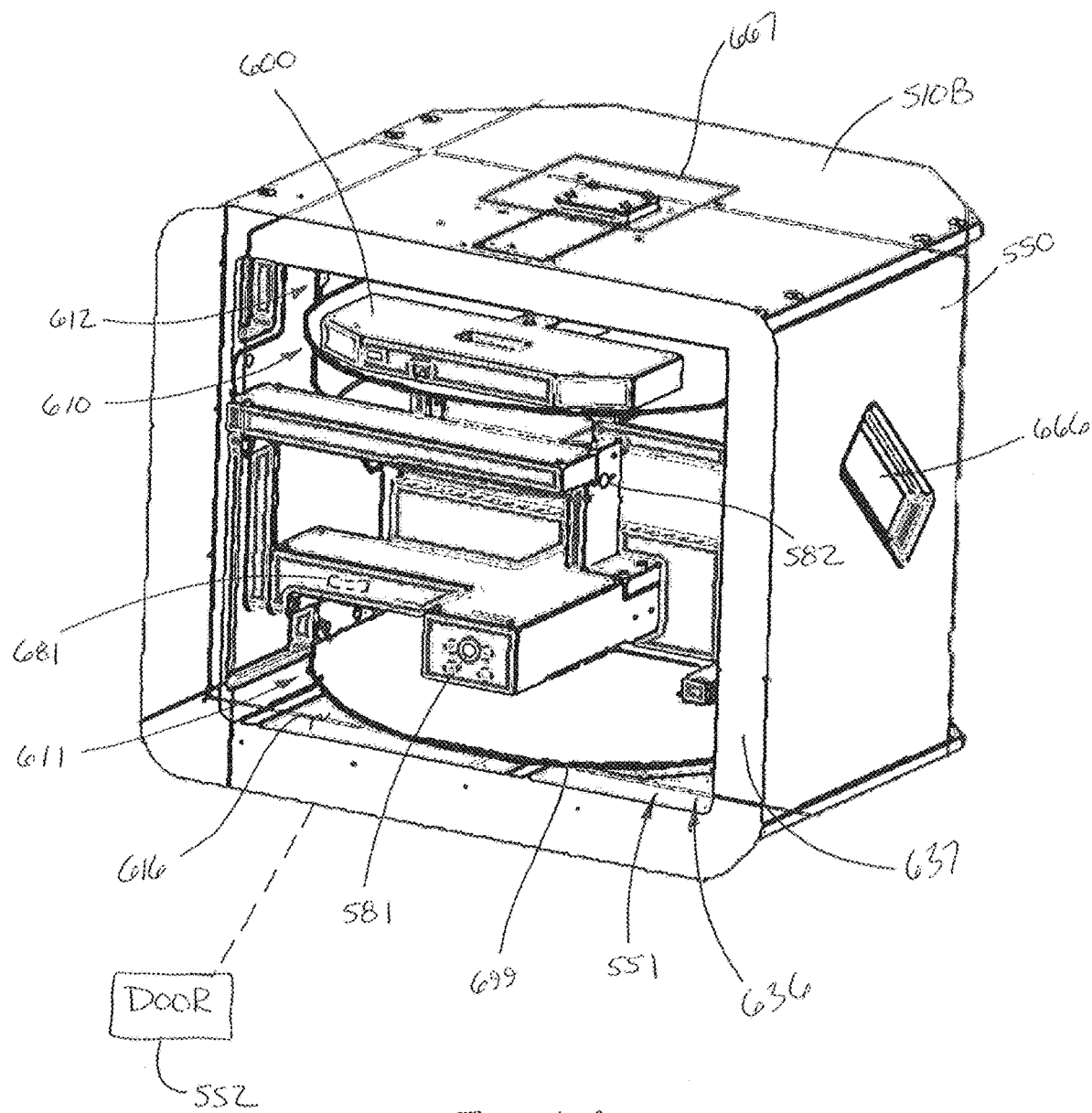
FIGS. 6A, 6B, 6C, 6D, and 6E are schematic illustrations of portions of the automatic teach apparatus of FIG. 5B in accordance with the aspects of the present disclosure.
Figure 6B:
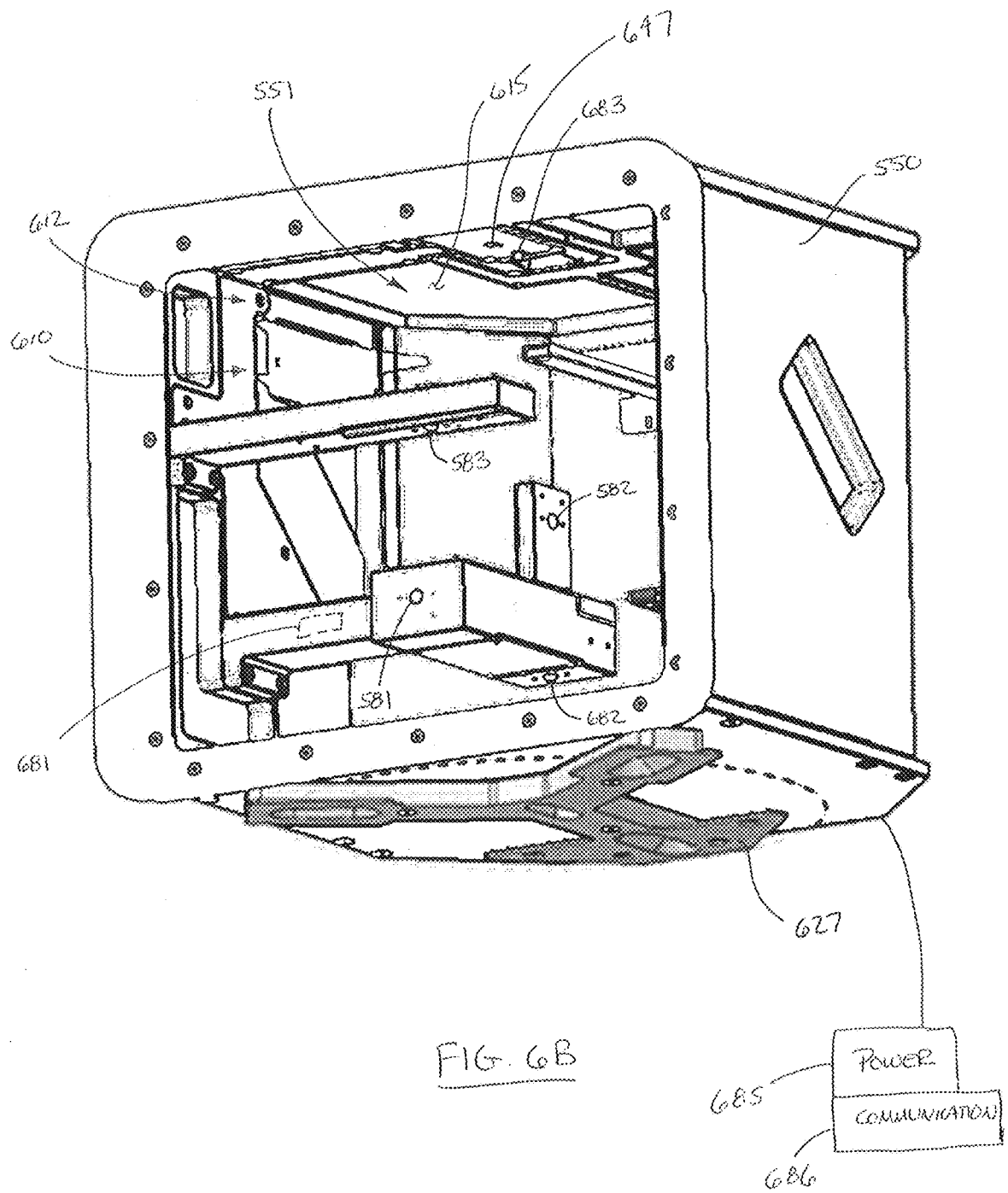

Referring to FIG. 5B, in some aspects, the machine vision system 530B includes a least one fixed imaging sensor 581-583 (fixed to the frame 550) and at least one movable imaging sensor 750-752 (see FIGS. 8A-8C) removably connected to the frame 11090F and configured to image at least one target of the machine vision system 530B. In one or more aspects, the at least one fixed imaging sensor 581-583 (such as fixed imaging sensor 581) is positioned so as to image the at least one arm target 540-542 in a direction extending through the opening 636 of the mock carrier jig 510B so that the resolved offset frees end effector extension through the opening 636 into an interior chamber 551 of the mock carrier jig510B. In one or more aspects, the at least one fixed imaging sensor 581-583 (such as fixed imaging sensor 581) is positioned so as to image the at least one arm target 540-542 in a direction extending through the opening 636 of the mock carrier jig 510B so that the controller 11091 confirms, based on the resolved offset, unobstructed arm extension of the end effector 502 into the interior chamber 551 of the mock carrier jig 510B.

In one or more aspects, the at least one fixed imaging sensor 581-583 (such as fixed imaging sensors 582, 583) is positioned so as to image the at least one arm target 540-542 in a crossing direction (e.g., the X (or θ) and/or Z directions) extending at a crossing angle to an extension path 555 of the end effector 502 extending through the opening 636 into an interior chamber 551 of the mock carrier jig 510B. As described herein, the resolved offset, based on the image (see FIG. 10) of the at least one arm target 540-542 in the direction extending through the opening 636, operates to align the at least one arm target 540-542 to another progressive teach position (e.g., that is progressive from a previous teach position) so that offset resolution based on the image of the at least one arm target 540-542 in the crossing direction progressively resolves the resolved offset. In one or more aspects, the at least one fixed image sensor 581-583 (such as fixed imaging sensors 582, 583) is positioned so as to image the at least one arm target 540-542 in more than one crossing direction, each of which extends at a crossing angle to the extension path 555 of the end effector 502 (e.g., extending through the opening 636 into the mock carrier jig 510B) and to each other, each serving to progressively resolve the resolved offset along a respective axis corresponding to each degree of freedom of the at least one degree of freedom of arm motion effected by the drive section 389.

As will be described herein, in some embodiments the at least one fixed imaging sensor 581-583 comprises more than one fixed imaging sensors 581-583, each with a different predetermined pose so that an imaging sensor plane of each respective imaging sensor 750-752 corresponds to different respective load port module reference plane (e.g., Z-X(or θ) plane, R(or Y)-X(or θ) plane, and Z-Y(or R) plane) (see FIGS. 5A, 5B, and 10), and the arm targets 540-542 have an orientation corresponding to each respective fixed imaging sensor 581-583 so that each fixed imaging sensor 581-583 forms with a respective arm target(s) 540-542 different couples corresponding to and comprising the respective fixed imaging sensor 581-583 and arm target(s) 540-542. As will also be described herein, the at least one fixed imaging sensor 581-583 is positioned so as to image at least one end effector target 540, 541 disposed on the end effector 420A, 420B, 502, on a wafer plane WP (see FIG. 5B) defined by the end effector 420A, 420B, 502 (and formed by a surface 699S of the verification substrate 699) and in a predetermined position with respect to the end effector reference location 479. Here, the controller 11091 verifies or progressively resolves the resolved offset ΔX, Δθ, ΔY, ΔR, ΔZ (as described herein) based on the end effector target image (see FIG. 10) from the at least one fixed imaging sensor imaging the end effector target image with the end effector 420A, 420B, 502 positioning the wafer plane WP within each (or at least one) of the at least one mock workpiece holding slots 610, 611, 612.

Figure 6C:
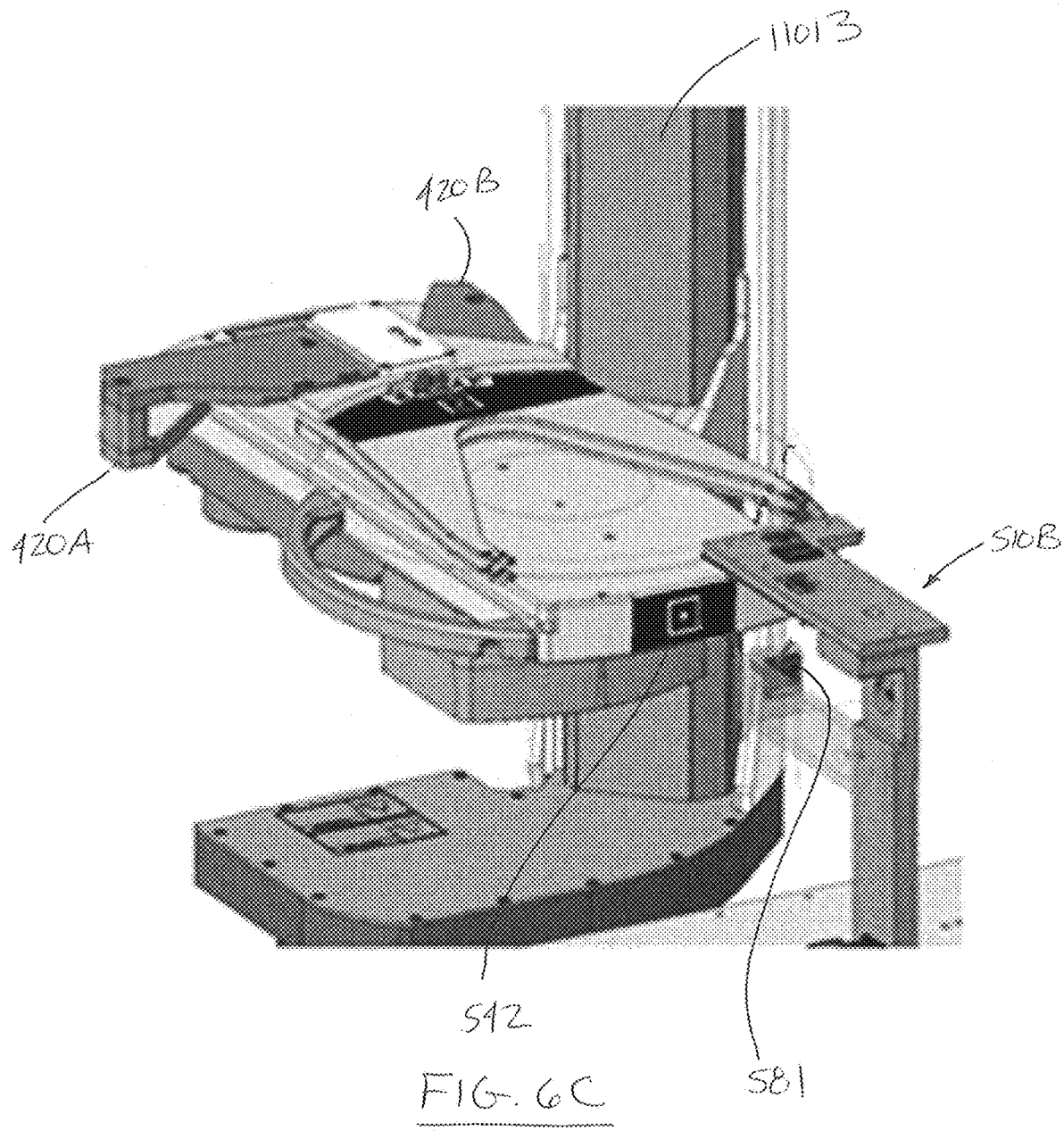
Figure 6D:
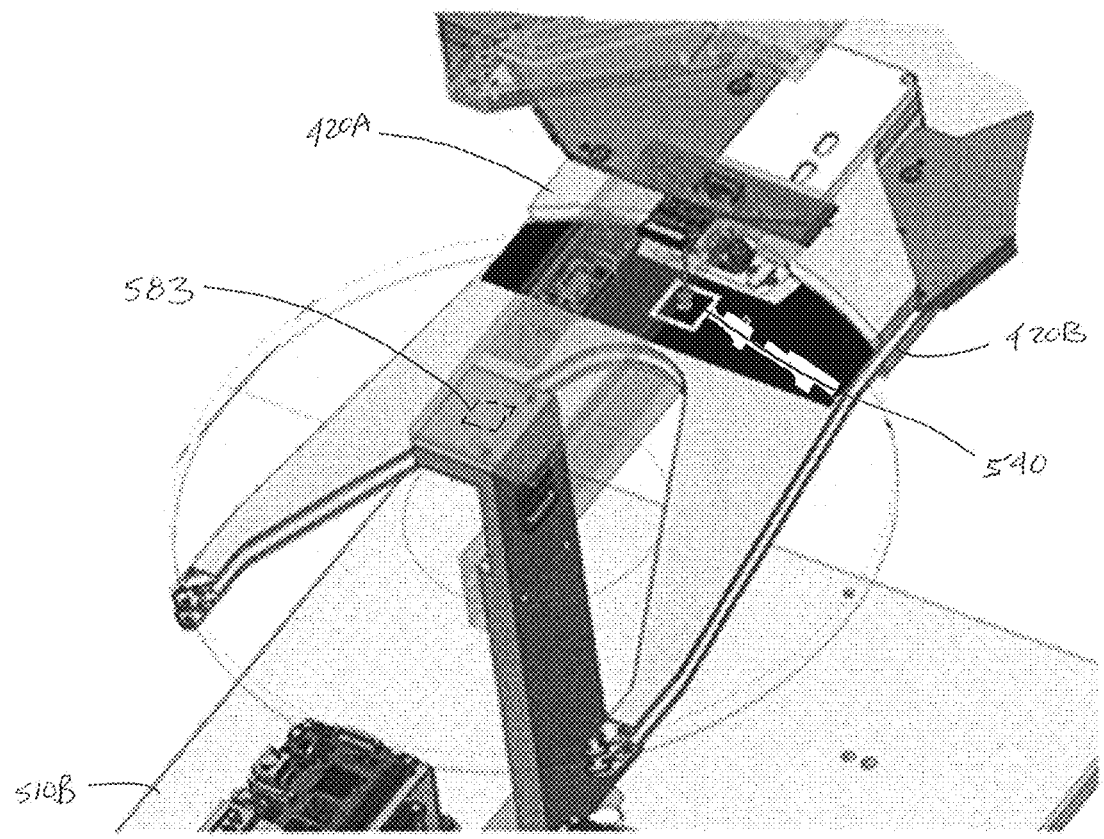
Figure 6E:
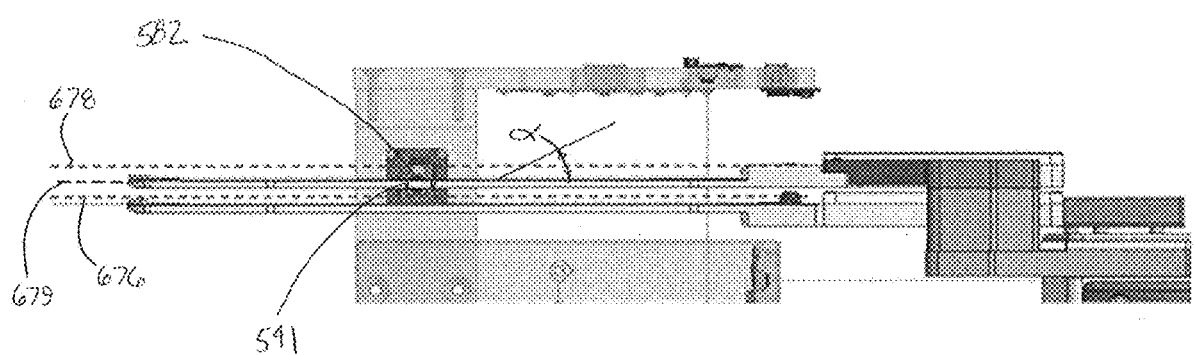

In this aspect, the mock carrier jig 510B is disposed for removable engagement with the load port modules 11005, with both the at least one fixed imaging sensor 581-583 and the at least one movable imaging sensor 750-752 mounted to the mock carrier jig 510B as will be described herein. The mock carrier jig 510B houses at least one fixed imaging sensor 581-583 of the machine vision system 530B while one or more detection features or targets 540-542 (see also FIGS. 6C-6E) of the machine vision system 530B are carried by the substrate transport apparatus 501 and/or one or more detection features or targets 871, 1120, 1201, 1202 (see also FIGS. 11-12B) are carried by a substrate holding station as will be described herein. Here, at least one fixed imaging sensor field of view faces the opening 636 of the mock carrier jig 510B. The at least one fixed imaging sensor has a predetermined pose with respect to the predetermined load station reference location 11005L and includes at least one rearward (e.g., in the Y or R directions) facing sensor 581, at least one vertically (e.g., in the Z direction) facing sensor 583, and at least one laterally (e.g., in the X or 6 directions) facing sensor 582. The at least one laterally facing sensor 582 is, in one or more aspects, located within the frame 550 at a Z height location corresponding to the Z height location of workpiece holding slot number thirteen (13) (or any other suitable predetermined Z height of any suitable workpiece holding slot number) of a conventional 25 substrate carrier such as those illustrated in FIG. 1A.

In this aspect, at least one of the arm targets 540-542 is disposed facing the front wall 637 and opening 636 of the mock carrier jig 510B on approach of the transport arm 11013TA, along a motion path extending through the opening 636, to the load port module 11005 and entry into the mock carrier jig 510B. The one or more targets include at least one forward (e.g., in the Y or R directions) facing target 542 (paired/forming a couple with the rearward facing sensor(s)), at least one vertically (e.g., in the Z direction) facing target 540 (paired/forming a couple with the vertically facing sensor(s)), and at least one laterally (e.g., in the Y or R directions) facing target 541 (paired/forming a couple with the laterally facing sensor(s)).

Still referring to FIG. 5B, in one or more aspects, the at least one rearward facing sensor 581 is mounted to the frame 550 in any suitable manner so as to sense the forward facing target 542 to establish a location of the mock carrier jig 510B relative to the substrate transport apparatus 501 in, for example, the X-Z plane to provide initial alignment of the end effector 502 for subsequent sensing operations as described above. The at least one vertically facing sensor 574 is mounted to the frame in any suitable manner so as to sense the vertically facing target 540 to establish a location of the mock carrier jig 510B relative to the substrate transport apparatus 501 in, for example, the Y or R directions. The at least one vertically facing target 540 is mounted to the substrate transport apparatus 501 in any suitable manner so as to be sensed by the vertically facing sensor 583 to establish a location of the mock carrier jig 510B relative to the substrate transport apparatus 501 in, for example, the Y or R directions. In the aspect illustrated in FIG. 5B, the sensor 583 is facing downwards and the target 540 is facing upwards but in other aspects the sensor 583 may be facing upwards and the target 540 may be facing downwards. The at least one laterally facing sensor 582 is mounted to the frame in any suitable manner so as to sense the laterally facing target 520 (e.g., on a respective end effector 502) to establish a location of the mock carrier jig 510B relative to the respective end effector 502 in, for example, the Z direction. Where the substrate transport apparatus 501 includes more than one end effector each end effector may include a respective target configured to be sensed by the laterally facing sensor 582. The sensors 581-583 of the machine vision system 530B are coupled to any suitable controller (such as controller 11091) so that the motor encoder positions of the substrate transport apparatus 501 are read/determined by the controller 11091 as the sensors 581-583 sense the respective targets 540-542 for teaching the location of the mock carrier jig 510B (and the location of the load port module 11005 via the mock carrier jig 510B kinematically located on the load port module 11005) to the substrate transport apparatus 501.

Referring to FIGS. 6A-6D, the mock carrier jig will be described with respect to mock carrier jig 510B; however, it should be understood that the mock carrier jig 510A is substantially similar but for targets being positioned within the interior chamber 551 rather than the sensors. The mock carrier jig 510B has, in one aspect, the shape and size of a 25 substrate holder carrier (i.e., a substrate cassette that has 25 substrate holding positions stacked one above the other). The interior chamber 551 of the mock carrier jig is configured with at least one mock workpiece holding slot 610, 611, 612, each of which corresponds to and represents a different workpiece holding slot of a workpiece carrier (such as carrier 11050) at the load port module 11005, and defines a different one of the load station reference location 11005L. For example, the at least one mock workpiece holding slot 610, 611, 612 is positioned adjacent either an upper surface 615 of the interior chamber 551 and/or adjacent the lower surface 616 of the interior chamber 551. As will be described in greater detail below, the at least one mock workpiece holding slot 610, 611, 612 is configured to hold one or more of the removable module jig 600 and a verification wafer or substrate 699. Here, each mock workpiece holding slot 610, 611, 612 holds a respective one of the removable module jig 600 and the verification substrate 699. In some aspects, the interior chamber 551 of the mock carrier jig is configured with one mock workpiece holding slot 610 configured to hold the removable module jig 600 and at least two mock workpiece holding slots 611, 612, positioned adjacent one or both of the upper surface 615 and the lower surface 616. The mock workpiece holding slot 611 corresponds with (e.g., has a height along the Z axis from the kinematic datum of the load port module that is the same as) the number 1 slot (substrate holding position) of a conventional 25 substrate holder carrier and mock workpiece holding slot 612 corresponds with (e.g., has a height along the Z axis from the kinematic datum of the load port module that is the same as) the number 25 slot (substrate holding position) of the conventional 25 substrate holder carrier.

Figure 6F:
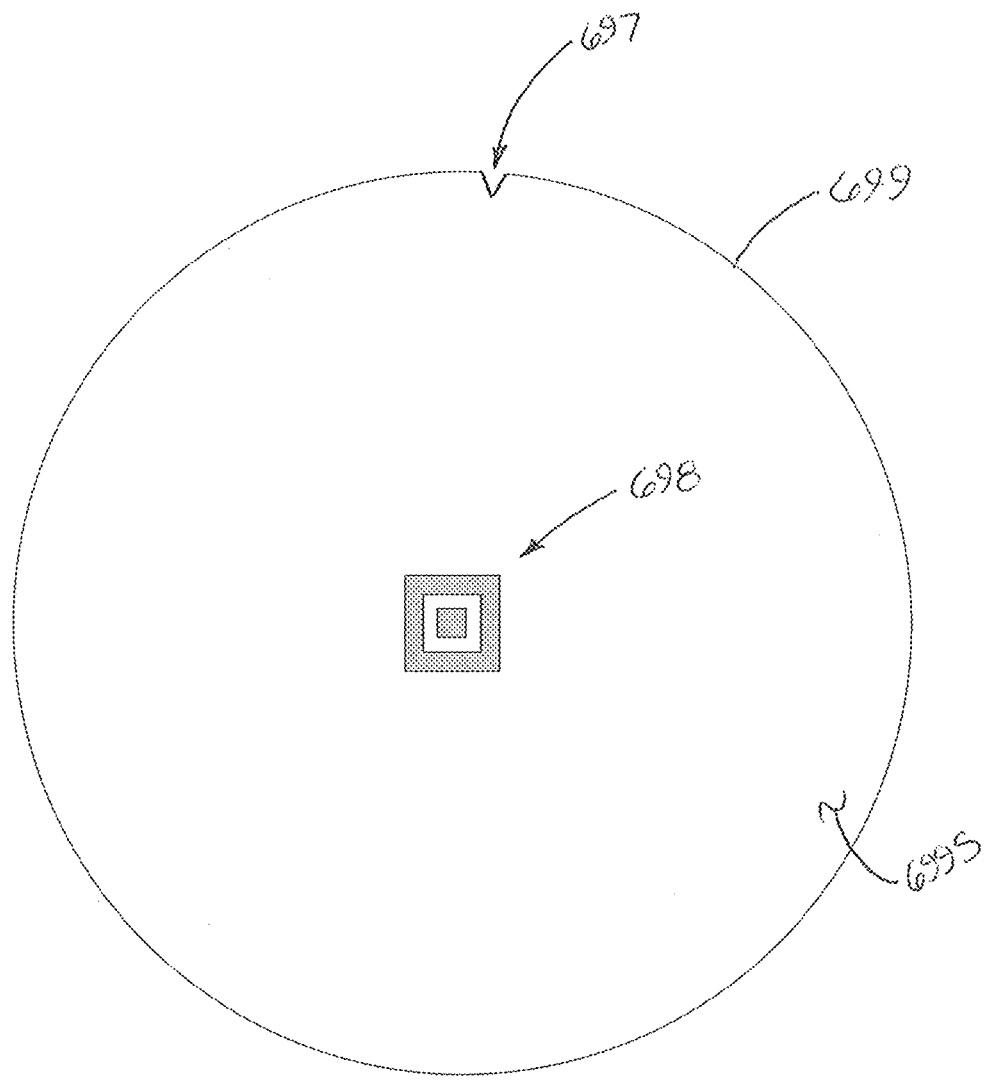
FIG. 6F is a schematic illustration of a portion of the automatic teach apparatus of FIGS. 5A and 5B in accordance with the aspects of the present disclosure.

The sensors 581-583 are located in at least a central part of the interior chamber 551 (e.g., between the upper surface 615 and the lower surface 616 so that the mock workpiece holding slot(s) 610, 611 is/are located one or both above or below the sensors 581-583. Positioning of the sensors 581-583 in the central part of the interior chamber 551 provides for insertion of the end effector 420A, 420B between (or above or below) the mock workpiece holding slot(s) 610, 611, 612. The sensors 581-583 are illustrated as being coupled to cantilevered mounts that extend from walls of the interior cavity 551 but in other aspects the sensors 581-583 are mounted and coupled to the frame within the interior cavity 551 in any suitable manner. In this aspect the mock carrier jig 510B includes at least one substrate placement verification sensor(s) 682, 683 positioned within the interior chamber 551 to sense/detect a position of the verification substrate 699 positioned (either held on the end effector 502 or placed on substrate supports of the frame 550) in a respective one of the mock workpiece holding slot(s) 610, 611, 612. A field of view of the substrate placement verification sensor(s) 682, 683 extends along the Z axis. Referring also to FIG. 6F, the verification substrate 699 is otherwise the same as a conventional substrate or teaching substrate and includes one or more targets 698 disposed on at least one of the major (e.g., top or bottom) surfaces of the verification substrate 699, where the target(s) 698 have a known predetermined relationship with a center of the verification substrate 699 (and in some aspects an alignment fiducial 697 of the verification substrate 699). In one aspect target(s) 698 are located at a center of the verification substrate 699.

In some aspects, the mock carrier jig 510B includes an inclinometer (or inclination sensor) sensor 681 configured to sense/determine an inclination of the mock carrier jig 510B kinematically seated/located on the load port module 11005 (see, e.g., FIG. 1) relative to one or more of the X-Y (or θ-R) plane and the X-Z (or θ-Z) plane. In the aspect illustrated in FIGS. 6A-6D the sensors 581-583, 682, 683 are any suitable camera configured for image analysis recognition (such as through coupling with a suitable controller such as controller 11091) of the targets 540-542, 698; however, in some aspects the laterally facing sensor 582 may be a through-beam sensor configured to sense an edge of the end effector 502. The camera may be a charge coupled device (CCD) camera, complementary metal-oxide-semiconductor (CMOS) camera, time-of-flight camera, stereo/binocular camera or any other suitable camera configured to sense/detect a position of the targets as described herein.

The mock carrier jig 510B includes any suitable power connection 685 for connecting the onboard sensors (and other suitable electronic circuitry) of the mock carrier jig 510B to any suitable electrical power source (such as a power source of the substrate processing tool or a mains/line power supply of substrate processing facility); however, in other aspects the onboard sensors (and other suitable electronic circuitry) of the mock carrier jig 510B may be powered by a battery located onboard the mock carrier jig 510B and carried by the frame 550. The mock carrier jig 510B includes any suitable communication connection 686 (e.g., Ethernet connection, fiber-optic connection, coaxial connection, or any other suitable physical transmission medium) configured to couple the mock carrier jig 510B to the controller (such as controller 11091) to effect reading/detecting motor encoder positions corresponding to sensed targets/substrates; however, in other aspects communication between the mock carrier jig 510B and the controller 11091 may be any suitable wireless communications. In one aspect, cables from, e.g., the power source and controller 11091 are manually coupled to the communication connection 686 and power connection 685 to couple the mock carrier jig 510B to the power source and controller 11091; while in other aspects the load port module includes power and communication coupling that automatically couple to the communication connection 686 and power connection 685 upon placement of the mock carrier jig 510B to the load port module 11005.

It is noted that, in some aspects, mock carrier jig 510A does not include onboard sensors/electronics (as the sensors are located on and move with the substrate transport apparatus 501 (see FIG. 5A). Here, as described above, to determine/sense the inclination of the mock carrier jig 510A, targets 521, 522 are located one above the other in a common (i.e., the same) plane 598 with a known spatial relationship so that when sensed by the sensors 571, 572 onboard the substrate transport apparatus 501 an offset (e.g., rotation) of one target 521, 522 relative to the other target 521, 522 is determined by the controller 11091 in each of the X-Y (or θ-R) plane and the X-Z (or θ-Z) plane to determine the inclination/rotation of the mock carrier jig 510A kinematically seated on the load port module 11005. In other aspects, the mock carrier jig 510A includes infrared communications (which are coupled to controller 11091 and powered with wired or wireless connections in a manner similar to that of mock carrier jig 510B) for communicating with the removable module jig 600, where the removable module jig 600 (such as with an inclination sensor) is employed to determine at least an inclination of the mock carrier jig 510A.

Figure 7:
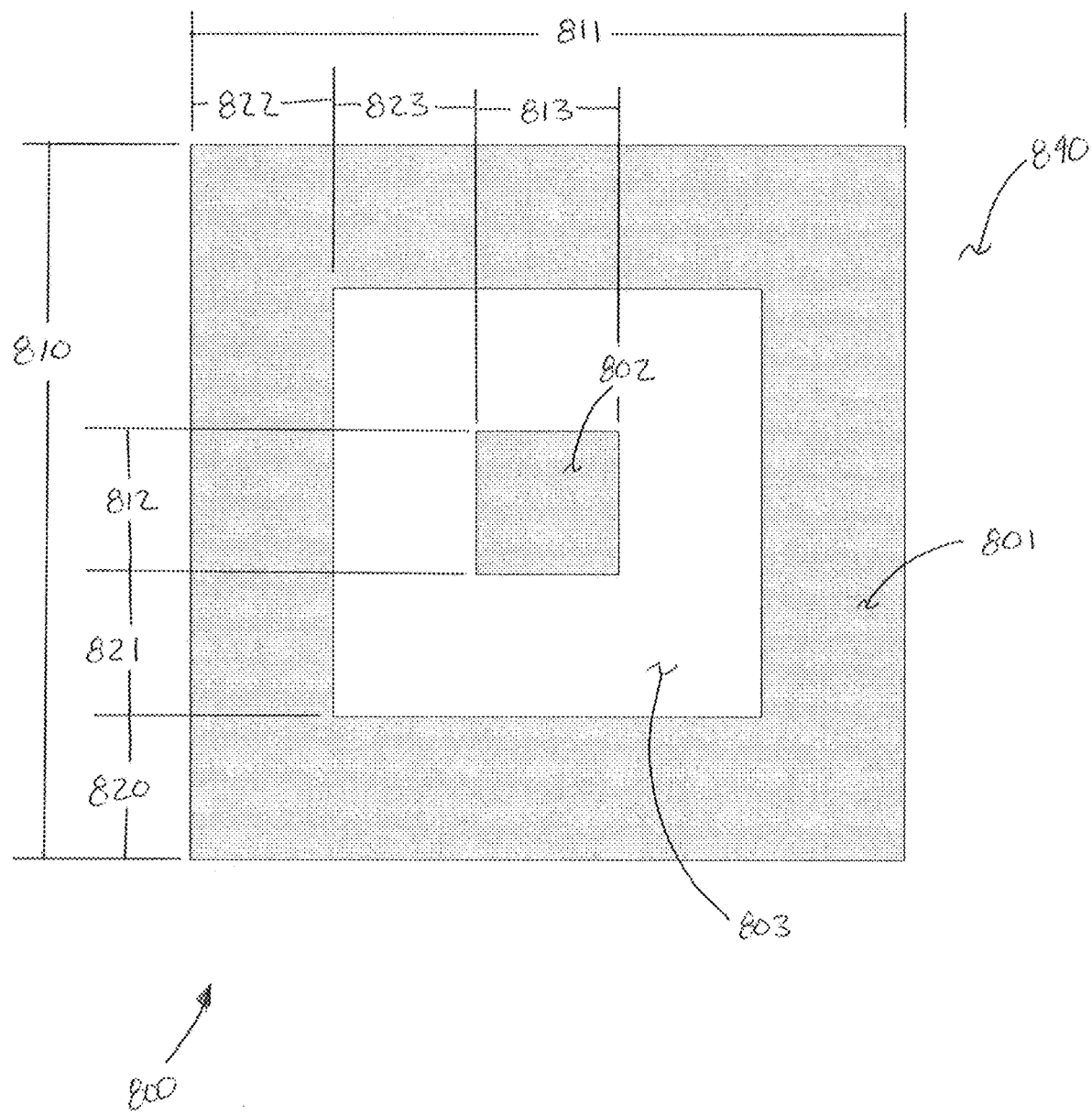
FIGS. 7, 7A, and 7B are schematic illustrations of exemplary targets of the automatic teach apparatus of FIGS. 5A and 5B in accordance with the aspects of the present disclosure.

For exemplary purposes only, referring to FIG. 7, the targets described herein are substantially similar to and will be described with respect to target 800. The target 800 (which may be referred to as a teach feature) is any characteristic within the substrate transport apparatus workspace that can be identified through imaging by the vision system 530A, 530B. The target 800 is a designed mark that is engineered into a component of the substrate processing apparatus, an image of a physical feature of the substrate processing apparatus, or a combination thereof. For exemplary purposes the target 800 is a designed mark that has a substantially square shape for illustrative purposes only and in other aspects the target 800 may have any suitable geometric configuration (e.g., triangular, rectangular, hexagonal, octagonal, etc.). In one aspect, the target 800 is flush with a surface on which the target 800 is disposed while in other aspects, the target 800 is or includes one or more of holes (blind holes or through holes having any suitable shape including, but not limited to round, circular, and pyramidal, or a series of slots or "pin" holes sized for suitable imaging resolution with the imaging sensor described herein), slots (having any suitable shape including but not limited to hexahedron), and protruding structures of similar configuration (projecting from surfaces) that have predetermined features to inform and resolve the target image and its position in the teaching images. In one or more aspects, the target 800 features are bossed, or formed in calibrated relief in the arm structure, and/or the target 800 (and its features) are integral features of the arm structure, such as calibrated features of the end effector structure that also serve as target(s) (e.g., a corner of the end effector, depth features of the end effector, etc.). In the examples illustrated herein, the target 800 has a predetermined indicia embodying a predetermined characteristic, describing at least one target plane (e.g., Z-X(or θ) plane, the R(or Y)-X(or θ) plane, and Z-Y(or R) plane), imaged by the fixed imaging sensor(s) 581-583 (FIG. 5B), the moving imaging sensors 571-574 (FIG. 5A), or the moving imaging sensors 750-752 (FIGS. 8A-8C) so that the distance offset(s) ΔX, Δθ, ΔY, ΔR, ΔZ (see FIG. 10) resolve(s) in part a reference plane (e.g., of the load station reference location 11005L or the station fixture reference location 1199) of the load port module 11005 or station fixture 870, 11010, 11030 based on the image. For exemplary purposes, the target has an outer region 801 and an inner region 802 that are optically separated from one another by an intermediate region 803. For example, the outer region 801 and inner region 802 each have a different shade of color than the intermediate region 803 (i.e., contrasting colors such as black and white) so that a predetermined spatial relationship between the inner region 802 and outer region 801 as well as the spatial properties of each of the inner region 802 and outer region 801 themselves are optically identified/sensed by the sensors of the automatic teach apparatus 500. For example, the outer region 801 of the target has length of 810, width of 811 and thickness/distance 820, 822 (where the length, width, and thickness have any suitable unit of measure such as inches or millimeters). The inner region 802 has length 812 and width/distance 813 and is separated from the outer region 801 by thickness/distance 821, 823 of the intermediate region 803. The target 800 is placed on any suitable background 840 so that the target 800 is optically separated (i.e., contrasted from) the background. For example, in one aspect, the intermediate region 803 and the background 840 are white and the inner region 802 and outer region 801 are black; while in other aspects, the intermediate region 803 and the background 840 are black and the inner region 802 and outer region 801 are white.

In the examples described herein, the transport arm 11013TA has more than one target 540-542 (referred to herein as arm targets) that are imaged by the fixed imaging sensors 581-583. Each of the targets 540-542 characterizes different offset aspects. Each of the different offset aspects (e.g., the target and offset aspect characterized thereby) correspond, distinct from each other, to different respective drive axis pairs (e.g., X(or θ)-Y(or R) drive axes, Z-X(or θ) drive axes, Z-Y(or R) drive axes) effecting at least one degree of freedom motion of the transport arm 11013TA. Each of the drive axis pairs correspond to different respective planes Z-X(or θ) plane, the R(or Y)-X(or θ) plane, and Z-Y(or R) plane of the of the load port module 11005, so that each different offset aspect, corresponding to the different drive axis pairs, is resolved by a separate image of the respective target, and the distance offset ΔX, ΔθG, ΔY, ΔR, ΔZ is effected in entirety by combination (or superposition, or sequence) of the resolved different offset aspect as described herein. As may be realized, a first of the different drive axis pair (e.g., X(or θ)-Y(or R) drive axes, Z-X(or θ) drive axes, Z-Y(or R) drive axes) that correspond to a first of the arm targets 540-542, shares a drive axis (X, θ, R, Y, Z) with a second of the different drive axis pair (e.g., X(or θ)-Y(or R) drive axes, Z-X(or θ) drive axes, Z-Y(or R) drive axes) that correspond to a second one of the arm target 540-542, wherein resolution of a second of the different offset aspect (with the second arm target) confirms or serves to refine part of a first offset aspect with respect to a load station reference axis (X, θ, Y, R, Z) corresponding to the shared drive axis and resolved with the first arm target as will be described herein.

In one or more aspects, the transport arm 1103TA has more than one of the arm target 540-542 disposed so that each arm target 540-542, imaged by the fixed imaging sensor(s) 581-583, separately characterizes different offset aspects, so that a first of the arm target 540-542 characterizes a first offset aspect and a second of the arm target 540-542 characterizes a second offset aspect different from the first offset aspect. The different characterization defined respectively by the first and second arm target 540-542 are arranged so that resolution of the second of the different offset aspect (separately resolved with the second arm target 540-542) confirms or serves to refine part of the first offset aspect, with respect to a load station reference axis X, θ, Y, R, Z, where the first offset aspect being separately resolved with the first arm target 540-542. In one or more aspects, the transport arm 11013TA has more than one of the arm target 540-542 disposed so that each arm target 540-542, imaged by the fixed imaging sensor(s) 581-583, characterizes different offset aspects, each of which (e.g., the target 540-542 and offset aspect characterized thereby) correspond (distinct from each other) to different respective at least one drive axis X, θ, Y, R, Z effecting at least one degree of freedom motion of the transport arm 11013TA, where the at least one drive axis X, θ, Y, R, Z corresponds to different respective reference axis X, θ, Y, R, Z of the load port module 11005, so that each different offset aspect (corresponding to the different at least one drive axis X, θ, Y, R, Z) is resolved by separate image of the respective target 540-542, and offset resolution is effected in entirety by combination (or sequence) of the separately resolved different offset aspect.

Similarly, the station fixtures (such as station fixtures 870, 11010, 11030) each have more than one target 871, 1120, 1201, 1202 (see FIGS. 8D and 11-12B) (referred to herein as station targets) that are imaged by the movable imaging sensors 750-752 of the removable module jig 600. Each of the targets 871, 1120, 1201, 1202 characterizes different offset aspects. Each of the different offset aspects (e.g., the target and offset aspect characterized thereby) correspond, distinct from each other, to different respective drive axis pairs (e.g., X(or θ)-Y(or R) drive axes, Z-X(or 91) drive axes, Z-Y(or R) drive axes) effecting at least one degree of freedom motion of the transport arm 11013TA. Each of the drive axis pairs correspond to different respective planes Z-X(or θ) plane, the R(or Y)-X(or θ) plane, and Z-Y(or R) plane of the of the respective station fixture, so that each different offset aspect, corresponding to the different drive axis pairs, is resolved by a separate image of the respective target, and the distance offset ΔX, Δθ, ΔY, ΔR, ΔZ is effected in entirety by combination (or superposition, or sequence) of the resolved different offset aspect as described herein. As may be realized, a first of the different drive axis pair (e.g., X(or θ)-Y(or R) drive axes, Z-X(or θ) drive axes, Z-Y(or R) drive axes) that correspond to a first of the station target 871, 1120, 1201, 1202, shares a drive axis (X, θ, R, Y, Z) with a second of the different drive axis pair (e.g., X(or θ)-Y(or R) drive axes, Z-X(or θ) drive axes, Z-Y(or R) drive axes) that correspond to a second one of the station target 871, 1120, 1201, 1202, wherein resolution of a second of the different offset aspect (with the second station target) confirms or serves to refine part of a first offset aspect with respect to a station fixture reference axis (X, θ, Y, R, Z) corresponding to the shared drive axis and resolved with the first station target as will be described herein.

In one or more aspects, the station fixture 870, 11010, 11030 has more than one of the station target 871, 1120, 1201, 1202 disposed so that each station target 871, 1120, 1201, 1202, imaged by the movable imaging sensor(s) 750-752, separately characterizes different offset aspects, so that a first of the station target 871, 1120, 1201, 1202 characterizes a first offset aspect and a second of the station target 871, 1120, 1201, 1202 characterizes a second offset aspect different from the first offset aspect. The different characterization defined respectively by the first and second station target 871, 1120, 1201, 1202 are arranged so that resolution of the second of the different offset aspect (separately resolved with the second arm target 540-542) confirms or serves to refine part of the first offset aspect, with respect to a load station reference axis X, θ, Y, R, Z, where the first offset aspect being separately resolved with the first station target 871, 1120, 1201, 1202. In one or more aspects, the station fixture 870, 11010, 11030 has more than one of the station target 871, 1120, 1201, 1202 disposed so that each station target 871, 1120, 1201, 1202, imaged by the movable imaging sensor(s) 750-752, characterizes different offset aspects, each of which (e.g., the target 871, 1120, 1201, 1202 and offset aspect characterized thereby) correspond (distinct from each other) to different respective at least one drive axis X, θ, Y, R, Z effecting at least one degree of freedom motion of the transport arm 11013TA, where the at least one drive axis X, θ, Y, R, Z corresponds to different respective reference axis X, θ, Y, R, Z of the station fixture 870, 11010, 11030, so that each different offset aspect (corresponding to the different at least one drive axis X, θ, Y, R, Z) is resolved by separate image of the respective station target 871, 1120, 1201, 1202, and offset resolution is effected in entirety by combination (or sequence) of the separately resolved different offset aspect.

Referring to FIGS. 6A, and 8A-8C, the removable module jig 600 that is ported by the mock carrier jig 510A, 510B in one of the mock workpiece holding slots 610, 611, 612 is employed within a substrate processing apparatus/tool station to facilitate alignment of substrate holding stations (as described above) of the substrate processing apparatus/tools station. The removable module jig 600 includes a base or frame 710 and a sensor housing 720. The frame 710 of the removable module jig 600 (and hence the at least one movable (via being carried by the removable module jig 600) imaging sensor 750-752) is held in the mock carrier jig 510A, 510B and is arranged for carriage and transport to and from the mock carrier jig 510A, 510B and each station fixture 870, 11010, 11030 of the substrate processing apparatus with the end effector 420A, 420B, 502. For example, the frame 710 has a shape and size at least partially corresponding to a shape and size of the substrates S (illustrated in dashed lines in FIG. 8C for size and shape comparison with the frame 710) held in the substrate cassettes 11050 and processed by the substrate processing apparatus/tool station. In the example, shown in FIG. 8A, the frame has a radiused portion 710R and a truncated portion 710T. The radiused portion 710R has a radius corresponding to the substrates held in the substrate cassettes 11050 and processed by the substrate processing apparatus/tool station. The truncated portion 710T truncates a disc shape (similar to the disc shape of the substrate S) that would otherwise be formed by the radiused portion so that one or more sensors of the removable module jig 600 are unobstructed by the frame 710; however, in other aspects the frame 710 may not be truncated and have a disc shape (similar to/ the same as that of the substrate S) and includes suitable apertures (similar to aperture 736 described below) corresponding to the one or more sensors so the one or more sensors are unobstructed by the frame 710. The frame 710 is constructed of any suitable material including, but not limited to, carbon fiber, metals, ceramics, etc.

The at least one movable imaging sensor 750-752 has at least one movable imaging sensor 750-752 mounted to the frame 710 so as to be disposed on the end effector 420A, 420B, 502 with the frame 710 carried by the end effector 420A, 420B, 502, in a predetermined position with respect to the predetermined end effector reference location 479. The at least one movable imaging sensor 750-752 comprises more than one movable imaging sensors 750-752, each with a different predetermined pose so that an image sensor plane (see FIGS. 8A-8F) of each respective movable imaging sensor 750-752 corresponds to different respective holding station reference plane (e.g., the X(or θ)-Z plane, the R(or Y)-X(or θ) plane, and the Z-Y(or R) plane), and the at least one station target 871, 1120, 1201, 1202 has an orientation corresponding to each respective movable imaging sensor 750-752 so that each movable imaging sensor forms with a respective station target different couples corresponding to and comprising the respective fixed image sensor 750-752 and the respective station target 871, 1120, 1201, 1202. For example, the frame 710 has a justification feature 710F that justifies the frame 710 (and the components mounted to the frame such as the at least one movable imaging sensor 750-752) in a predetermined position relative to the end effector reference location 479 (see FIG. 4A) with the removable module jig 600 seated on the end effector 420A, 420B. The justification feature 710F of the frame 710 has an engagement feature (such as a bottom and/or peripheral edge of the frame 710, an alignment fiducial, kinematic locating features, etc., or any combination thereof) that engages the end effector 502, 420A, 420B and justifies the at least one movable imaging sensor 750-752 of the removable module jig 600 in a predetermined pose with respect to the predetermined end effector reference location 479. The justification feature 710F is justified relative to the end effector reference location 479 in any suitable manner (e.g., within the mock carrier jig 510A, 510B, such as by imaging the justification feature 710F to determine an orientation of the removable module jig 600 relative to the end effector or mechanically with kinematic locating features) so that when seated on the end effector the orientation of the at least one movable imaging sensor 750-752 is known relative to the end effector reference location 479 in the six degrees of freedom.

The sensor housing 720 is coupled to the frame 710 in any suitable manner (or is integrally formed with the frame in any suitable manner) so that the sensor housing 720 and frame 710 are transported as a single unit. The sensor housing 720 has any suitable shape and size (i.e., the sensor housing 720 need not be the same shape as the frame 710) for housing one or more imaging sensors 750-752 configured to detect one or more respective targets of the substrate holding stations, as will be described herein, where the sensor 750-752 and the respective targets for sensor/target pairs in a manner similar to that described above with respect to the mock cassette jig 510A-510B. For exemplary purposes, the sensor housing 720 includes a boom, projection, or probe portion 720B (referred to herein as probe portion 720B) that projects from the front of the frame 710. The probe portion includes one or more sensors 750, 751 (and one or more illumination source 750L, 751L) as described herein and is configured to be admitted/inserted (e.g., through advancement of the end effector in an extension direction and/or robot (R, θ, X, Y, Z) motions) into spaces of the semiconductor tool station (such as those described herein), including those spaces that may be inadmissible to certain substrate configurations, for detecting/sensing targets as described herein. The one or more sensors 750-752 are any suitable optical sensors, including but not limited to cameras (such as those described herein), configured for image recognition (with any suitable image processing algorithms/processes) of the targets as described herein. In the aspect illustrated in FIGS. 8A-8C the one or more sensors 750-752 includes a forward facing sensor 751, and two downward facing sensors 750, 752 (although in other aspects the sensors 750, 752 may be upward facing for sensing targets above the sensors in a manner substantially similar to that described herein with respect to the downward facing sensor sensing targets positioned below the sensors). One of the downward facing sensors is located adjacent an edge of the sensor housing 720 (such as on the probe portion 720B) and may be referred to as edge sensor 750 while another of the downward facing sensors is located substantially at a center 798 of the frame 710 (e.g., at a center of the radiused portion 710R at a location that corresponds to a center of the substrate S) and may be referred to as a center sensor 752. The frame 710 includes an aperture 736 through which a field of view of the center sensor 752 extends so that the center sensor 752 is unobstructed by the frame 710. In other aspects, there may be more or less than three sensors. In one or more aspects, the removable module jig 600 includes an illumination source 750L-752L (e.g., any suitable light) for each sensor 750-752 (or at least one sensor), where the illumination source 750L-752L is configured to illuminate a target being sensed/detected by a respective sensor image 750-752. As may be realized, the sensor housing 720 includes any suitable onboard memory 733 and processors 734 coupled to the sensors 750-752 and configured to effect operation of the sensors 750-752 as described herein.

The removable module jig 600 is configured to communicate with the controller 11091 in any suitable manner so that the motor encoder positions of the substrate transport apparatus 501 are read/determined by the controller 11091 as the sensors 750-752 sense the respective targets of the substrate processing apparatus/tool station as described herein. In one or more aspects, the removable module jig 600 includes an infrared transceiver 777 (e.g., transmitter/receiver) and the mock carrier jig 510A, 510B includes a corresponding infrared transceiver (e.g., transmitter/receiver) 647 configured to receive communications from and transmit communications to the removable module jig 600 through the infrared transceiver 777. Here, sensor data is transferred to controller 11091 from the removable module jig 600 through the mock carrier jig 510A, 510B. In other aspects the removable module jig 600 includes any suitable wireless communication module (e.g., Bluetooth®, ZigBee®, or other suitable radio frequency transmitter/receiver/transceiver) for communicating with the mock carrier jig 510A, 510B or substantially directly with the controller 11091.

The removable module jig 600 includes any suitable onboard battery power source 735 configured to provide power to the sensors 750-752, memory 733, processors 734, and any other onboard electronics (such as any suitable display 778 and/or inclination sensor 779) of the removable module jig. In one aspect, the display 778 is provided to present any suitable information to a user of the automatic teach apparatus 500. The display may provide suitable information including but not limited to one or more of remaining battery life and a power status (e.g., on/off) of the removable module jig 600. The inclination sensor 779 is provided to sense/detect an inclination of a substrate seating surface of a substrate holding station and/or a handoff of the removable module jig 600 from the end effector 502 to the substrate seating surface as will be described herein, such as when the removable module jig 600 is placed at the substrate holding station.

Referring now to FIGS. 3, 6A-6E, 9A, and 10 an exemplary teach method employing the automatic teach apparatus 500 will be described, where the controller 11091 is configured to move the transport arm 11013TA and transport the frame 710, with the at least one movable imaging sensor 750-752, to a station teach position relative to the station fixture (e.g., one or more of station fixtures 870, 11010, 11030) and image, with the at least one movable imaging sensor 750-752 on the end effector 420A, 420B, 502, at least one station target 871, 1120, 1201, 1202 having a predetermined pose relative to the predetermined holding station reference location 1199 so as to resolve station offset between the predetermined end effector reference location 479 and the predetermined holding station reference location 1199 based on the at least one station target 871, 1120, 1201, 1202 imaged with the at least one movable imaging sensor 750, 752. The method will be described with respect to mock carrier jig 510B but it should be understood that the method is employed with mock carrier jig 510A in a substantially similar manner to that described herein for mock carrier jig 510B. In accordance with the aspects of the present disclosure, the mock carrier jig 510B is coupled to the load port module 11005 (FIG. 9, Block 901). Coupling the mock carrier jig 510B to the load port module 11005 may be performed in any suitable manner such as manually or through suitable automation as described herein. The mock carrier jig 510B is coupled to the load port module so as to be kinematically located at the load port module 11005 and engaged to a BOLTS (Box Opener/Loader to Tool Standard as specified by SEMI standards) interface in a manner similar to that of a substrate cassette 11050 to load port module 11005 coupling. The power connection 685 and communication connection 686 are manually coupled to the mock carrier jig 510B (or coupled through automation as described herein).

As may be realized, the components of the substrate processing apparatus have baseline spatial relationships as determined from, for example, a computer aided drafting (CAD) model of the substrate processing apparatus. The controller 11091 commands the transport robot 11013 to traverse in one or more of the X, Y, R, θ, and Z directions to the baseline spatial position of the load port module 11005 whose location is being taught to the transport robot 11013. The transport robot 11013 is commanded to move relative to the load port module 11005 to position the target 800 within the field of view FOV, FOV1, or FOV2 of the vision system (see FIG. 10). In the example shown in the Figs. the forward facing target 542 on the transport arm 11013TA is brought into the field of view FOV of the rearward facing sensor 581 (see FIGS. 6C and 10, where FIG. 10 generically represents image frames captured by any one of the sensors described herein). The rearward facing sensor 581 may be referred to as an X-Z or θ-Z plane camera/sensor. The forward facing target 542 is sensed by the rearward facing sensor (FIG. 9A, Block 905) and the controller 11091 records the location of the sensed forward facing target 542 based on encoder data from motor axes of the transport robot 11013. The recorded location of the sensed forward facing target 542 is or is used to determine a teach point along a robot trajectory or path that the transport robot 11013 traverses (or travels/moves along) to perform any suitable desired pick and place transfer operations. A teach point is a location defined in the transport robot 11013 reference frame (i.e., coordinate system of the motor axes) that allows the transport robot 11013 to return to predetermined locations to perform, for example, the pick and place transport operations. One or more teach features/targets may be employed/sensed to compute a complex trajectory/path of the transport robot 11013 and to navigate the transport robot 11013 around objects within the substrate processing apparatus.

As may be realized, each image frame (see FIG. 10) obtained by the rearward facing sensor 581 sets a pixel-to-millimeter (or inch) reference factor using the detected target 542. Here, the target 542 (generically represented as target 800 in FIG. 10) has dimensions (e.g., in millimeters and/or inches) that are known to the controller 11091. The pixel size of the rearward facing sensor 581 is also known to the controller 11091 such that the controller 11091 determines the relationship between the pixel size and the known dimensions of the target 800 to determine the pixel-to-millimeter (or inch) reference factor for effecting the teaching operations described herein.

Figure 10:
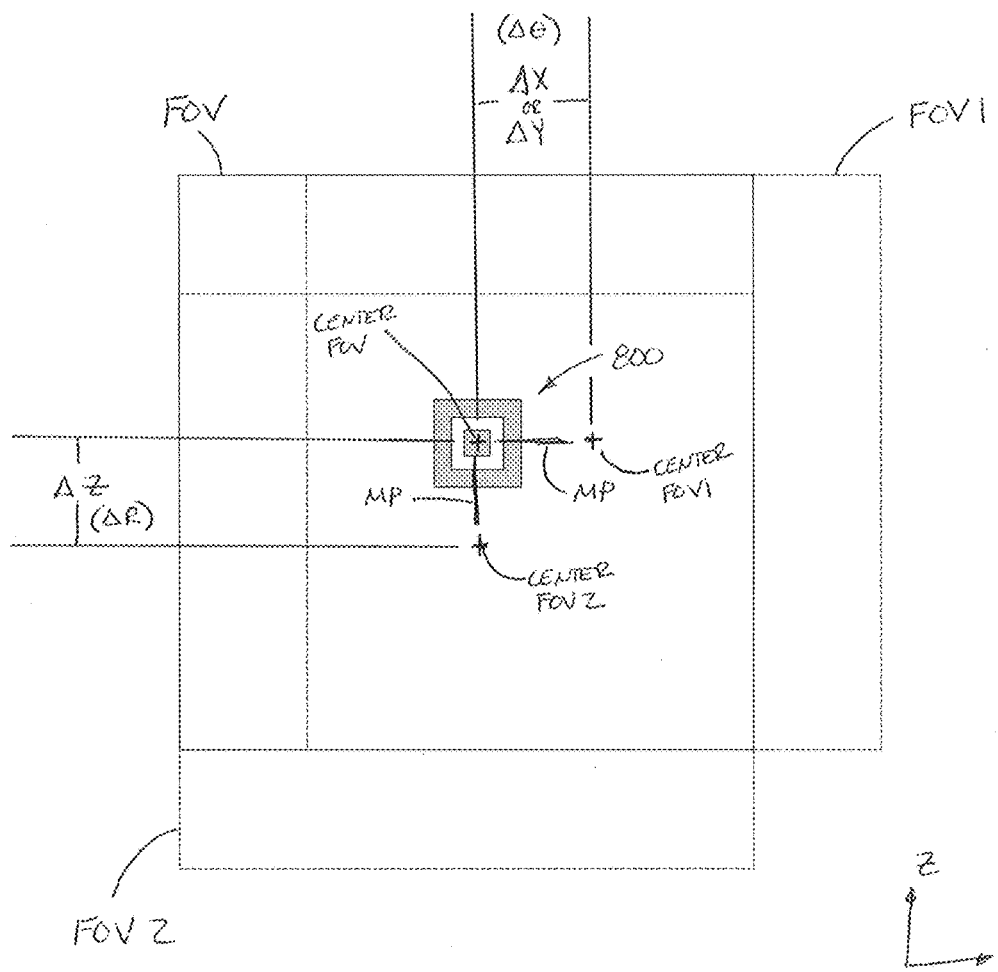
FIG. 10 is a schematic illustration of sensor fields of view relative to a target in accordance with aspects of the present disclosure.
Figure 13:
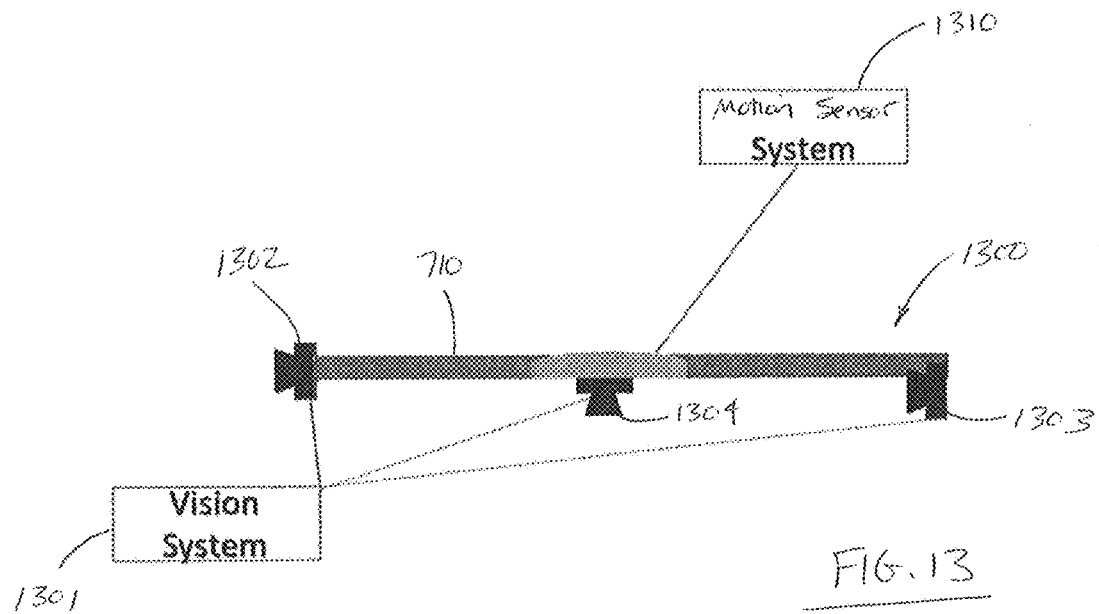
FIGS. 13, 14, 15, and 16 are schematic illustrations of a portion of the automatic teach apparatus of FIGS. 5A and 5B in accordance with the aspects of the present disclosure.
Figure 14:
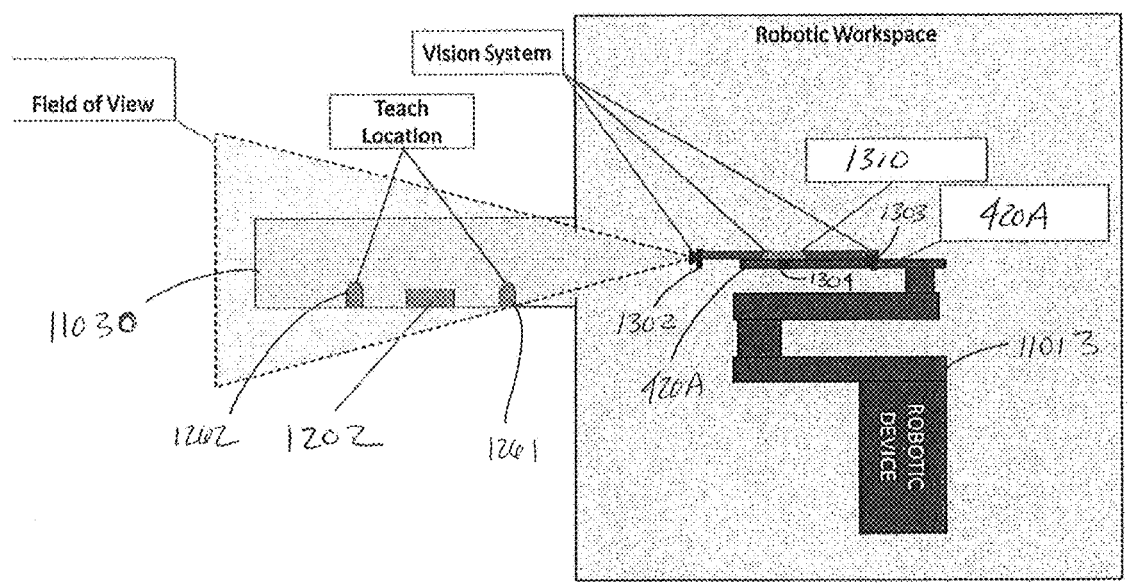
Figure 15:
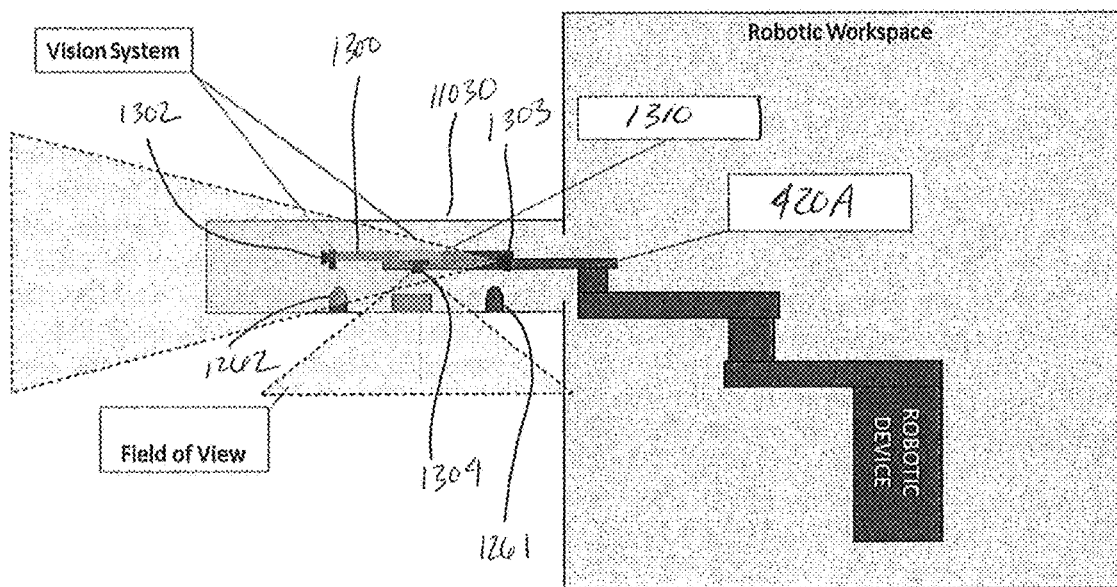
Figure 16:
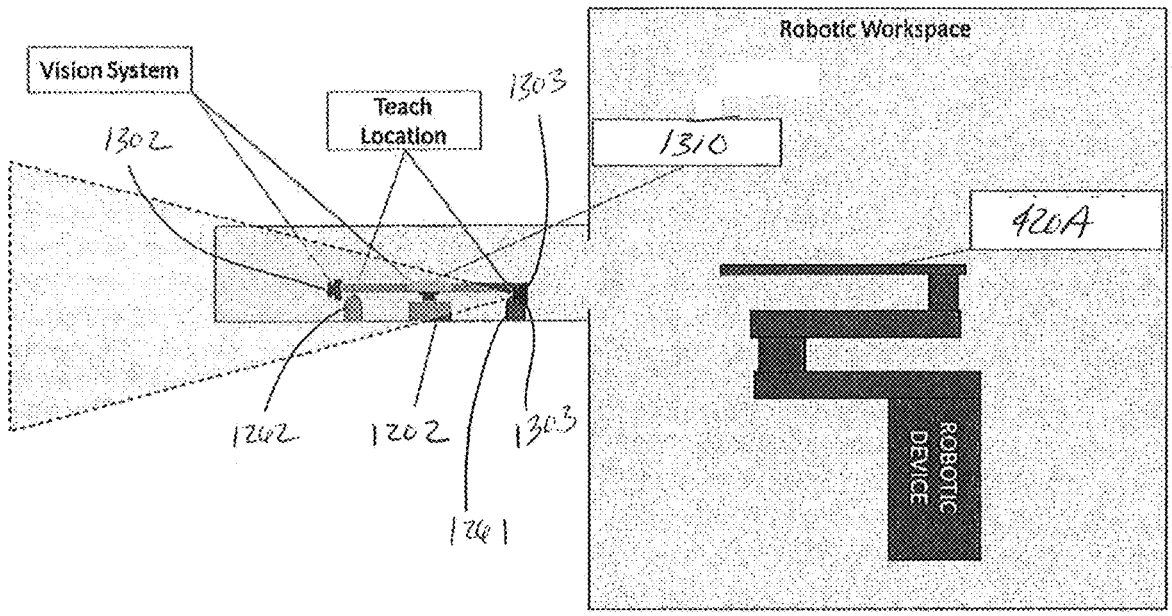
Figures 17A, 17B:
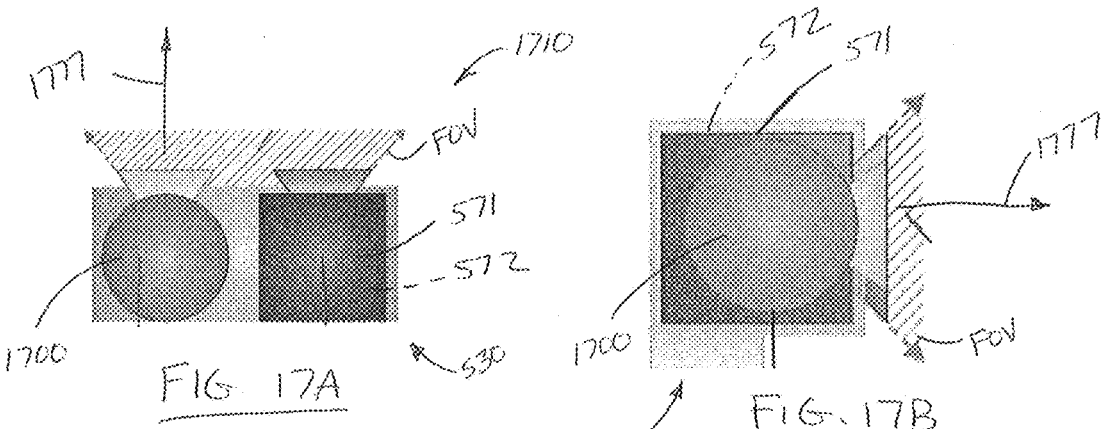
FIGS. 17A, 17B, 18A, 18B are schematic illustrations of a portion of the automatic teach apparatus of FIGS. 5A and 5B in accordance with aspects of the present disclosure.
Figure 18A:
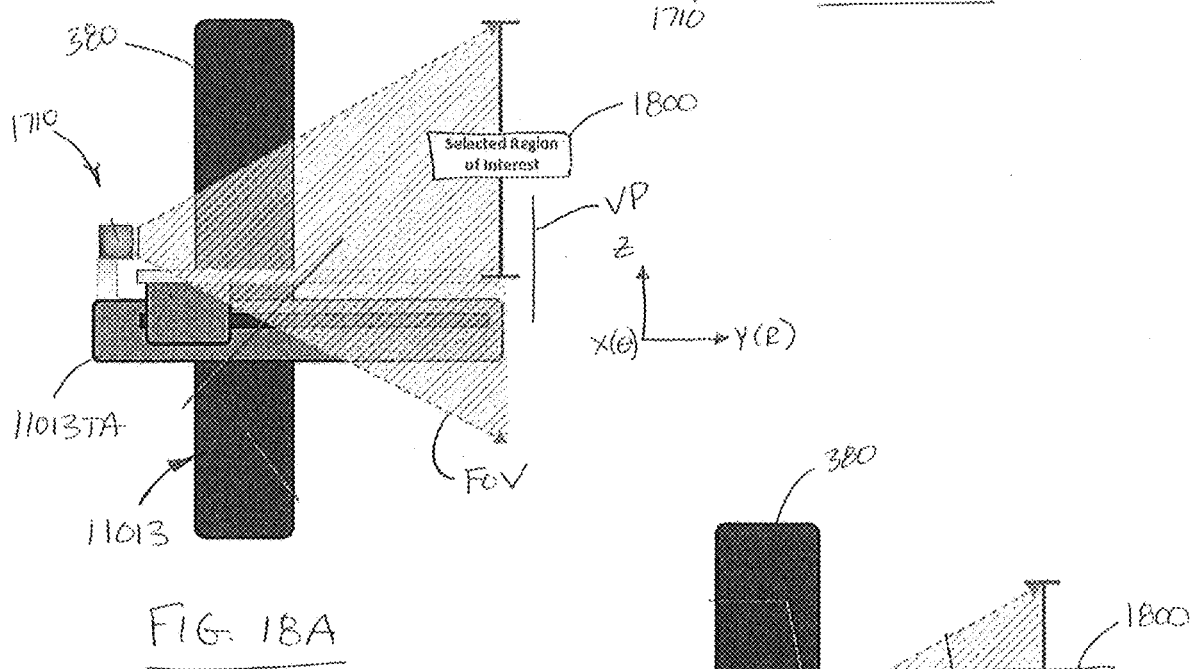
Figure 18B:
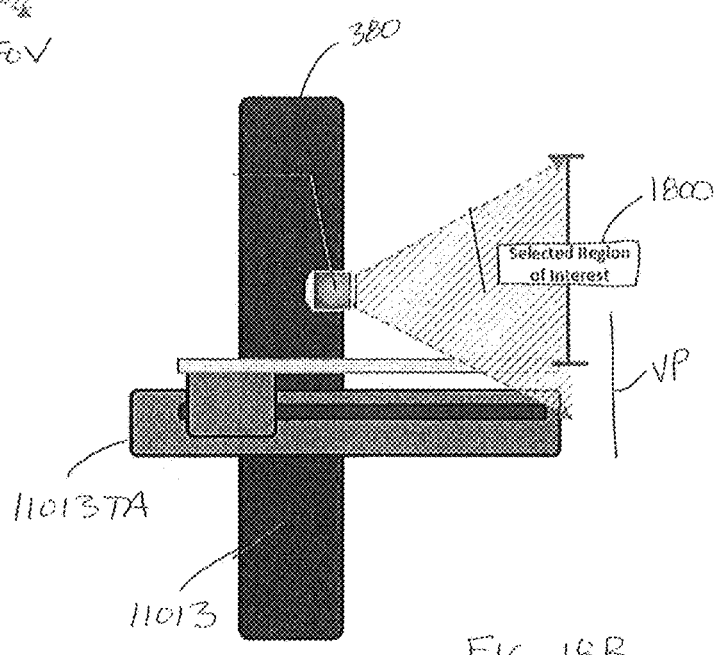

Sensing the target 542 (illustrated generically as target 800 in FIG. 10) includes moving the transport robot 11013 to the baseline position of the load port module 11005 with the transport robot 11013 at a baseline height of the sensor 581 held at the load port module 11005 (where the sensor 581 has a predetermined spatial relationship to the kinematic location features of the mock carrier jig 510B to positively identify the location of the load port module 11005 relative to the transport robot 11013). In one aspect, the baseline position of the sensor 581 at the load port module is not the same as the actual position of the sensor 581 at the load port module 11005 where the target 800 (referring not the generic target of FIG. 10 for illustrative purposes) is offset from a center of the field of view (see fields of view FOV1, FOV2) in one or more of the Z and X directions (noting that FIG. 10 is a generic illustration that represents the fields of view FOV, FOV1, FOV2 in the X-Z (θ-Z) plane, the Z-Y (Z-R) plane, and the X-Y (θ-R) plane). Based on the sensed image of the target 800 the controller 11091 determines the distance offset(s) ΔZ and/or ΔX (Δθ) of the target 800 from the center (see center of FOV1 and FOV2) in one or more of the Z and X (or θ) directions based on the pixel-to-millimeter (or inch) reference. The controller 11091 commands the transport robot 11013 to move to adjust the position of the target 800 so that the target 800 is located in the center of the field of view (see center FOV) to obtain an initial teach location of the load port module 11005 relative to the transport robot 11013 in the X (or θ) and/or Z directions. The transport robot 11013 may be commanded to adjust the position of the target 800 any suitable number of times until the distance offset(s) ΔZ and/or ΔX (Δθ) are within a predetermined tolerance. Here, the at least one teach position (here of target 542) comprises a series of more than one positions (e.g., two positions are illustrated in the FIGS. and described above; however, as also noted above there may be any suitable number of positions), each position being spaced from each other by a predetermined distance along a motion path MP (FIG. 10) of the (at least one) target 542 defined by transport arm motion in at least one degree of freedom in which the transport arm 11013TA is moved. For example, in one or more aspects, the predetermined distance is determined based on the resolved offset between the end effector reference location 479 (see FIG. 4A) and the load station reference location 11005L (or station fixture reference location 1199—see FIGS. 11 and 12B). The predetermined distance is, in one aspect the resolved distance offset(s) ΔZ and/or ΔX (Δθ) while in other aspects the predetermined distance is a preset movement amount in one of more degrees of freedom. The (at least one) target 542 is imaged at each of the positions in the series of positions, where the image of the (at least one) target 542 comprises a series of images of the (at least one) target 542 along the motion path MP and the resolution of the offset (in this example distance offset(s) ΔZ and/or ΔX (Δθ)) is based on the series of images (e.g., see the different fields of view in FIG. 10). Here, the offset determination is a heuristic/iterative approach where each subsequent movement amount is informed by the previously resolved distance offset.

Figure 9A:
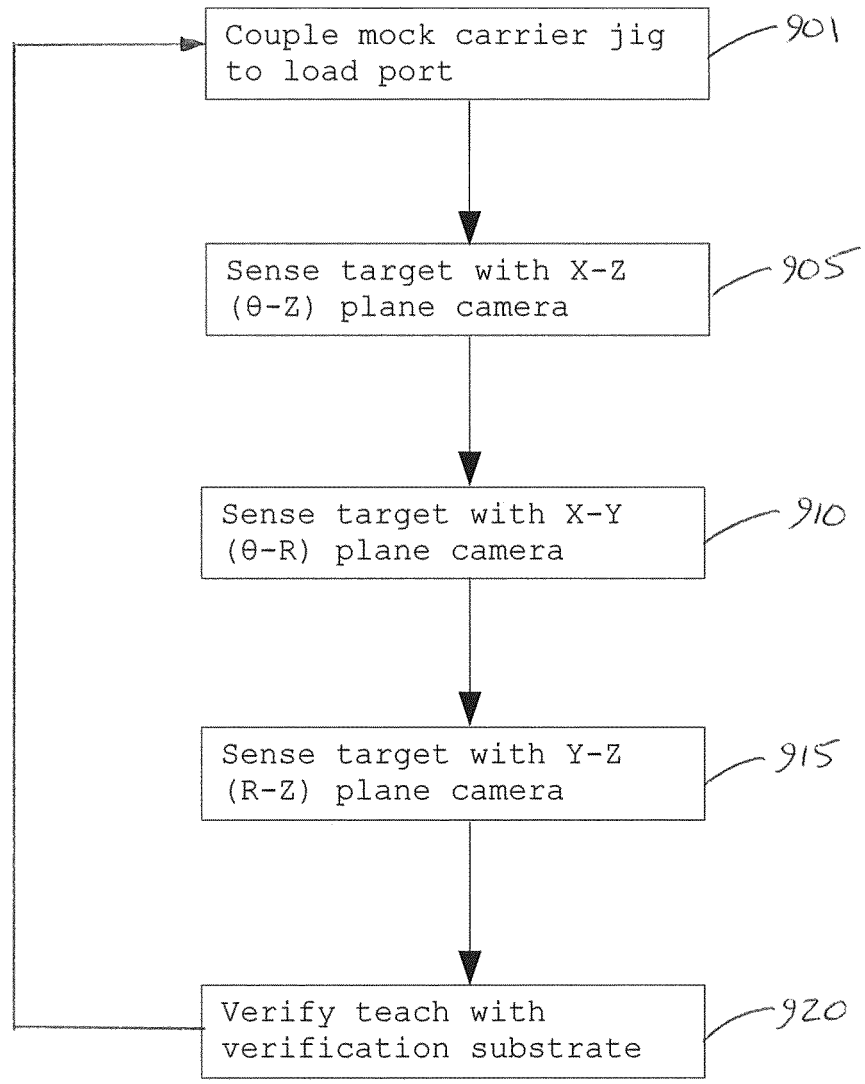
FIG. 9A is a flow diagram of a method in accordance with aspects of the present disclosure.

The controller 11091 commands the transport robot 11013, using the initial X (or θ) and Z teach positions, to heuristically move (e.g., move using the self-taught initial X (or θ) and Z positions) in at least the Z direction to a position suitable for the end effector 420A (for example) to extend into the mock carrier jig 510B so that target 540 disposed on the end effector 420A is sensed by the vertically (in this example downward) facing sensor 583 (which may be referred to as an X-Y or θ-R plane camera/sensor) (FIG. 9A, Block 910). In a manner similar to that described above, each image frame (see FIG. 10) obtained by the downward facing sensor 583 sets a pixel-to-millimeter (or inch) reference factor using the detected target 540. Here, the target 540 (generically represented as target 800 in FIG. 10) has dimensions (e.g., in millimeters and/or inches) that are known to the controller 11091. The pixel size of the downward facing sensor 583 is also known to the controller 11091 such that the controller 11091 determines the relationship between the pixel size and the known dimensions of the target 800 to determine the pixel-to-millimeter (or inch) reference factor for effecting the teaching operations described herein.

Sensing the target 540 (illustrated generically as target 800 in FIG. 10) includes heuristically moving (i.e., moving using the knowledge of the self-taught initial X (and/or Z) teach position(s) the transport robot 11013 to initial X teach position of the load port module 11005 with end effector 420A of the transport robot 11013 at a Z height (based on the initial Z teach position) that allows end effector extension to a baseline R or Y location of the sensor 583 held at the load port module 11005 (where the sensor 583 has a predetermined spatial relationship to the kinematic location features of the mock carrier jig 510B to positively identify the location of the load port module 11005 relative to the transport robot 11013). In one aspect, the baseline position of the sensor 583 at the load port module is not the same as the actual position of the sensor 583 at the load port module 11005 where the target 800 is offset from a center of the field of view (see fields of view FOV1, FOV2) in one or more of the R (or Y) and X (or θ) directions (noting again that FIG. 10 is a generic illustration that represents the fields of view FOV, FOV1, FOV2 in the X-Z (θ-Z) plane, the Z-Y (Z-R) plane, and the X-Y (θ-R) plane). Based on the sensed image of the target 800 the controller 11091 determines the distance offset(s) ΔR (or ΔY) and/or ΔX (θG) of the target 800 from the center (see center of FOV1 and FOV2) in one or more of the Z and X (or θ) directions based on the pixel-to-millimeter (or inch) reference. It should be understood that any distance offset in the X (or θ) direction is used to verify or further refine the initial X teach position.

The controller 11091 commands the transport robot 11013 to move to adjust the position of the target 800 so that the target 800 is located in the center of the field of view (see center FOV) to obtain an initial teach location of the transport robot 11013 in the R (or Y) direction and/or to verify the X teach location. The transport robot 11013 may be commanded to adjust the position of the target 800 any suitable number of times until the distance offset(s) ΔR (ΔY) and/or ΔX (Δθ) are within a predetermined tolerance. Here, in a manner similar to that above, the at least one teach position (here of target 540) comprises a series of more than one positions (e.g., two positions are illustrated in the FIGS. and described above; however, as also noted above there may be any suitable number of positions), each position being spaced from each other by a predetermined distance along a motion path MP (FIG. 10) of the (at least one) target 540 defined by transport arm motion in at least one degree of freedom in which the transport arm 11013TA is moved. For example, the predetermined distance is, in one aspect the resolved distance offset(s) ΔR (ΔY) and/or ΔX (Δθ) while in other aspects the predetermined distance is a present movement amount in one of more degrees of freedom. The (at least one) target 540 is imaged at each of the positions in the series of positions, where the image of the (at least one) target 540 comprises a series of images of the (at least one) target 540 along the motion path MP and the resolution of the offset (in this example distance offset(s) ΔR (ΔY) and/or ΔX (Δθ)) is based on the series of images (e.g., see the different fields of view in FIG. 10). Here, as above, the offset determination is a heuristic/iterative approach where each subsequent movement amount is informed by the previously resolved distance offset.

At this point in the teach process, the X (θ) location of the load port module 11005 is verified and the R (Y) and Z locations of the load port module 11005 are initially taught but not verified. The controller 11091 commands the transport robot 11013, using the verified X (or θ) position and the initially taught R (y) and Z teach positions, to heuristically move (e.g., move using the self-taught verified X (or θ) position, and initially taught R (or Y) and Z positions) to a position suitable for the end effector 420A (for example) to extend into the mock carrier jig 510B so that target 541 disposed on the end effector 420A is sensed by the laterally facing sensor 582 (which may be referred to as an Y-Z or R-Z plane camera/sensor) (FIG. 9A, Block 915). Here the target may be substantially similar to target 800 or in other aspects the target may be the slot or recess of known dimensions formed within the edge of the end effector 420A itself.

In a manner similar to that described above, each image frame (see FIG. 10) obtained by the laterally facing sensor 582 sets a pixel-to-millimeter (or inch) reference factor using the detected target 541. Here, the target 541 (generically represented as target 800 in FIG. 10) has dimensions (e.g., in millimeters and/or inches) that are known to the controller 11091. The pixel size of the laterally facing sensor 582 is also known to the controller 11091 such that the controller 11091 determines the relationship between the pixel size and the known dimensions of the target 800 to determine the pixel-to-millimeter (or inch) reference factor for effecting the teaching operations described herein.

Sensing the target 541 (illustrated generically as target 800 in FIG. 10) includes heuristically moving (i.e., moving using the knowledge of the self-taught verified X (or θ) teach position, the initially taught R (or Y) position, and the initially taught Z position) the transport robot 11013 to the verified X teach position of the load port module 11005 with end effector 420A of the transport robot 11013 extended to the initially taught R location at the initially taught Z location of the sensor 581 held at the load port module 11005 (where the sensor 581 has a predetermined spatial relationship to the kinematic location features of the mock carrier jig 510B to positively identify the location of the load port module 11005 relative to the transport robot 11013). In one aspect, the baseline position of the sensor 582 (which in one or more aspects, as noted herein, is located at the same height as mock workpiece holding slot number thirteen (13) of a 25 substrate cassette) at the load port module 11005 is not the same as the actual position of the sensor 581 at the load port module 11005 where the target 800 is offset from a center of the field of view (see fields of view FOV1, FOV2) in one or more of the R (or Y) and Z directions (noting again that FIG. 10 is a generic illustration that represents the fields of view FOV, FOV1, FOV2 in the X-Z (θ-Z) plane, the Z-Y (Z-R) plane, and the X-Y (θ-R) plane).

Based on the sensed image of the target 800 the controller 11091 determines the distance offset(s) ΔR (or ΔY) and/or ΔZ of the target 800 from the center (see center of FOV1 and FOV2) in one or more of the Z and R (or Y) directions based on the pixel-to-millimeter (or inch) reference. It should be understood that any distance offset in the R (or Y) direction is used to verify or further refine the initial Y teach position. The controller 11091, in one or more aspects, calculates based on the above-noted Z direction offset(s) a distance from the top of the end effector 420A (i.e., in the Z direction) to a projected slot 14 substrate plane 678 (the slot 14 substrate plane corresponding to a 25 substrate holding cassette), a distance between the center of the end effector 420A (i.e., in the Z direction) to a projected slot 13 center line 679, and a distance between a bottom of the end effector 420A (i.e., in the Z direction) to a projected slot 13 substrate plane 678. The controller 11091 commands the transport robot 11013 to move to adjust the position of the target 800 so that the target 800 is located in the center of the field of view (see center FOV) to verify the initial teach location of the transport robot 11013 in the R (or Y) direction and in the Z direction. The transport robot 11013 may be commanded to adjust the position of the target 800 any suitable number of times until the distance offset(s) ΔR (ΔY) and/or ΔZ are within a predetermined tolerance. In other aspects, the Z height of the load port module is determined with a through-beam sensor (although the R or Y may not be verifiable with the through-beam sensor). In one or more aspects, movement/stroke of the end effector 420A in the Z direction is verified by moving the end effector 420A a predetermined distance in the minus Z direction (e.g., downward) and verifying that the predetermined distance has been moved with the laterally facing sensor 582 and moving the end effector 420A a predetermined distance in the plus Z direction (e.g., upward) and verifying that the predetermined distance has been moved with the laterally facing sensor 582. Here, in a manner similar to that described above, the at least one teach position (here of target 541) comprises a series of more than one positions (e.g., two positions are illustrated in the FIGS. and described above; however, as also noted above there may be any suitable number of positions), each position being spaced from each other by a predetermined distance along a motion path MP (FIG. 10) of the (at least one) target 541 defined by transport arm motion in at least one degree of freedom in which the transport arm 11013TA is moved. For example, the predetermined distance is, in one aspect the resolved distance offset(s) ΔR (ΔY) and/or ΔZ while in other aspects the predetermined distance is a present movement amount in one of more degrees of freedom. The (at least one) target 541 is imaged at each of the positions in the series of positions, where the image of the (at least one) target 541 comprises a series of images of the (at least one) target 541 along the motion path MP and the resolution of the offset (in this example distance offset(s) ΔR (ΔY) and/or ΔZ) is based on the series of images (e.g., see the different fields of view in FIG. 10). Here, as above, the offset determination is a heuristic/iterative approach where each subsequent movement amount is informed by the previously resolved distance offset.

Figure 7A:
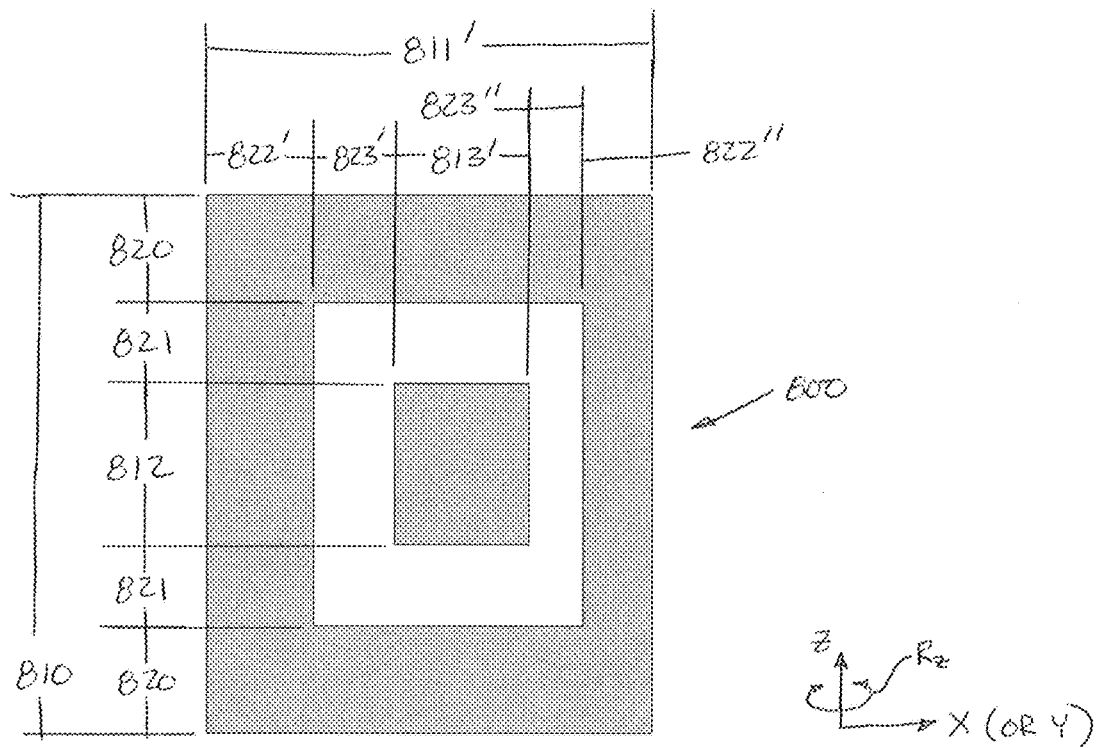
Figure 7B:
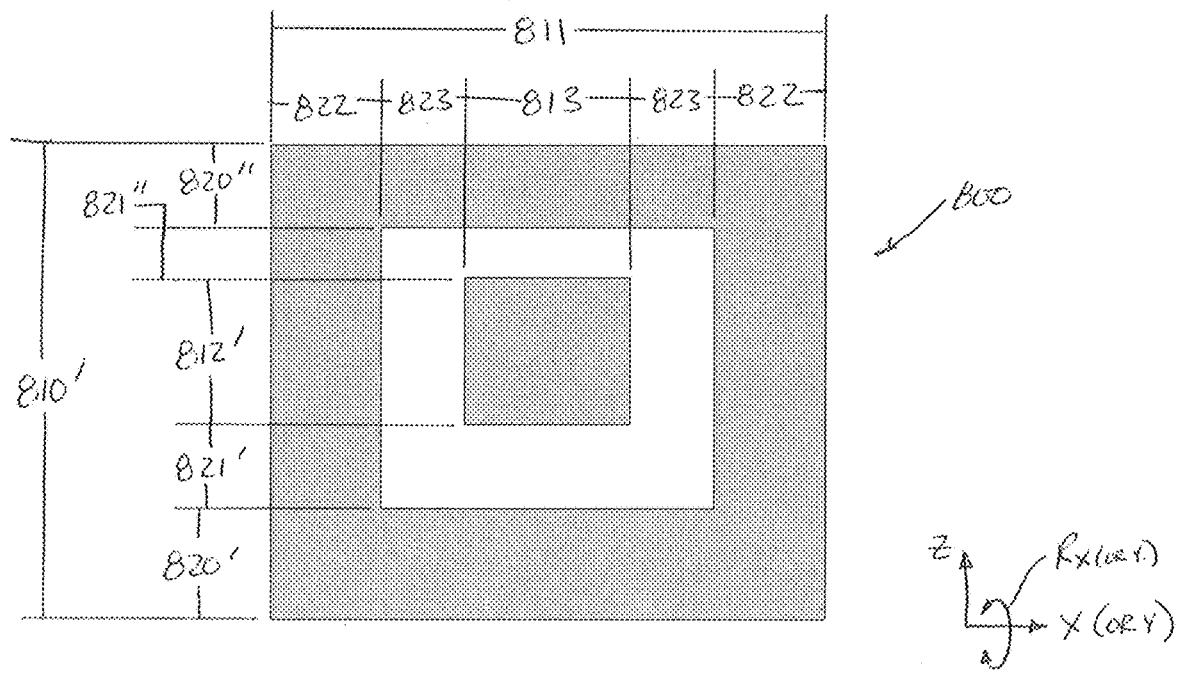
Figure 8A:
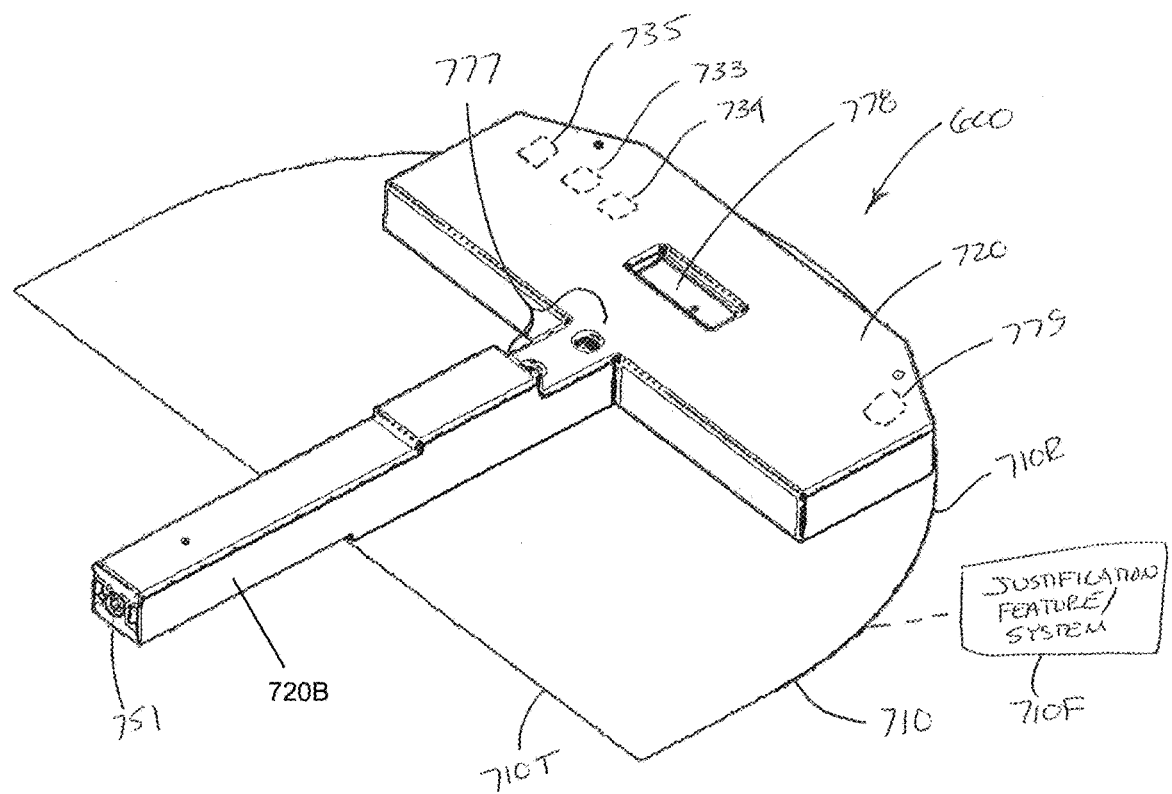
Figure 8B:
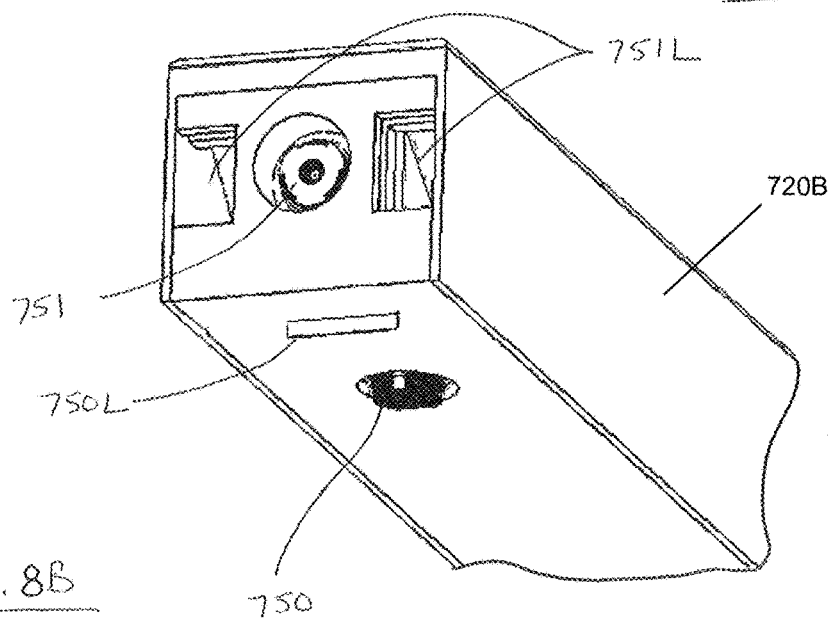
Figure 8D:
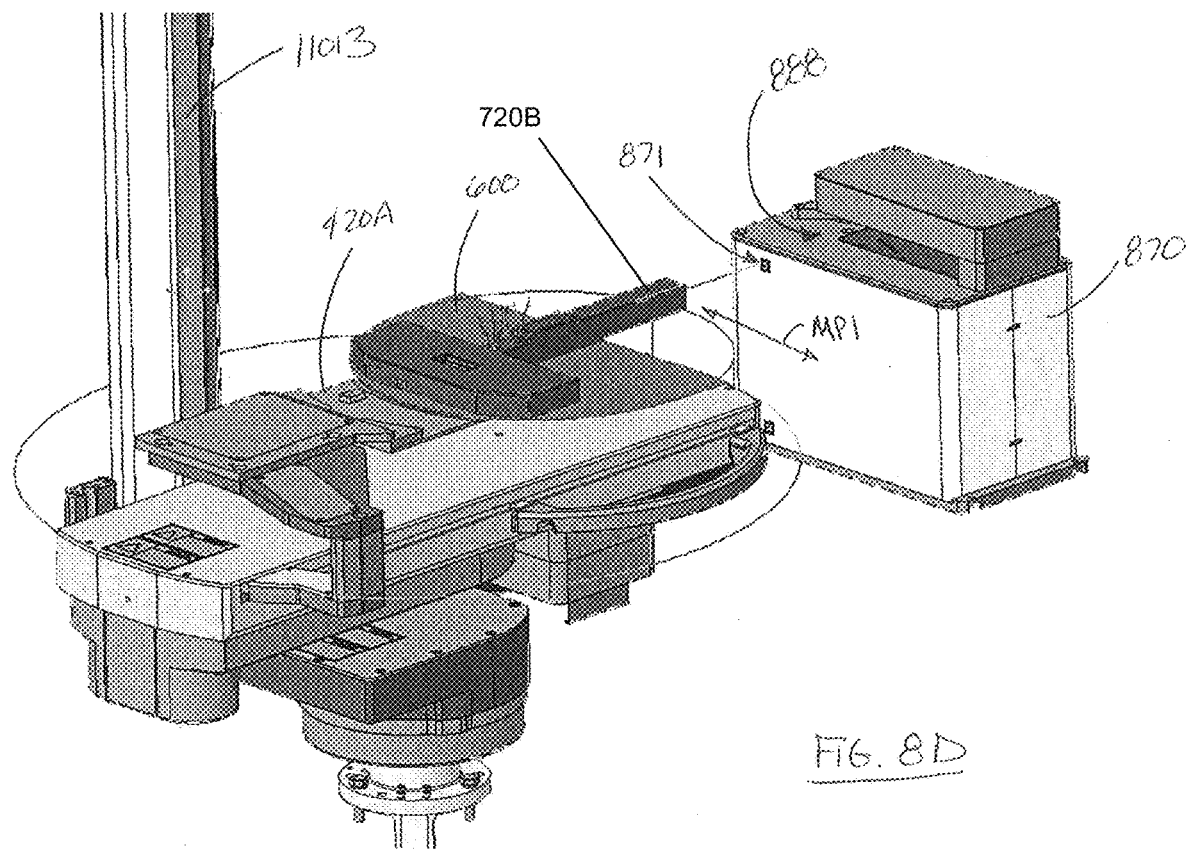
Figure 8E:
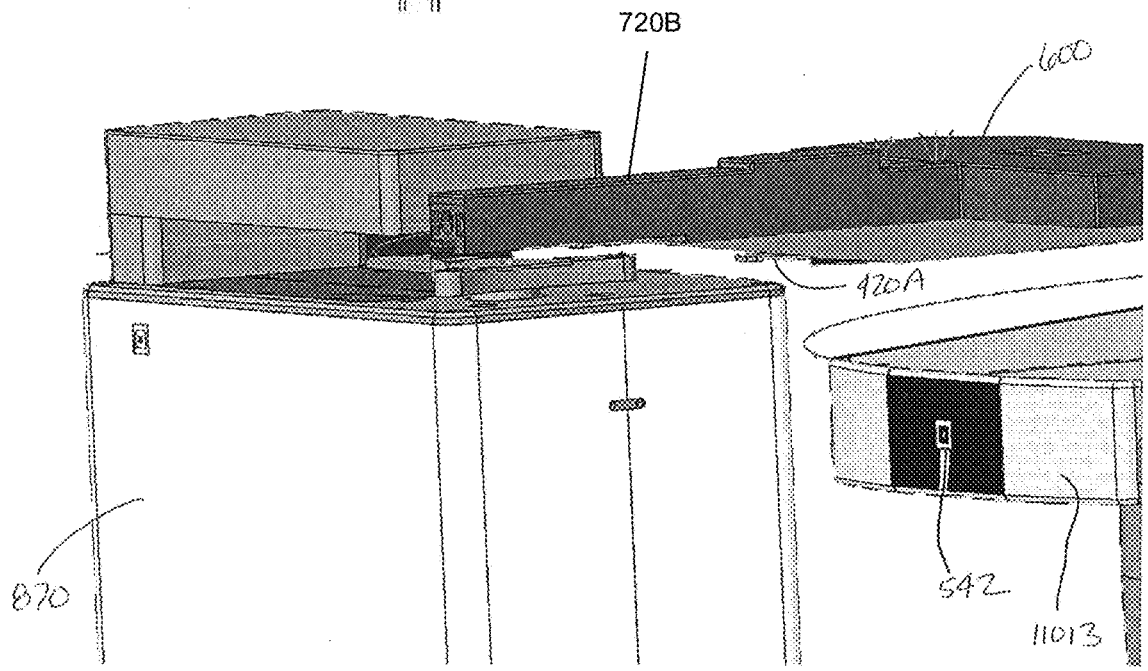
Figure 8F:
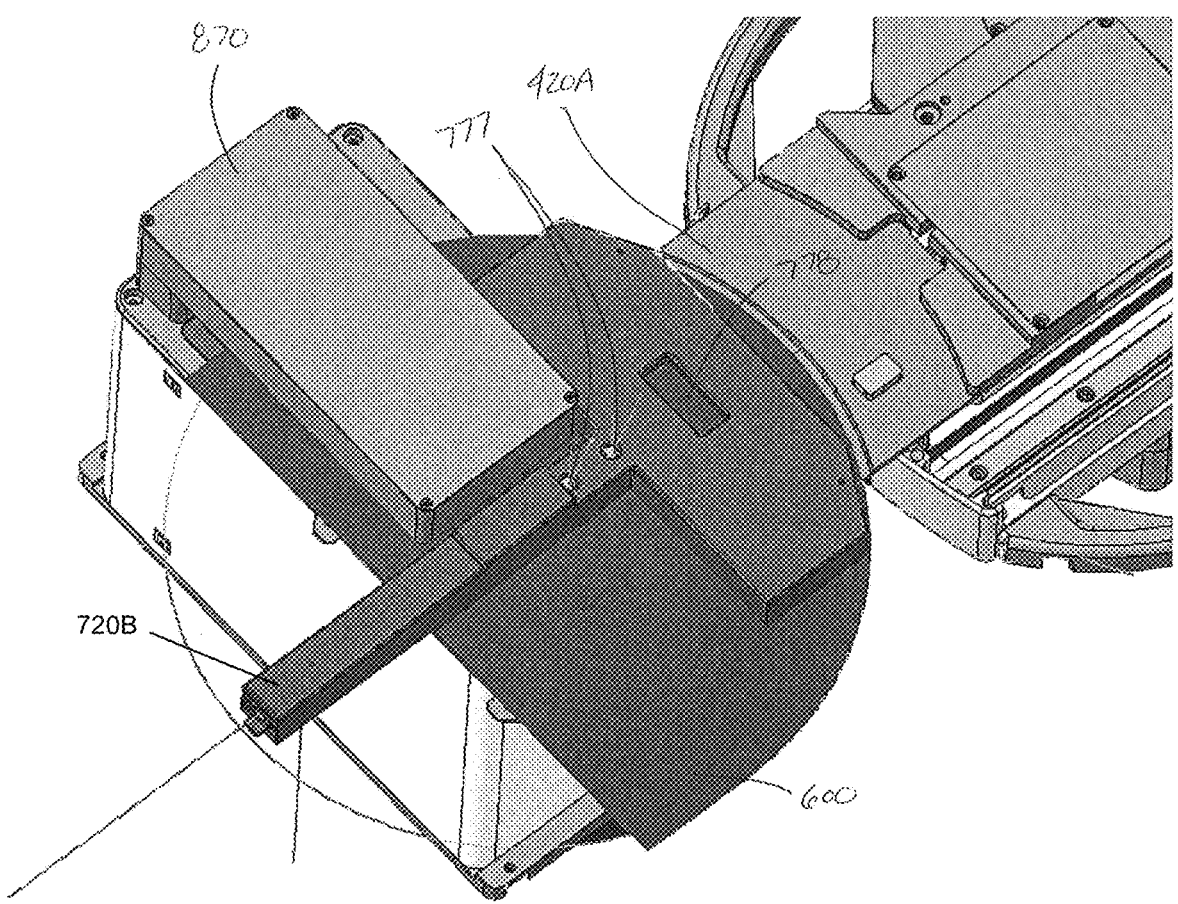

In one or more aspects, the pitch in one or more of $R_{X(or\ \theta)}$, $R_{Y(or\ R)}$, $R_Z$ of the load port module 11005 is determined and/or verified with the sensing of the respective targets 540-542 with the respective sensors 581-583. For example, the laterally facing sensor 582 images the top and/or bottom of the end effector 420A (e.g., from the side). As noted above, the laterally facing sensor 582 has a known spatial relationship with the kinematic coupling features of the mock carrier jig 510B (and hence to the load port module 11005 on which the mock carrier jig 510B is seated). Here, any inclination α (see FIG. 6E) of the end effector 540A within the field of view FOV, FOV1, FOV2 corresponds with and is determinative of the pitch $R_{X(or\ \theta)}$ of the load port module 11005. Similarly, as the target 800 has known dimensions and a known spatial relationship with the transport robot 11013 any perceived distortion of the target 800 by the sensors 581-583 may be indicative of any one or more of $R_{X(or\ \theta)}$, $R_{Y(or\ R)}$, $R_Z$. For example, referring to FIGS. 7A and 7B, FIG. 7A illustrates a target 800 that is rotated about the Z axis (i.e., rotation in $R_Z$) where the distances 811', 822', 823', 813', 822'', 823'' are compared by the controller 11091 to the distances 811, 822, 823, 813 (see FIG. 7) to determine the amount of rotation of the load port module 11005 in $R_Z$ relative to the transport robot 11013. Similarly, FIG. 7B illustrates a target 800 that is rotated about the X or Y axis (i.e., rotation in $R_X$ or $R_Y$) where the distances 810', 820', 821', 812', 820'', 821'' are compared by the controller 11091 to the distances 810, 820, 821, 812 (see FIG. 7) to determine the amount of rotation of the load port module 11005 in $R_X$ or $R_Y$ relative to the transport robot 11013. In still other aspects, the mock carrier jig 510B includes an inclinometer (or inclination sensor) 681 for determining the inclination of the mock carrier jig 510B (and hence the load port module 11005 on which the mock carrier jig 510B is seated) relative to the transport robot 11013.

Referring also to FIG. 6F, in some aspects, the method includes verifying the verified X (or θ), R (or Y), and Z teach locations of the load port module 11005 using any suitable verification substrate 699 (see FIG. 6F) (FIG. 9A, Block 920). For example, the verification substrate 699 is held in mock workpiece holding slot 611 (i.e., corresponding to mock workpiece holding slot 1 of a 25 substrate holding cassette). The verification substrate 699 is removed from mock workpiece holding slot 611 by the transport robot 11013 end effector 420A and placed in the mock workpiece holding slot 612 (i.e., corresponding to mock workpiece holding slot 25 of a 25 substrate holding cassette). The target 698 on the verification substrate 699 is sensed by the substrate placement verification sensor 683 (FIG. 6B) to verify the place location of the verification substrate 699 in mock workpiece holding slot 612 in the manner described above. The verification substrate 699 is removed from mock workpiece holding slot 612 by the transport robot 11013 end effector 420A and returned to mock workpiece holding slot 611 (i.e., corresponding to mock workpiece holding slot 1 of a 25 substrate holding cassette). The target 698 on the verification substrate 699 is sensed by the substrate placement verification sensor 682 (FIG. 6B) to verify the place location of the verification substrate 699 in mock workpiece holding slot 611 in the manner described above. As may be realized the teach location of the load port module 11005 relative to the transport robot 11013 may be further refined/adjusted based on the sensed/detected position of the target 698 of the verification substrate placed in holding slots 611, 612.

The above load port module teach method is repeated as desired for other load port modules of the substrate processing apparatus. The above load port module teach method is also repeated as desired for other end effectors (such as end effector 420B) of the transport robot 11013.

Figure 9B:
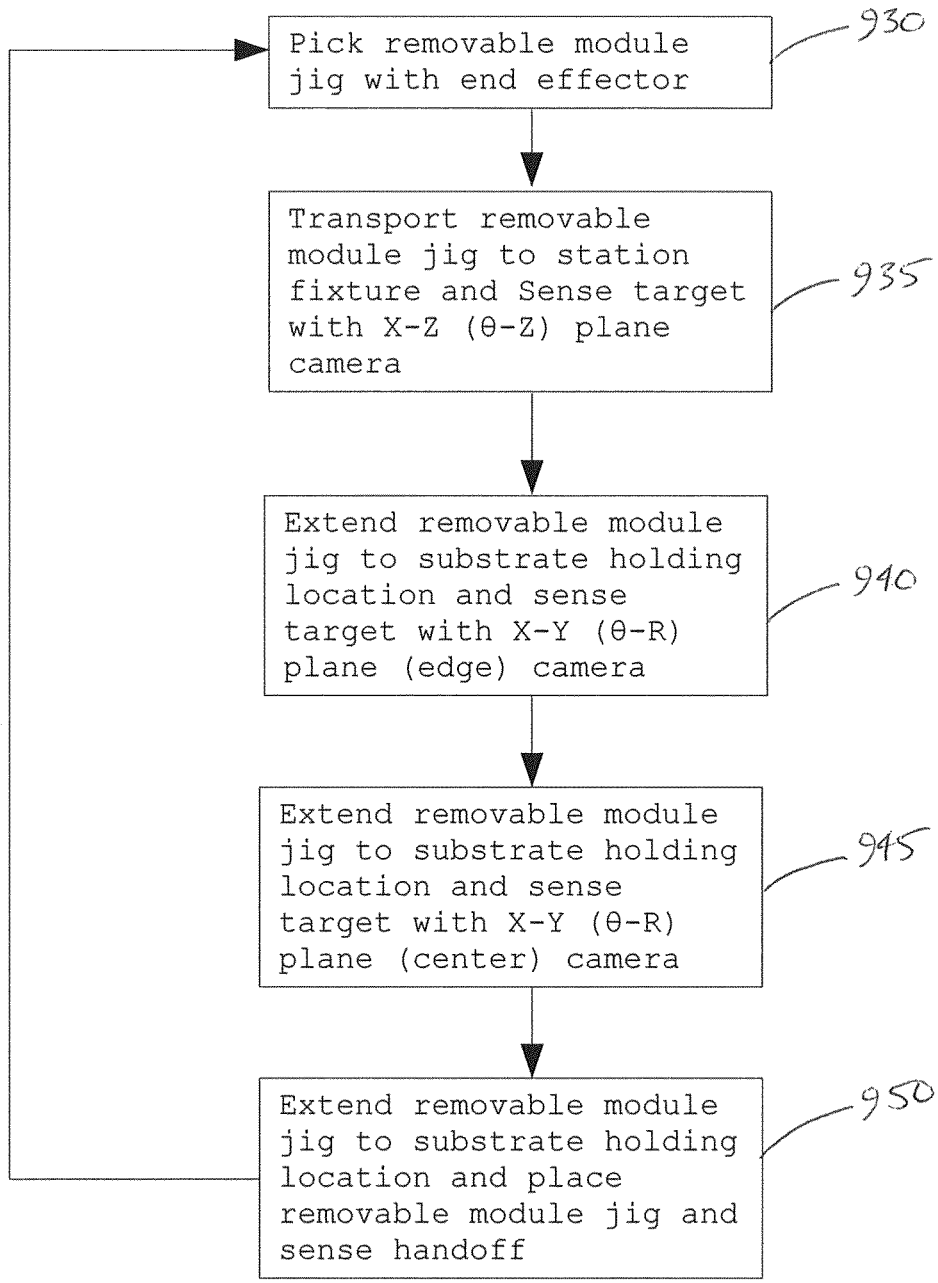
FIG. 9B is a flow diagram of a method in accordance with aspects of the present disclosure.

Referring now to FIGS. 3, 8A-8F, 9B, 10, 11, 12A, 12B, following the teaching of the load port module 11005 to the transport robot 11013, or independent of the teaching of the load port module 11005 to the transport robot 11013, the position of any suitable substrate holding station/station fixture is taught to the transport robot with the removable module jig 600. For exemplary purposes only the station fixture 870 is a substrate aligner; however, the aspects of the present disclosure may be equally applied to any suitable station fixture. The removable module jig 600 is picked from the mock carrier jig with, for example, end effector 420A of the transport robot 11013 (FIG. 9B, Block 930). The controller 11091 commands the transport robot 11013 to transport the removable module jig to a station fixture 870 to sense a target 871 of the station fixture with the forward facing sensor 751, which may be referred to as an X-Z or θ-Z plane camera/sensor (FIG. 9, Block 935).

It is noted that the station fixture 870, 11010, 11030 has an opening 888 in a front wall of the station fixture 870, 11010, 11030 that is arranged for end effector 420A, 420B, 502 entry into the station fixture through the front wall, and a field of view FOV of the at least one movable imaging sensor 750-752 faces the opening 888 in the front wall of the station fixture 870, 11010, 11030. In one or more aspects, the at least one station target (such as station target 871, 1201) is disposed facing the front wall and the opening 888 on approach of the movable transport arm 11013TA, along a motion path extending through the opening 888, to the station fixture. As described herein, the at least one movable imaging sensor 750-752 (such as sensor 751) is positioned so as to image the at least one station target (such as station target 871, 1201) in a direction extending through the opening 888 of the station fixture 870, 11010, 11030 so that the resolved offset frees end effector 420A, 420B, 502 extension through the opening 888 (e.g., positions the end effector to pass through the opening 888) into an interior of station fixture 870, 11010, 11030. The at least one movable imaging sensor 750-752 (such as sensor 751) is positioned so as to image the at least one station target (such as station target 870, 1201) in a direction extending through the opening 888 of the station fixture so that the controller 11091 confirms, based on the resolved offset, unobstructed arm extension of the end effector 420A, 420B, 502 into the interior of the station fixture. As may be realized, the resolved offset, based on the image of the at least one station target image in the direction extending through the opening 888, operates to align the at least one station target (such as target 871, 1201) to another progressive teach position (as will be described below with respect to targets 1120, 1202), so that offset resolution based on the image of the at least one station target (such as targets 1120, 1202) in a crossing direction to the direction extending through the opening 888 progressively resolves the resolved offset.

Here the target 871 is located in the X-Z or θ-Z plane and is employed to obtain initial positions of the station fixture 870 in the X (or θ) and Z directions in a manner substantially similar to that described above with respect to target 542 and rearward facing sensor 581 of the mock cassette jig 510B. For example, the controller 11091 commands the transport robot 11013 to traverse in one or more of the X, Y, R, θ, and Z directions to position the removable module jig 600 relative to the baseline spatial position of the station fixture 870 whose location is being taught to the transport robot 11013. The transport robot 11013 is commanded to move relative to the station fixture 870 to position the target 871 within the field of view FOV, FOV1, or FOV2 of the vision system (see FIG. 10). In the example shown in the Figs. the rearward facing target 871 on the station fixture 570 is brought into the field of view FOV of the forward facing sensor 751 (see FIGS. 8A, 8B, 8D, and 10), again noting FIG. 10 generically represents image frames captured by any one of the sensors described herein). The rearward facing target 871 is sensed by the forward facing sensor 751 and the controller 11091 records the location of the sensed rearward facing target 871 based on encoder data from motor axes of the transport robot 11013. The recorded location of the sensed rearward facing target 871 is or is used to determine a teach point along a robot trajectory or path that the transport robot 11013 traverses (or travels/moves along) to perform any suitable desired pick and place transfer operations as noted above.

In a manner similar to that described above, each image frame (see FIG. 10) obtained by the forward facing sensor 751 sets a pixel-to-millimeter (or inch) reference factor using the detected target 871 in a manner substantially similar to that described above. Sensing the target 871 (illustrated generically as target 800 in FIG. 10) includes moving the transport robot 11013 to the baseline position of the station fixture 870 with forward facing sensor 751 held by the transport robot 11013 at a baseline height of the target 871 positioned on the station fixture 870 (where the target 871 has a predetermined spatial relationship to the substrate holding features (e.g., passive or active grips of a rotatable chuck 1121) of the station fixture 870 to positively identify the substrate holding location of the station fixture 870 relative to the transport robot 11013. In one aspect, the baseline position of the target 871 at the load port module is not the same as the actual position of the target 871 at the station fixture where the target 800 (referring now to the generic target of FIG. 10 for illustrative purposes) is offset from a center of the field of view (see fields of view FOV1, FOV2) in one or more of the Z and X directions. Based on the sensed image of the target 800 the controller 11091 determines the distance offset(s) $\Delta Z$ and/or $\Delta X$ ($\Delta \theta$) of the target 800 from the center (see center of FOV1 and FOV2) in one or more of the Z and X (or θ) directions based on the pixel-to-millimeter (or inch) reference. The controller 11091 commands the transport robot 11013 to move to adjust the position of the end effector 420A so that the target 800 is located in the center of the field of view (see center FOV) to obtain an initial teach location of the station fixture 870 relative to the transport robot 11013 in the X (or θ) and/or Z directions. The transport robot 11013 may be commanded to adjust the position of the target 800 any suitable number of times until the distance offset(s) $\Delta Z$ and/or $\Delta X$ ($\Delta \theta$) are within a predetermined tolerance. In one or more aspects, the Z position of the transport robot 11013 is verified through the teaching of the load port module 11005 where the position of both the Z position of the station fixture 870 and the verified Z position of the transport robot 11013 are known relative to a substrate transport plane of the substrate transport apparatus such that further teaching of the Z position of the station fixture 870 may not be desired. Here, the at least one teach position comprises a series of teach positions, each teach position being spaced from each other by a predetermined distance along a motion path MP1 (FIG. 8D) of the at least one station target 871 (as seen in the field of view FOV, e.g., the at least one station target moves across the field of view as the movable transport arm 11013TA moves along the motion path MP1) defined by movable transport arm 11013TA motion (e.g., relative to the station fixture 870) in the at least one degree of freedom. The predetermined distance is determined based on the resolved offset between the predetermined end effector reference location 479 and the predetermined holding station reference location 1199. The at least one station target 871 is imaged at each teach position of the series of teach positions, wherein the image of the at least one station target 871 comprises a series of images of the at least one station target 871 along the motion path MP1 (See FIG. 10), and wherein the offset resolution is based on the series of images.

The controller 11091 commands the transport robot 11013, using the initial X (or θ) and Z teach positions, to heuristically move (e.g., move using the self-taught initial X (or θ) and Z positions) in at least the Z direction to a position suitable for the end effector 420A (for example) to extend to the substrate holding location (e.g., the rotatable chuck 1121) of the station fixture 870 so that target 1120 disposed on the rotatable chuck 1121 is sensed by the edge sensor 750 (which may be referred to as an X-Y or θ-R plane camera/sensor) (FIG. 9B, Block 940). Here, the at least one movable imaging sensor 750-752 is positioned so as to image the at least one station target (such as station target 1120, 1202) in a crossing direction extending at a crossing angle to an extension path of the end effector 420A, 420B, 502 extending through the opening 888 of the station fixture 870, 11010, 11030 into the interior of the station fixture 870, 11010, 11030. For example, the target 1120 is located at the rotatable chuck at a predetermined holding station fixture reference location 1199 so that the target 1120 (and the station fixture reference location 1199) has a predetermined spatial relationship with substrate holding features (passive grips or active grips) 1100-1102 of the rotatable chuck 1121. In a manner similar to that described above, each image frame (see FIG. 10) obtained by the edge sensor 750 sets a pixel-to-millimeter (or inch) reference factor using the detected target 1120. Here, the target 1120 (generically represented as target 800 in FIG. 10) has dimensions (e.g., in millimeters and/or inches) that are known to the controller 11091. The pixel size of the downward facing sensor 583 is also known to the controller 11091 such that the controller 11091 determines the relationship between the pixel size and the known dimensions of the target 800 to determine the pixel-to-millimeter (or inch) reference factor for effecting the teaching operations described herein.

Sensing the target 1120 (illustrated generically as target 800 in FIG. 10) includes heuristically moving (i.e., moving using the knowledge of the self-taught initial X and Z teach positions) the transport robot 11013 to the initial X teach position of the load port module 11005 with end effector 420A of the transport robot 11013 at a Z height (based on the initial Z teach position) that allows end effector extension to a baseline R or Y location of the target 1120 on the rotatable chuck 1121 (where the target 1120 has a predetermined spatial relationship to the kinematic location features of the rotatable chuck 1121 to positively identify the location of the station fixture 870 relative to the transport robot 11013). In one aspect, the baseline position of the target 1120 at the station fixture 870 is not the same as the actual position of the target 1120 at the station fixture 870 where the target 1120 is offset from a center of the field of view (see fields of view FOV1, FOV2) in one or more of the R (or Y) and X (or θ) directions. Based on the sensed image of the target 1120 the controller 11091 determines the distance offset(s) ΔR (or ΔY) and/or ΔX (Δθ) of the target 1120 from the center (see center of FOV1 and FOV2) in one or more of the Z and X (or θ) directions based on the pixel-to-millimeter (or inch) reference. It should be understood that any distance offset in the X (or θ) direction is used to verify or further refine the initial X teach position. The controller 11091 commands the transport robot 11013 to move to adjust the position of the end effector 420A so that the target 1120 is located in the center of the field of view (see center FOV) to obtain an initial the teach location of the station fixture 870 relative to the transport robot 11013 in the R (or Y) direction and/or to verify the X teach location. The transport robot 11013 may be commanded to adjust the position of the target 800 any suitable number of times until the distance offset(s) ΔR (ΔY) and/or ΔX (Δθ) are within a predetermined tolerance. As may be realized, the target 1120 is positioned in a predetermined rotation orientation by the rotatable chuck 1121 (such as at the home position of the rotatable chuck 1121) for performing the automatic station fixture location teach procedure.

At this point in the teach process, the X (θ) location of the station fixture 870 and the Z location of the station fixture is verified and the R (Y) location of the station fixture 870 is initially taught but not verified. The controller 11091 commands the transport robot 11013, using the verified X (or θ) and Z positions and the initially taught R (or Y) position, to heuristically move (e.g., move using the self-taught verified X (or θ) and Z positions, and initially taught R (or Y) positions) to a position suitable for the end effector 420A (for example) to extend into the station fixture 870 so that the center sensor 752 of the removable module jig 600 is positioned to sense target 1120 (FIG. 9B, Block 945). The controller 11091 in a manner substantially similar to that described above determines the distance offset(s) ΔR (or ΔY) and/or ΔX (Δθ) of the target 1120 from the center (see center of FOV1 and FOV2) in one or more of the R (or Y) and X (or θ) directions based on the pixel-to-millimeter (or inch) reference. It should be understood that any distance offset in the R (or Y) and/or the X (or θ) directions is/are used to verify or further refine the initial R (or Y) position and/or further refine the verified X (or θ) teach position.

The controller 11091 commands the transport robot 11013, using the verified X (or θ) and Z positions and the verified R (or Y) position, to heuristically move (e.g., move using the self-taught verified X (or θ), R (or Y), and Z positions) to a position suitable for the end effector 420A (for example) to extend into the station fixture 870 so that the removable module jig 600 can be placed on the rotatable chuck 1121 where the inclination sensor 779 of the removable module jig 600 senses the handoff of the removable module jig 600 from the end effector 420A to the rotatable chuck 1121 (FIG. 9B, Block 950). Data is transmitted from the inclination sensor 799 to the controller 11091 indicating a relative inclination ($R_{x(or\ \theta)}, R_{y(or\ R)}$) between the end effector 420A and the substrate holding station (e.g., rotatable chuck 1121) of the station fixture 870 so as to teach the inclination of the station fixture 870. The rotation of the station fixture 870 about, at least, the Z axis (i.e., $R_Z$) is determined from the vision system as described above using perceived distortion of the targets 871, 1120 and/or a rotational deviation of the target 1120 from an expected rotational orientation of the target 1120, or in any other suitable manner. In other aspects, a verification substrate 699 can be transferred by the transport robot 11013 from the mock carrier jig 510A, 510B and placed to the station fixture. The transport robot 11013 can then pick the removable module jig 600 from the mock carrier jig 510A, 510B for imaging the verification substrate 699 seated on the station fixture for determining the inclination of the station fixture through image analysis of at least one image of the verification substrate 699 seated on the station fixture.

FIGS. 12A and 12B illustrate an exemplary processing module 11030 (or vacuum load lock 11010) having target 1201 (akin to target 871) and target 1202 (akin to target 1120, where target 1202 is located at a predetermined holding station reference location 1299 so that the target 1202 (and the station reference location 1299) have a predetermined spatial relationship with the substrate holding features (e.g., pins 1260-1262 but in other aspects any suitable holding features such as slots, etc. may be employed) of the processing module 11030 (or vacuum load lock 11010)). The position of the processing module 11030 (or vacuum load lock 11010) is taught with the removable module jig 600 in a manner substantially similar to that described above with respect to the station fixture 870, noting that the target 1202 has a known spatial relationship to the substrate holding features 1260-1262 of the processing module 11030 (or vacuum load lock 11010).

In the aspects described herein, the controller 11091 commands the transport robot 11013 to return the removable module jig 600 to the mock carrier jig 510A, 510B after sensing each target 871, 1120 so that sensor data is transmitted from the removable module jig 600 to the controller 11091 through the infrared communications described herein. In other aspects, the removable module jig 600 need not be returned to the mock carrier jig 510A, 510B after sensing each target 871, 1120, such as where radio frequency communications are used between the removable module jig 600 and the controller 11091 and/or the mock carrier jig 510A, 510B.

The accuracy of the teach locations obtained with the automatic teach apparatus 500 described herein can be made as accurate as desired by increasing or decreasing the resolution of the vision system 530A, 530B. The greater the resolution of the vision system 530A, 530B and tuning of the image processing algorithm, the smaller the tolerance in determining the teach locations. The teach locations are stored in any suitable database accessible by (or included in) the controller 11091 and are accessed by the controller 11091 for commanding transport robot pick and place operations. As may be realized, the teach locations can be the start or end points of a robot trajectory or a waypoint in the trajectory (where the waypoint is introduced to route the end effector around an obstruction or for any other suitable reason). As can be seen above, the inclinometer sensors of the mock carrier jig 510A, 510B and the removable module jig 600 provide for automatic verification of planarity between the components of the substrate processing apparatus.

Referring to FIGS. 13-16 another exemplary removable module jig 1300 is illustrated. The removable module jig 1300 may be substantially similar to removable module jig 600 described above; however, in this aspect the removable module jig includes a vision system 1301 and any suitable motion sensor system 1310. Here the vision system 1301 includes forward facing sensors 1302, 1302 and downward facing sensor 1304 (which are substantially similar to sensors 571-574 and 581-583 described above). The downward facing sensor 1304 may be disposed on the frame 710 in a location similar to that of sensor 752. The sensor 1302 is disposed at or adjacent a leading edge of the frame 710 while the sensor 1303 is disposed at or adjacent a trailing edge of the frame 710. The motion sensor system 1310 includes any suitable motion sensors configured to determine one or more of vibration, acceleration, and angular momentum of the removable module jig 1300 (and an object on which the removable module jig 1300 is seated, such as an end effector or station fixture). The operation of the removable module jig 1300 is substantially similar to removable module jig 600 described above where the sensor 1302 at the leading edge of the frame 710 is employed to direct the transport robot 11013 to the teach location in at least the X-Z or θ-Z plane (see FIG. 14) and the sensor 1304 directs the transport robot 11013 to the teach location in the X-Y or θ-R plane (See FIG. 15); however, in this aspect the sensor 1303 at the trailing edge of the frame 710 effects verification of the placement of the removable module jig 1300 on the station fixture (illustrated as processing module 11030—see FIG. 16) through a comparison (e.g., by the controller 11091) of the structure of the removable module jig 1300 to the structure of the station fixture. As the removable module jig 1300 is transported to and placed at the teach location, the motion sensor system 1310 provides motion data (e.g., vibration, acceleration, and angular momentum) verification feedback to the controller 11091 for the transport robot 11013 movements.

In one or more aspects of the present disclosure, the mock carrier jig 510A, 510B is configured as a drop in module that is inserted and removed from load locks of the substrate processing apparatus. Suitable examples of drop in modules can be found in U.S. patent application Ser. No. 16/899,151 filed on Jun. 11, 2020 titled "Substrate Process Apparatus", the disclosure of which is incorporated herein by reference in its entirety. Here, with the mock carrier jig 510A, 510B configured as a drop in module the position of the load locks is automatically taught to vacuum substrate transports located within a vacuum section of the substrate processing apparatus (as described herein) in a manner substantially similar to that described above. Also, with the mock carrier jig 510A, 510B configured as a drop in module, the position of the process modules coupled to the vacuum section are automatically taught to the vacuum substrate transports in a manner substantially similar to that described above.

In the aspects of the present disclosure described herein, one target is illustrated in each of the X-Y (or θ-R) plane, the X-Z (or θ-Z) plane, and the Y (or R)-Z plane for each transport arm 11013TA and each station fixture; however, in other aspects any suitable number of targets are provided in one or more of the X-Y (or θ-R) plane, the X-Z (or θ-Z) plane, and the Y (or R)-Z plane, where the multiple targets in each plane are used to verify the location of previously sensed targets and increase the accuracy of the automatic teaching process.

Referring now to FIGS. 17A-19E, in accordance with one or more aspects of the present disclosure the vision system, such as vision system 530A (see FIG. 5A), 530B (see FIG. 5B) includes at least one distance measuring sensor 1700. While, the distance measuring sensor 1700 is described with respect to vision system 530A it should be understood that the at least one distance measuring sensor 1700 and additional imaging sensor(s) can be mounted to the transport arm 11013TA for employment with vision system 530B so that the additional imaging sensors and distance measuring sensor 1700 form a part of vision system 530B. In still other aspects, the at least one distance measuring sensor is mounted on the frame 710 of the removable module jig 600, so as to be carried and transported by the end effector 420A, 420B, 502 holding the frame 710. The at least one distance measuring sensor 1700 senses distance in a distance sensing direction 1777 substantially aligned with a field of view FOV of the at least one movable imaging sensor 571-574, 750-752 so that the field of view FOV and distance sensing direction are substantially collimated with respect to each other (see FIGS. 17A-19E). Here, in one or more aspects, the field of view FOV and distance sensing direction 1777 are substantially collimated with respect to each other viewing and sensing in a vertical plane VP (FIGS. 18A, 18B) ahead of the end effector 420A, 420B, 502. In one or more aspects, the field of view FOV' and distance sensing direction 1777' (see FIG. 19D) are substantially collimated with respect to each other viewing and sensing in a direction tangent (see FIG. 19D where, for example, the tangent direction is in the X direction) to an arm motion path extending the movable transport arm along a workpiece transport path from the load port module 11005 towards the station fixture 870, 11010, 11030.

In one aspect, the distance measuring sensor 1700 is integral with at least one of the sensors 571, 572, 751, such as where at least one of the sensors 571, 572, 751 is a time of flight camera; while, in other aspects, the distance measuring sensor 1700 is separate from the sensors 571, 572, 751 and includes any suitable laser and/or ultrasonic (sonic) ranging system or any other suitable ranging system including, but not limited to, an ultrasonic sensor, an infrared sensor, a time of flight sensor, and a LIDAR sensor. The distance measuring sensor 1700 is employed to verify the location of at least the station fixtures 870, 11010, 11030 at a time of finding the locations of the station fixtures 870, 11010, 11030. The distance measuring sensor 1700 is also employed, in one or more aspects, to resolve obstructions in transport arm 11013TA trajectory/path planning so that the transport arm 11013TA is able to move around any obstructions within the transport robot workspace. This aspect of the present disclosure provides the controller 11091 and/or operator of the substrate processing apparatus feedback with respect to transport robot workspace and any transport robot 11013 moves and/or commands of the transport robot 11013 therein.

In this aspect, the vision system 530B (only a portion of which is illustrated in FIGS. 17A-19E) with the distance measuring sensor 1700 forms a wayfinding system 1710 that can be used in conjunction with the sensor-target couples described above or independent of the sensor-target couples. The wayfinding system 1710 is configured to, with the controller 11091, guide the transport robot 11013 within the transport robot workspace from one teach location to another teach location. As illustrated in FIGS. 17A-18B, the distance measuring sensor 1700 is paired with one or more of the forward facing sensors 571, 572; however, in other aspects a distance measuring sensor 1700 (there can be more than one) is be paired with any one or more of the imaging sensors 571-574, 750-752 to provide sensory feedback in any one or more of the Z-X(or θ) plane, R(or Y)-X(or θ) plane, and Z-Y(or R) plane. The wayfinding system 1710 can be mounted to any suitable location of the transport robot 11013 and/or removable module jig 600. For example, as illustrated in FIG. 18A the wayfinding system 1710 is mounted to the transport arm 11013TA in any suitable manner so as to face in the forward direction (e.g., along the extension axis of the transport arm 11013TA); while in other aspects, the wayfinding system 1710 is mounted to the Z-drive column 380 in any suitable manner so as to face in the forward direction (e.g., along the extension axis Y or R of the transport arm 11013TA). As noted above, in other aspects, additional distance measuring device and imaging sensor pairs/couples can be provided along other axes of motion of the transport robot 11013.

In one aspect, the controller 11091 provides for operator selection of one or more regions of interest 1800 (e.g., within a field of view FOV) of the wayfinding system 1710. The regions of interest 1800 may be selected in any suitable manner so as to correspond with, for example, areas of the field of view FOV that are unobstructed by the transport arm 11013TA, a Z height corresponding to slot valves of processing stations through which the end effector extends, etc. Selection of the regions of interest may also reduce image processing times.

Figure 20:
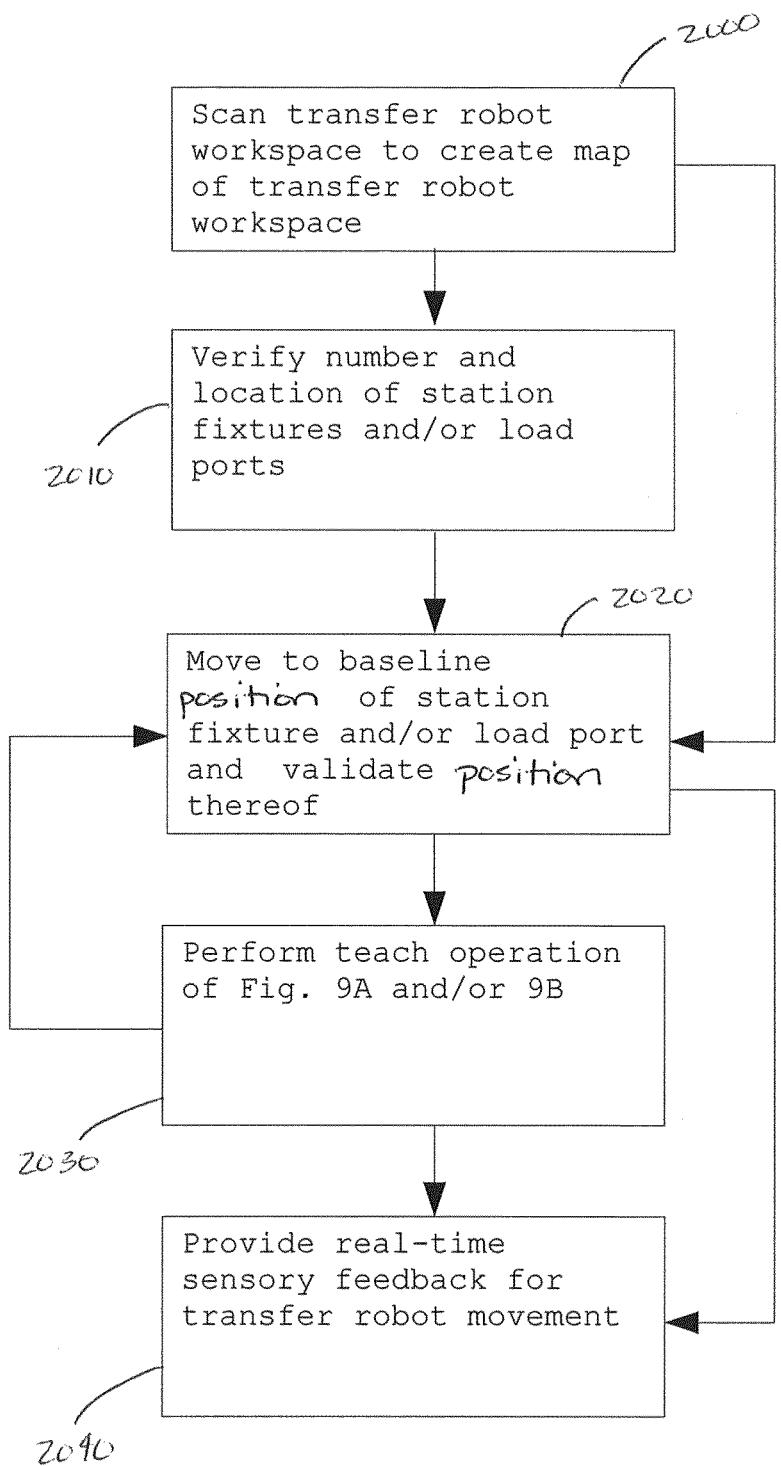
FIG. 20 is a flow diagram of a method in accordance with aspects of the present disclosure.

Referring also to FIG. 20, the controller 11091 is communicably connected to the at least one distance measuring sensor 1700 and configured to detect, via distance measurement from the at least one distance measuring sensor 1700, with the movable 11013TA transport arm in motion, an opening 888 of the station fixture 870, 11010, 11030 enabling controller motion of the end effector 420A, 420B, 502 relative to the opening 888 to the station teaching position, or an obstruction in the motion path of the end effector 420A, 420B, 502. In operation, the transport robot 11013 is informed of the baseline locations of substrate processing apparatus features/components (such as stored in a memory 1915 of or accessible by the controller 11091 and obtained from a CAD model(s) of the substrate processing system). The controller 11091 commands movement of the transport robot 11013 within the transport robot workspace 1900 so that the transport robot 11013 scans, with the wayfinding system 1710, the transport robot workspace 1900 to create a map 1910 (FIG. 19A) of the transport robot workspace 1900 (FIG. 20, Block 2000). Here, any suitable image recognition algorithm(s) is/are employed by the controller 11091 to determine the spatial locations of the processing apparatus features/components (such as the load port modules 11005, vacuum load locks 11010, and process modules 11030) with respect to encoder (see, e.g., FIG. 3) positions of the transport robot 11013 drives 367, 362, 380D, 425. In one aspect, the number of station fixtures 870, 11010, 11030 and/or load port modules 11005 are verified (FIG. 20, Block 2010) by the scanning of the transport robot workspace 1900. The map 1910 of the spatial positions of each processing apparatus features/components is stored in a memory 1915 of or accessible to the controller 11091 where the map 1910 can be retrieved by the controller 11091 such as where the controller 11091 issues movement commands to the transport robot 11013 (e.g., for path/trajectory planning). The accuracy of the map 1910 can be increased as desired by increasing the resolution and tuning of the distance measuring sensor 1700, where the greater the resolution of the wayfinding system 1710, the smaller the tolerance in computing the map 1910.

Figure 19A:
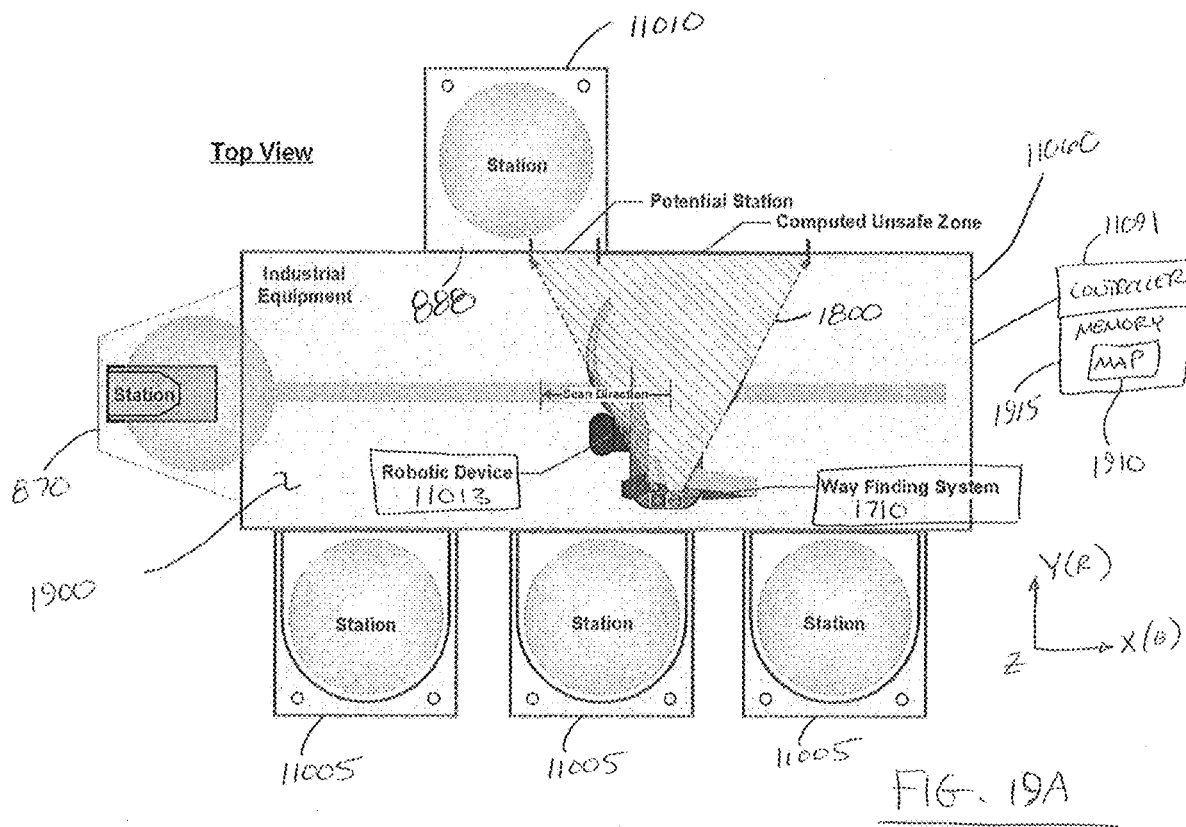
FIGS. 19A, 19B, 19C, 19D, and 19E are schematic illustrations of a portion of the substrate processing apparatus described herein incorporating aspects of the present disclosure.
Figure 19B:
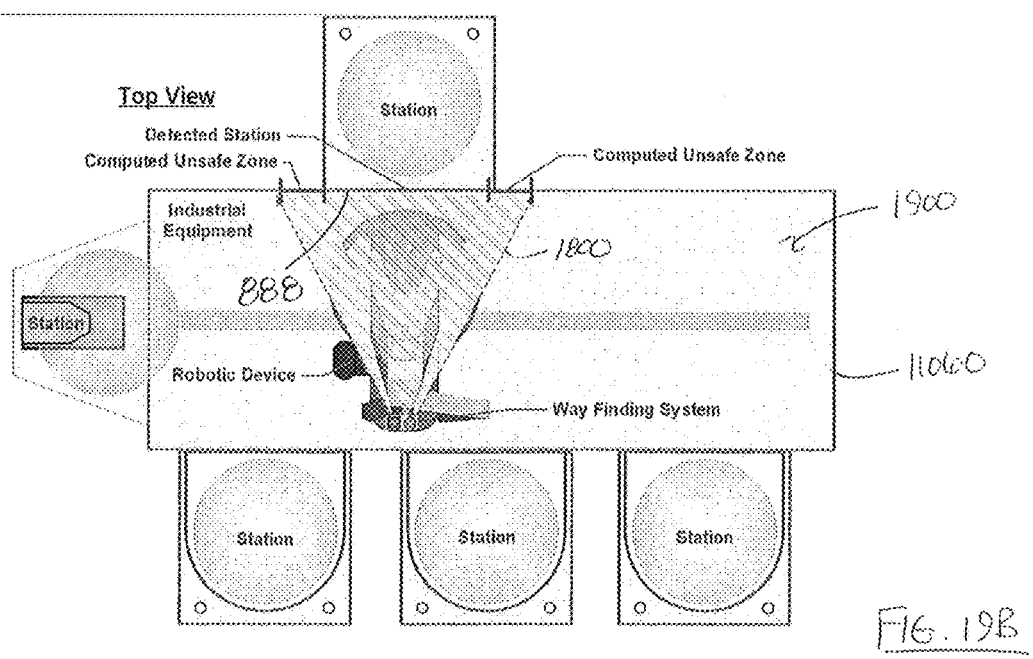
Figure 19C:
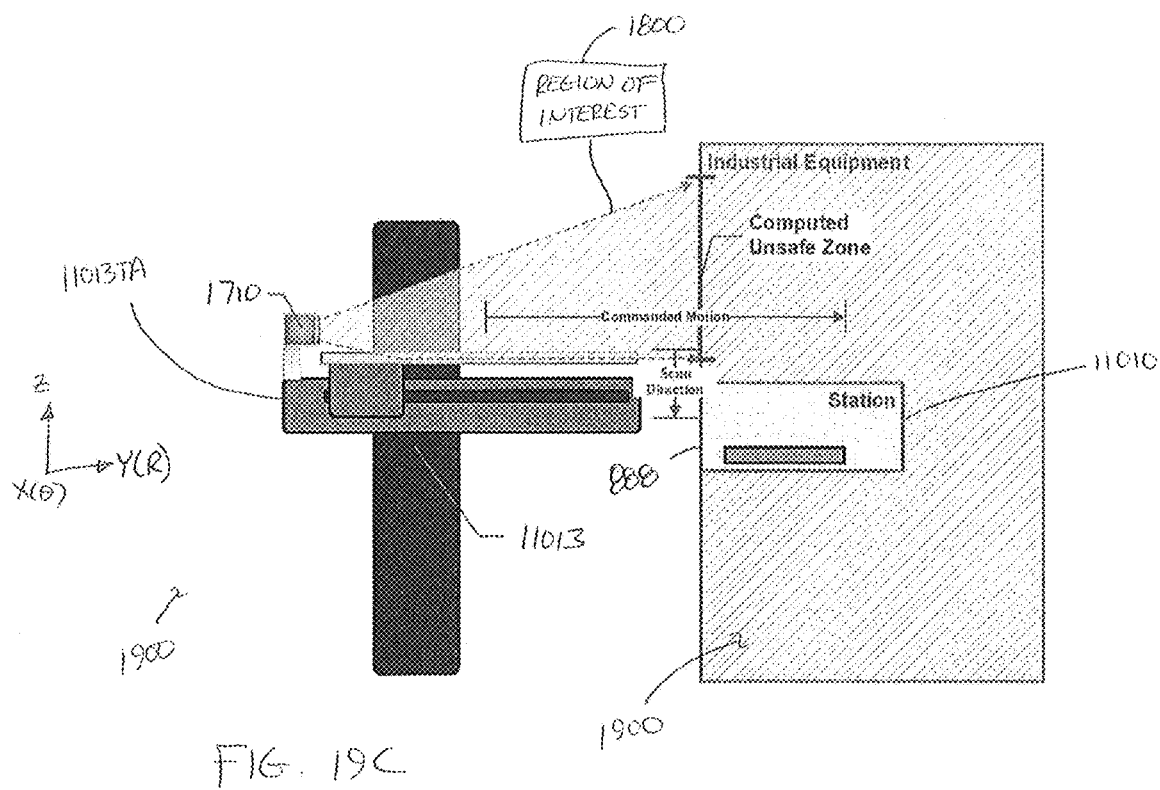
Figure 19D:
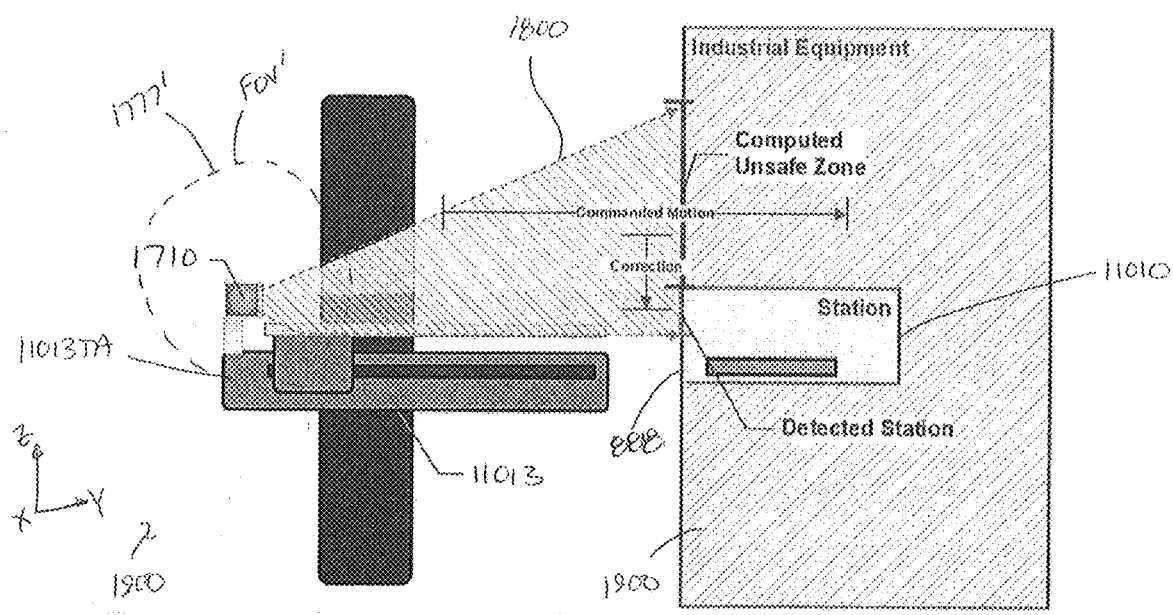
Figure 19E:
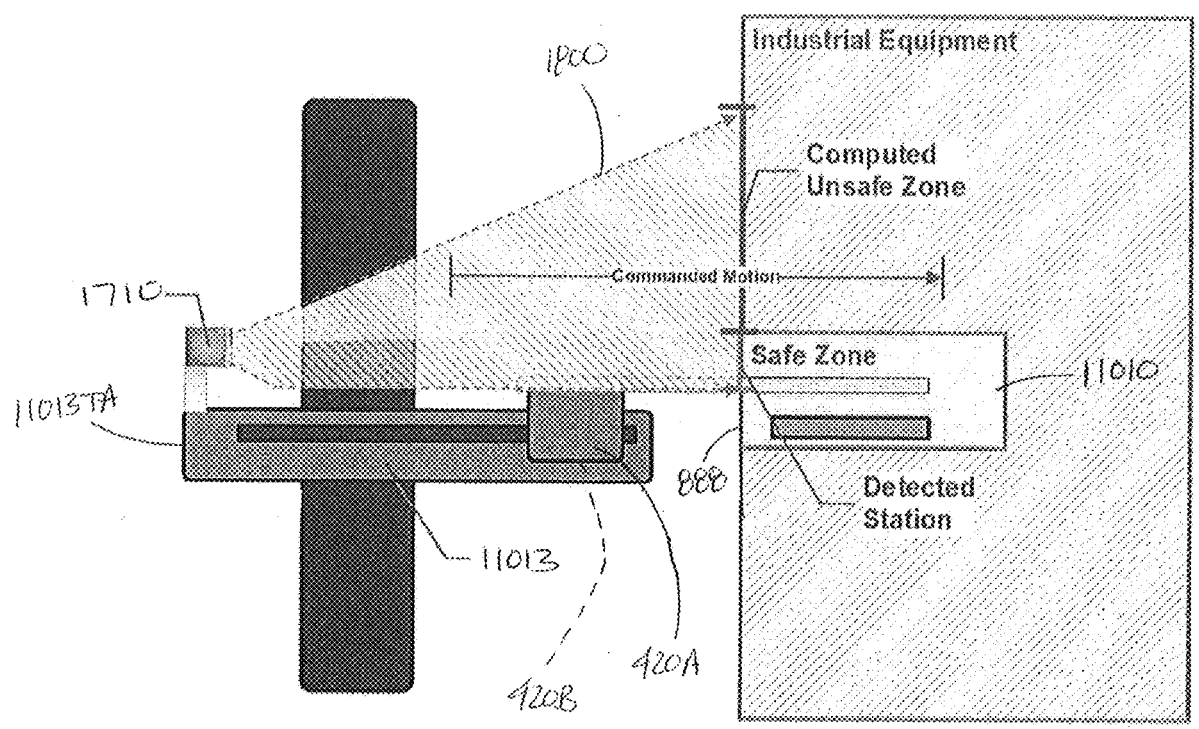

In one or more aspects, the map 1910 is used to at least partially teach the locations of the processing apparatus features/components to the transport robot 11013. For example, the transport robot 11013 is commanded to move, by the controller 11091, to a baseline position (as described herein) or the mapped position (as included in map 1910) of a desired processing apparatus feature/component, such as station fixture (vacuum load lock) 11010 illustrated in FIG. 19A, to validate the position of the station fixture 11010 with respect to the baseline position of the station fixture 11010 and/or the position of the station fixture 11010 in the map 1910 (FIG. 20, Block 2020). Where the commanded position of the transport robot 11013 does not correspond with an actual location of the station fixture 11010, as determined by information from the wayfinding system 1710, the controller commands movement of the transport robot 11013 so that the wayfinding system 1710 scans the transfer robot workspace in the vicinity of the commanded position to detect the actual location of the station fixture 11010. The information of from the wayfinding system 1710 is, in one or more aspects, processed by the controller 11091 in substantially real time (e.g., processed in 30 ms or less). For example, referring to FIGS. 19A and 19B, the controller 11091 commands the transport robot 11013 to move in the X direction to scan for an opening (or door/slit valve) 888 of the station fixture 11010, which may be partially detected in the field of view (and identified as a "potential station" in FIG. 19A) of the wayfinding system 1710 in the commanded position (see FIG. 19). The transport robot 11013 moves in the X direction until the opening 888 of the station fixture 11010 is substantially within the field of view FOV (or region of interest 1800) as shown in FIG. 19B in the X direction to provide updated (corrected) X position information of the station fixture 11010. The transport robot 11013 is also commanded in the Z direction (see FIGS. 19C and 19D) so that the opening 888 of the station fixture 11010 in the Z direction is within the field of view FOV (or region of interest 1800) to provide updated (corrected) Z position information of the station fixture 11010. The corrected X and Z positions are used by the controller 11091 to update the map 1910.

In one or more aspects, employing the mapped position of the station fixture 11010, one or more of the mock carrier jig 510A, 510B and the removable module jig 600 are employed to further teach the station fixture 11010 location to the transport robot 11013 and to further refine the map 1910. In this example, the mock carrier jig 510A, 510B is employed at one or more load port modules 11005 to refine the mapped location of the respective load port in a manner substantially similar to that described herein (see at least FIG. 9A) (FIG. 20, Block 2030). The removable module jig 600 is removed from the mock carrier jig 510A, 510B and is employed to further refine the mapped location of the station fixture 11010 (or any other station fixture of the substrate processing tool) in a manner substantially similar to that described herein (see at least FIG. 9B) (FIG. 20, Block 2030).

As can be seen in FIGS. 19A-19E, the wayfinding system 1710 provides real-time sensory feedback for transport robot 11013 movement (FIG. 20, Block 2040), such as where the transport robot 11013 picks and places substrates to and from the processing apparatus features/components. For example, the wayfinding system 1710 is operative during transport robot 11013 moves to detect obstructions that may exist within a planned path/trajectory. Detection of an obstruction causes the controller 11091 to modify the path/trajectory to avoid the obstruction. In the example shown in FIGS. 19A-19E the obstruction is a wall of the minienvironment 11060. As can be seen by the progression of robot movement from FIG. 19A to FIG. 19E the transport robot 11013 moves along the robot path/trajectory which is verified by the wayfinding system (at least in the Y (or R) direction to a teach position (FIG. 19E) that provides for end effector 420A, 420B extension through the opening 888 of the station fixture 11010 for picking or placing a substrate. Correction of the robot path/trajectory to the teach position can be made by the controller 11091 on-the-fly based on objects/obstructions detected by the wayfinding system 1710.

In accordance with one or more aspects of the present disclosure an automatic teaching system for a substrate processing apparatus is provided. The automatic teaching system comprises: a frame having a workpiece load station with a predetermined load station reference location; a robot transport mounted to the frame and having: a movable transport arm with an end effector having a predetermined end effector reference location, and a drive section driving the movable transport arm in at least one degree of freedom motion relative to the frame; a machine vision system including both at least one fixed imaging sensor and at least one movable imaging sensor removably connected to the frame and configured to image at least one target of the machine vision system; a load jig disposed for removable engagement with the workpiece load station, with both the at least one fixed imaging sensor and the at least one movable imaging sensor mounted to the load jig, the fixed imaging sensor having a predetermined pose with respect to the predetermined load station reference location, wherein the movable transport arm has at least one arm target, of the at least one target, in a predetermined position with respect to the predetermined end effector reference location and in view of the fixed imaging sensor with the load jig engaged with the workpiece load station; and wherein the movable imaging sensor has a justification feature on a base of the movable imaging sensor that justifies the movable imaging sensor in a predetermined position relative to the predetermined end effector reference location.

In accordance with one or more aspects of the present disclosure, the frame has another workpiece holding station apart from the load station for holding a workpiece thereon, the another workpiece holding station having a predetermined holding station reference location.

In accordance with one or more aspects of the present disclosure, the automatic teaching system further comprises a controller communicably connected to the drive section to move the movable transport arm and communicably connected to the at least one fixed imaging sensor, the controller being configured to move the movable transport arm to at least one teach position relative to the load jig and image, with the at least one fixed imaging sensor, the at least one arm target with the movable transport arm in the at least one teach position so as to resolve, based on the image of the at least one arm target, offset between the predetermined end effector reference location and the predetermined load station reference location and between the predetermined end effector reference location.

In accordance with one or more aspects of the present disclosure the at least one teach position comprises a series of teach positions, each teach position being spaced from each other by a predetermined distance along a motion path of the at least one arm target defined by movable transport arm motion in the at least one degree of freedom.

In accordance with one or more aspects of the present disclosure the predetermined distance is determined based on the resolved offset between the predetermined end effector reference location and the predetermined load station reference location.

In accordance with one or more aspects of the present disclosure the at least one arm target is imaged at each teach position of the series of teach positions, wherein the image of the at least one arm target comprises a series of images of the at least one arm target along the motion path, and wherein the offset resolution is based on the series of images.

In accordance with one or more aspects of the present disclosure the at least one arm target has a predetermined indicia embodying a predetermined characteristic, describing at least a target plane, imaged by the at least one fixed imaging sensor so that the offset resolves in part in a reference plane of the workpiece load station based on the image of the at least one arm target.

In accordance with one or more aspects of the present disclosure the movable transport arm has more than one of the arm target disposed so that each arm target, imaged by the at least one fixed imaging sensor, characterizes different offset aspects, each of which correspond to different respective drive axis pairs of the drive section effecting the at least one degree of freedom motion of the movable transport arm, that correspond to different respective reference planes of the workpiece load station, so that each different offset aspect is resolved by a separate image of the respective arm target, and offset resolution is effected in entirety by combination of the resolved different offset aspect.

In accordance with one or more aspects of the present disclosure a first of the different respective drive axis pairs that correspond to a first of the at least one arm target, shares a drive axis with a second of the different respective drive axis pairs that correspond to a second one of the at least one arm target, wherein resolution of a second of the different offset aspect confirms or serves to refine part of a first offset aspect with respect to a load station reference axis corresponding to the shared drive axis and resolved with the first of the at least one arm target.

In accordance with one or more aspects of the present disclosure the movable transport arm has more than one of the at least one arm target disposed so that each arm target, imaged by the at least one fixed imaging sensor, separately characterizes different offset aspects, so that a first of the at least one arm target characterizes a first offset aspect and a second of the at least one arm target characterizes a second offset aspect different from the first offset aspect, and wherein the different characterization defined respectively by the first of the at least one arm target and the second of the at least one arm target are arranged so that resolution of the second offset aspect confirms or serves to refine part of the first offset aspect, with respect to a load station reference axis, the first offset aspect being separately resolved with the first of the at least one arm target.

In accordance with one or more aspects of the present disclosure the movable transport arm has more than one of the at least one arm target disposed so that each arm target, imaged by the at least one fixed imaging sensor, characterizes different offset aspects, each of which corresponds to a different respective at least one drive axis effecting the at least one degree of freedom motion of the movable transport arm, that corresponds to a different respective reference axis of the workpiece load station, so that each different offset aspect is resolved by a separate image of a respective arm target, and offset resolution is effected in entirety by combination of the separately resolved different offset aspect.

In accordance with one or more aspects of the present disclosure the at least one fixed imaging sensor comprises more than one fixed imaging sensors, each with a different predetermined pose so that an image sensor plane of each respective fixed imaging sensor corresponds to different respective load station reference plane, and the at least one arm target has an orientation corresponding to each respective fixed imaging sensor so that each fixed imaging sensor forms with a respective arm target different couples corresponding to and comprising the respective fixed image sensor and the respective arm target.

In accordance with one or more aspects of the present disclosure the load jig is configured as a mock substrate carrier, with an opening in a front wall of the mock substrate carrier arranged for end effector entry into the mock substrate carrier through the front wall, and a field of view of the at least one fixed imaging sensor faces the opening in the front wall of the load jig.

In accordance with one or more aspects of the present disclosure the at least one arm target is disposed facing the front wall and the opening on approach of the movable transport arm, along the motion path extending through the opening, to the workpiece load station and entry into the mock substrate carrier.

In accordance with one or more aspects of the present disclosure the opening of the load jig is oriented in a vertical plane.

In accordance with one or more aspects of the present disclosure the at least one fixed imaging sensor is positioned so as to image the at least one arm target in a direction extending through the opening of the load jig so that the resolved offset frees end effector extension through the opening into an interior of the load jig.

In accordance with one or more aspects of the present disclosure the at least one fixed imaging sensor is positioned so as to image the at least one arm target in a direction extending through the opening of the load jig so that the controller confirms, based on the resolved offset, unobstructed arm extension of the end effector into an interior of the load jig.

In accordance with one or more aspects of the present disclosure the at least one fixed imaging sensor is positioned so as to image the at least one arm target in a crossing direction extending at a crossing angle to an extension path of the end effector extending through the opening into an interior of the load jig.

In accordance with one or more aspects of the present disclosure the resolved offset, based on the image of the at least one arm target image in the direction extending through the opening, operates to align the at least one arm target to another progressive teach position, so that offset resolution based on the image of the at least one arm target in the crossing direction progressively resolves the resolved offset.

In accordance with one or more aspects of the present disclosure the at least one fixed image sensor is positioned so as to image the at least one arm target in more than one crossing direction, each of which extends at a crossing angle to the extension path of the end effector and to each other, each serving to progressively resolve the resolved offset along a respective axis corresponding to each degree of freedom of the at least one degree of freedom of arm motion effected by the drive section.

In accordance with one or more aspects of the present disclosure the justification feature of the base has an engagement feature that engages the end effector and justifies the at least one movable imaging sensor in a predetermined pose with respect to the predetermined end effector reference location.

In accordance with one or more aspects of the present disclosure the load jig has at least one mock workpiece holding slot, each of which corresponds to and represents a different workpiece holding slot of a workpiece carrier at the workpiece load station, and defines a different one of the predetermined load station reference location.

In accordance with one or more aspects of the present disclosure the at least one fixed imaging sensor is positioned so as to image at least one end effector target disposed on the end effector, on a wafer plane defined by the end effector and in a predetermined position with respect to the predetermined end effector reference location.

In accordance with one or more aspects of the present disclosure the controller verifies or progressively resolves the resolved offset based on the end effector target image from the at least one fixed imaging sensor imaging the end effector target image with the end effector positioning the wafer plane within each of the at least one mock workpiece holding slots.

In accordance with one or more aspects of the present disclosure the base of the at least one movable imaging sensor is held in the load jig and is arranged for carriage and transport to and from the load jig and each holding station of the frame with the end effector, and the at least one movable imaging sensor has at least one movable imaging sensor mounted to the base so as to be disposed on the end effector with the base carried by the end effector, in a predetermined position with respect to the predetermined end effector reference location.

In accordance with one or more aspects of the present disclosure the controller is configured to move the movable transport arm and transport the base, with the at least one movable imaging sensor, to a station teach position relative to the another workpiece holding station and image, with the at least one movable imaging sensor on the end effector, at least one station target having a predetermined pose relative to the predetermined holding station reference location so as to resolve station offset between the predetermined end effector reference location and the predetermined holding station reference location based on the at least one station target imaged with the at least one movable imaging sensor.

In accordance with one or more aspects of the present disclosure the at least one teach position comprises a series of teach positions, each teach position being spaced from each other by a predetermined distance along a motion path of the at least one station target defined by movable transport arm motion in the at least one degree of freedom.

In accordance with one or more aspects of the present disclosure the predetermined distance is determined based on the resolved offset between the predetermined end effector reference location and the predetermined holding station reference location.

In accordance with one or more aspects of the present disclosure the at least one station target is imaged at each teach position of the series of teach positions, wherein the image of the at least one station target comprises a series of images of the at least one station target along the motion path, and wherein the offset resolution is based on the series of images.

In accordance with one or more aspects of the present disclosure the at least one station target has a predetermined indicia embodying a predetermined characteristic, describing at least a target plane, imaged by the at least one movable imaging sensor so that the offset resolves in part in a reference plane of the another workpiece holding station based on the image of the at least one station target.

In accordance with one or more aspects of the present disclosure the another workpiece holding station has more than one of the station target disposed so that each station target, imaged by the at least one movable imaging sensor, characterizes different offset aspects, each of which correspond to different respective drive axis pairs of the drive section effecting the at least one degree of freedom motion of the movable transport arm, that correspond to different respective reference planes of the another workpiece holding station, so that each different offset aspect is resolved by a separate image of the respective station target, and offset resolution is effected in entirety by combination of the resolved different offset aspect.

In accordance with one or more aspects of the present disclosure a first of the different respective drive axis pairs that correspond to a first of the at least one station target, shares a drive axis with a second of the different respective drive axis pairs that correspond to a second one of the at least one station target, wherein resolution of a second of the different offset aspect confirms or serves to refine part of a first offset aspect with respect to a holding station reference axis corresponding to the shared drive axis and resolved with the first of the at least one station target.

In accordance with one or more aspects of the present disclosure the another workpiece holding station has more than one of the at least one station target disposed so that each station target, imaged by the at least one movable imaging sensor, separately characterizes different offset aspects, so that a first of the at least one station target characterizes a first offset aspect and a second of the at least one station target characterizes a second offset aspect different from the first offset aspect, and wherein the different characterization defined respectively by the first of the at least one station target and the second of the at least one station target are arranged so that resolution of the second offset aspect confirms or serves to refine part of the first offset aspect, with respect to a holding station reference axis, the first offset aspect being separately resolved with the first of the at least one station target.

In accordance with one or more aspects of the present disclosure the another workpiece holding station has more than one of the at least one station target disposed so that each station target, imaged by the at least one movable imaging sensor, characterizes different offset aspects, each of which corresponds to a different respective at least one drive axis effecting the at least one degree of freedom motion of the movable transport arm, that corresponds to a different respective reference axis of the another workpiece holding station, so that each different offset aspect is resolved by a separate image of a respective station target, and offset resolution is effected in entirety by combination of the separately resolved different offset aspect.

In accordance with one or more aspects of the present disclosure the at least one movable imaging sensor comprises more than one movable imaging sensors, each with a different predetermined pose so that an image sensor plane of each respective movable imaging sensor corresponds to different respective holding station reference plane, and the at least one station target has an orientation corresponding to each respective movable imaging sensor so that each movable imaging sensor forms with a respective station target different couples corresponding to and comprising the respective fixed image sensor and the respective station target.

In accordance with one or more aspects of the present disclosure the another workpiece holding station has an opening in a front wall of the another workpiece holding station that is arranged for end effector entry into the another workpiece holding station through the front wall, and a field of view of the at least one movable imaging sensor faces the opening in the front wall of the another workpiece holding station.

In accordance with one or more aspects of the present disclosure the at least one station target is disposed facing the front wall and the opening on approach of the movable transport arm, along a motion path extending through the opening, to the another workpiece holding station.

In accordance with one or more aspects of the present disclosure the at least one movable imaging sensor is positioned so as to image the at least one station target in a direction extending through the opening of the another workpiece holding station so that the resolved offset frees end effector extension through the opening into an interior of another workpiece holding station.

In accordance with one or more aspects of the present disclosure the at least one movable imaging sensor is positioned so as to image the at least one station target in a direction extending through the opening of the another workpiece holding station so that the controller confirms, based on the resolved offset, unobstructed arm extension of the end effector into an interior of the another workpiece holding station.

In accordance with one or more aspects of the present disclosure the at least one movable imaging sensor is positioned so as to image the at least one station target in a crossing direction extending at a crossing angle to an extension path of the end effector extending through the opening into an interior of the another workpiece holding station.

In accordance with one or more aspects of the present disclosure the resolved offset, based on the image of the at least one station target image in the direction extending through the opening, operates to align the at least one station target to another progressive teach position, so that offset resolution based on the image of the at least one station target in the crossing direction progressively resolves the resolved offset.

In accordance with one or more aspects of the present disclosure the automatic teaching system further comprises at least one distance measuring sensor mounted on the base, so as to be carried and transported by the end effector holding the base, wherein the at least one distance measuring sensor senses distance in a distance sensing direction substantially aligned with a field of view of the at least one movable imaging sensor so that the field of view and distance sensing direction are substantially collimated with respect to each other.

In accordance with one or more aspects of the present disclosure the field of view and distance sensing direction are substantially collimated with respect to each other viewing and sensing in a vertical plane ahead of the end effector.

In accordance with one or more aspects of the present disclosure the field of view and distance sensing direction are substantially collimated with respect to each other viewing and sensing in a direction tangent to an arm motion path extending the movable transport arm along a workpiece transport path from the load station towards the another workpiece holding station.

In accordance with one or more aspects of the present disclosure the controller is communicably connected to the at least one distance measuring sensor and configured to detect, via distance measurement from the at least one distance measuring sensor, with the transport arm in motion, an opening of the another workpiece holding station enabling controller motion of the end effector relative to the opening to the station teaching position, or an obstruction in the motion path of the end effector.

In accordance with one or more aspects of the present disclosure the distance measuring sensor is at least one of an ultrasonic sensor, an infrared sensor, a time of flight sensor, and a LIDAR sensor.

It should be understood that the foregoing description is only illustrative of the aspects of the present disclosure. Various alternatives and modifications can be devised by those skilled in the art without departing from the aspects of the present disclosure. Accordingly, the aspects of the present disclosure are intended to embrace all such alternatives, modifications and variances that fall within the scope of any claims appended hereto. Further, the mere fact that different features are recited in mutually different dependent or independent claims does not indicate that a combination of these features cannot be advantageously used, such a combination remaining within the scope of the aspects of the present disclosure.

What is claimed is:

1. An automatic teaching system for a substrate processing apparatus, the automatic teaching system comprising:
   a frame having a workpiece load station with a predetermined load station reference location;
   a robot transport mounted to the frame and having:
      a movable transport arm with an end effector having a predetermined end effector reference location, and
      a drive section driving the movable transport arm in at least one degree of freedom motion relative to the frame;
   a machine vision system including both at least one fixed imaging sensor and at least one movable imaging sensor removably connected to the frame and configured to image at least one target of the machine vision system;
   a load jig disposed for removable engagement with the workpiece load station, with both the at least one fixed imaging sensor and the at least one movable imaging sensor mounted to the load jig, the fixed imaging sensor having a predetermined pose with respect to the predetermined load station reference location, wherein the movable transport arm has at least one arm target, of the at least one target, in a predetermined position with respect to the predetermined end effector reference location and in view of the fixed imaging sensor with the load jig engaged with the workpiece load station; and
   the movable imaging sensor has a justification feature on a base of the movable imaging sensor that justifies the movable imaging sensor in a predetermined position relative to the predetermined end effector reference location.

2. The automatic teaching system of claim 1, wherein the frame has another workpiece holding station apart from the load station for holding a workpiece thereon, the another workpiece holding station having a predetermined holding station reference location.

3. The automatic teaching system of claim 1, further comprising a controller communicably connected to the drive section to move the movable transport arm and communicably connected to the at least one fixed imaging sensor, the controller being configured to move the movable transport arm to at least one teach position relative to the load jig and image, with the at least one fixed imaging sensor, the at least one arm target with the movable transport arm in the at least one teach position so as to resolve, based on the image of the at least one arm target, offset between the predetermined end effector reference location and the predetermined load station reference location and between the predetermined end effector reference location and the justification feature of the base of the movable imaging sensor.

4. The automatic teaching system of claim 3, wherein the load jig is configured as a mock substrate carrier, with an opening in a front wall of the mock substrate carrier arranged for end effector entry into the mock substrate carrier through the front wall, and a field of view of the at least one fixed imaging sensor faces the opening in the front wall of the load jig.

5. The automatic teaching system of claim 4, wherein the at least one arm target is disposed facing the front wall and the opening on approach of the movable transport arm, along the motion path extending through the opening, to the workpiece load station and entry into the mock substrate carrier.

6. The automatic teaching system of claim 4, wherein the opening of the load jig is oriented in a vertical plane.

7. The automatic teaching system of claim 4, wherein the at least one fixed imaging sensor is positioned so as to image the at least one arm target in a direction extending through the opening of the load jig so that the resolved offset frees end effector extension through the opening into an interior of the load jig.

8. The automatic teaching system of claim 4, wherein the at least one fixed imaging sensor is positioned so as to image the at least one arm target in a direction extending through the opening of the load jig so that the controller confirms, based on the resolved offset, unobstructed arm extension of the end effector into an interior of the load jig.

9. The automatic teaching system of claim 4, wherein the at least one fixed imaging sensor is positioned so as to image the at least one arm target in a crossing direction extending at a crossing angle to an extension path of the end effector extending through the opening into an interior of the load jig.

10. The automatic teaching system of claim 4, wherein the resolved offset, based on the image of the at least one arm target image in the direction extending through the opening, operates to align the at least one arm target to another progressive teach position, so that offset resolution based on the image of the at least one arm target in the crossing direction progressively resolves the resolved offset.

11. The automatic teaching system of claim 3, wherein the at least one fixed imaging sensor is positioned so as to image at least one end effector target disposed on the end effector, on a wafer plane defined by the end effector and in a predetermined position with respect to the predetermined end effector reference location.

12. The automatic teaching system of claim 11, wherein the controller verifies or progressively resolves the resolved offset based on the end effector target image from the at least one fixed imaging sensor imaging the end effector target image with the end effector positioning the wafer plane within each of the at least one mock workpiece holding slots.

13. The automatic teaching system of claim 3, wherein the controller is configured to move the movable transport arm and transport the base, with the at least one movable imaging sensor, to a station teach position relative to the another workpiece holding station and image, with the at least one movable imaging sensor on the end effector, at least one station target having a predetermined pose relative to the predetermined holding station reference location so as to resolve station offset between the predetermined end effector reference location and the predetermined holding station reference location based on the at least one station target imaged with the at least one movable imaging sensor.

14. The automatic teaching system of claim 13, wherein the at least one teach position comprises a series of teach positions, each teach position being spaced from each other by a predetermined distance along a motion path of the at least one station target defined by movable transport arm motion in the at least one degree of freedom.

15. The automatic teaching system of claim 14, wherein the predetermined distance is determined based on the resolved offset between the predetermined end effector reference location and the predetermined holding station reference location.

16. The automatic teaching system of claim 14, wherein the at least one station target is imaged at each teach position of the series of teach positions, wherein the image of the at least one station target comprises a series of images of the at least one station target along the motion path, and wherein the offset resolution is based on the series of images.

17. The automatic teaching system of claim 13, wherein the at least one station target has a predetermined indicia embodying a predetermined characteristic, describing at least a target plane, imaged by the at least one movable imaging sensor so that the offset resolves in part in a reference plane of the another workpiece holding station based on the image of the at least one station target.

18. The automatic teaching system of claim 13, wherein the another workpiece holding station has more than one of the station target disposed so that each station target, imaged by the at least one movable imaging sensor, characterizes different offset aspects, each of which correspond to different respective drive axis pairs of the drive section effecting the at least one degree of freedom motion of the movable transport arm, that correspond to different respective reference planes of the another workpiece holding station, so that each different offset aspect is resolved by a separate image of the respective station target, and offset resolution is effected in entirety by combination of the resolved different offset aspect.

19. The automatic teaching system of claim 18, wherein a first of the different respective drive axis pairs that correspond to a first of the at least one station target, shares a drive axis with a second of the different respective drive axis pairs that correspond to a second one of the at least one station target, wherein resolution of a second of the different offset aspect confirms or serves to refine part of a first offset aspect with respect to a holding station reference axis corresponding to the shared drive axis and resolved with the first of the at least one station target.

20. The automatic teaching system of claim 13, wherein the another workpiece holding station has more than one of the at least one station target disposed so that each station target, imaged by the at least one movable imaging sensor, separately characterizes different offset aspects, so that a first of the at least one station target characterizes a first offset aspect and a second of the at least one station target characterizes a second offset aspect different from the first offset aspect, and wherein the different characterization defined respectively by the first of the at least one station target and the second of the at least one station target are arranged so that resolution of the second offset aspect confirms or serves to refine part of the first offset aspect, with respect to a holding station reference axis, the first offset aspect being separately resolved with the first of the at least one station target.

21. The automatic teaching system of claim 13, wherein the another workpiece holding station has more than one of the at least one station target disposed so that each station target, imaged by the at least one movable imaging sensor, characterizes different offset aspects, each of which corresponds to a different respective at least one drive axis effecting the at least one degree of freedom motion of the movable transport arm, that corresponds to a different respective reference axis of the another workpiece holding station, so that each different offset aspect is resolved by a separate image of a respective station target, and offset resolution is effected in entirety by combination of the separately resolved different offset aspect.

22. The automatic teaching system of claim 13, wherein the at least one movable imaging sensor comprises more than one movable imaging sensors, each with a different predetermined pose so that an image sensor plane of each respective movable imaging sensor corresponds to different respective holding station reference plane, and the at least one station target has an orientation corresponding to each respective movable imaging sensor so that each movable imaging sensor forms with a respective station target different couples corresponding to and comprising the respective fixed image sensor and the respective station target.

23. The automatic teaching system of claim 13, wherein the another workpiece holding station has an opening in a front wall of the another workpiece holding station that is arranged for end effector entry into the another workpiece holding station through the front wall, and a field of view of the at least one movable imaging sensor faces the opening in the front wall of the another workpiece holding station.

24. The automatic teaching system of claim 23, wherein the at least one station target is disposed facing the front wall and the opening on approach of the movable transport arm, along a motion path extending through the opening, to the another workpiece holding station.

25. The automatic teaching system of claim 23, wherein the at least one movable imaging sensor is positioned so as to image the at least one station target in a direction extending through the opening of the another workpiece holding station so that the resolved offset frees end effector extension through the opening into an interior of another workpiece holding station.

26. The automatic teaching system of claim 23, wherein the at least one movable imaging sensor is positioned so as to image the at least one station target in a direction extending through the opening of the another workpiece holding station so that the controller confirms, based on the resolved offset, unobstructed arm extension of the end effector into an interior of the another workpiece holding station.

27. The automatic teaching system of claim 23, wherein the at least one movable imaging sensor is positioned so as to image the at least one station target in a crossing direction extending at a crossing angle to an extension path of the end effector extending through the opening into an interior of the another workpiece holding station.

28. The automatic teaching system of claim 23, wherein the resolved offset, based on the image of the at least one station target image in the direction extending through the opening, operates to align the at least one station target to another progressive teach position, so that offset resolution based on the image of the at least one station target in the crossing direction progressively resolves the resolved offset.

29. The automatic teaching system of claim 1, wherein the at least one teach position comprises a series of teach positions, each teach position being spaced from each other by a predetermined distance along a motion path of the at least one arm target defined by movable transport arm motion in the at least one degree of freedom.

30. The automatic teaching system of claim 29, wherein the predetermined distance is determined based on the resolved offset between the predetermined end effector reference location and the predetermined load station reference location.

31. The automatic teaching system of claim 29, wherein the at least one arm target is imaged at each teach position of the series of teach positions, wherein the image of the at least one arm target comprises a series of images of the at least one arm target along the motion path, and wherein the offset resolution is based on the series of images.

32. The automatic teaching system of claim 1, wherein the at least one arm target has a predetermined indicia embodying a predetermined characteristic, describing at least a target plane, imaged by the at least one fixed imaging sensor so that the offset resolves in part in a reference plane of the workpiece load station based on the image of the at least one arm target.

33. The automatic teaching system of claim 1, wherein the movable transport arm has more than one of the arm target disposed so that each arm target, imaged by the at least one fixed imaging sensor, characterizes different offset aspects, each of which correspond to different respective drive axis pairs of the drive section effecting the at least one degree of freedom motion of the movable transport arm, that correspond to different respective reference planes of the workpiece load station, so that each different offset aspect is resolved by a separate image of the respective arm target, and offset resolution is effected in entirety by combination of the resolved different offset aspect.

34. The automatic teaching system of claim 33, wherein a first of the different respective drive axis pairs that correspond to a first of the at least one arm target, shares a drive axis with a second of the different respective drive axis pairs that correspond to a second one of the at least one arm target, wherein resolution of a second of the different offset aspect confirms or serves to refine part of a first offset aspect with respect to a load station reference axis corresponding to the shared drive axis and resolved with the first of the at least one arm target.

35. The automatic teaching system of claim 1, wherein the movable transport arm has more than one of the at least one arm target disposed so that each arm target, imaged by the at least one fixed imaging sensor, separately characterizes different offset aspects, so that a first of the at least one arm target characterizes a first offset aspect and a second of the at least one arm target characterizes a second offset aspect different from the first offset aspect, and wherein the different characterization defined respectively by the first of the at least one arm target and the second of the at least one arm target are arranged so that resolution of the second offset aspect confirms or serves to refine part of the first offset aspect, with respect to a load station reference axis, the first offset aspect being separately resolved with the first of the at least one arm target.

36. The automatic teaching system of claim 1, wherein the movable transport arm has more than one of the at least one arm target disposed so that each arm target, imaged by the at least one fixed imaging sensor, characterizes different offset aspects, each of which corresponds to a different respective at least one drive axis effecting the at least one degree of freedom motion of the movable transport arm, that corresponds to a different respective reference axis of the workpiece load station, so that each different offset aspect is resolved by a separate image of a respective arm target, and offset resolution is effected in entirety by combination of the separately resolved different offset aspect.

37. The automatic teaching system of claim 1, wherein the at least one fixed imaging sensor comprises more than one fixed imaging sensors, each with a different predetermined pose so that an image sensor plane of each respective fixed imaging sensor corresponds to different respective load station reference plane, and the at least one arm target has an orientation corresponding to each respective fixed imaging sensor so that each fixed imaging sensor forms with a respective arm target different couples corresponding to and comprising the respective fixed image sensor and the respective arm target.

38. The automatic teaching system of claim 1, wherein the at least one fixed image sensor is positioned so as to image the at least one arm target in more than one crossing direction, each of which extends at a crossing angle to the extension path of the end effector and to each other, each serving to progressively resolve the resolved offset along a respective axis corresponding to each degree of freedom of the at least one degree of freedom of arm motion effected by the drive section.

39. The automatic teaching system of claim 1, wherein the justification feature of the base has an engagement feature that engages the end effector and justifies the at least one movable imaging sensor in a predetermined pose with respect to the predetermined end effector reference location.

40. The automatic teaching system of claim 1, wherein the load jig has at least one mock workpiece holding slot, each of which corresponds to and represents a different workpiece holding slot of a workpiece carrier at the workpiece load station, and defines a different one of the predetermined load station reference location.

41. The automatic teaching system of claim 1, wherein the base of the at least one movable imaging sensor is held in the load jig and is arranged for carriage and transport to and from the load jig and each holding station of the frame with the end effector, and the at least one movable imaging sensor has at least one movable imaging sensor mounted to the base so as to be disposed on the end effector with the base carried by the end effector, in a predetermined position with respect to the predetermined end effector reference location.

42. The automatic teaching system of claim 1, further comprising at least one distance measuring sensor mounted on the base, so as to be carried and transported by the end effector holding the base, wherein the at least one distance measuring sensor senses distance in a distance sensing direction substantially aligned with a field of view of the at least one movable imaging sensor so that the field of view and distance sensing direction are substantially collimated with respect to each other.

43. The automatic teaching system of claim 42, wherein the field of view and distance sensing direction are substantially collimated with respect to each other viewing and sensing in a vertical plane ahead of the end effector.

44. The automatic teaching system of claim 42, wherein the field of view and distance sensing direction are substantially collimated with respect to each other viewing and sensing in a direction tangent to an arm motion path extending the movable transport arm along a workpiece transport path from the load station towards the another workpiece holding station.

45. The automatic teaching system of claim 42, further comprising a controller, wherein the controller is communicably connected to the at least one distance measuring sensor and configured to detect, via distance measurement from the at least one distance measuring sensor, with the transport arm in motion, an opening of the another workpiece holding station enabling controller motion of the end effector relative to the opening to the station teaching position, or an obstruction in the motion path of the end effector.

46. The automatic teaching system of claim 42, wherein the distance measuring sensor is at least one of an ultrasonic sensor, an infrared sensor, a time of flight sensor, and a LIDAR sensor.

\* \* \* \* \*